United States Patent [19]

Takasugi

[11] Patent Number: 5,377,154
[45] Date of Patent: Dec. 27, 1994

[54] MULTIPLE SERIAL-ACCESS MEMORY

[75] Inventor: Atsushi Takasugi, Tokyo, Japan

[73] Assignee: Oki Electric Industry Co., Ltd., Tokyo, Japan

[21] Appl. No.: 10,645

[22] Filed: Jan. 28, 1993

[30] Foreign Application Priority Data

Jan. 31, 1992 [JP] Japan .................................. 4-015678
Feb. 20, 1992 [JP] Japan .................................. 4-033366

[51] Int. Cl.$^5$ .......................... G11C 8/00; G11C 8/04
[52] U.S. Cl. ................................ 365/221; 365/189.01; 365/189.04; 365/230.09; 365/230.05
[58] Field of Search ............. 365/221, 230.09, 230.01, 365/233, 230.05, 189.01, 189.04

[56] References Cited

U.S. PATENT DOCUMENTS 4,819,213  4/1989  Yamaguchi et al. ................. 365/233
5,121,360  6/1992  West et al. ....................... 365/230.09

FOREIGN PATENT DOCUMENTS 64-184894  3/1991  Japan ............................. G11C 7/00

Primary Examiner—Viet Q. Nguyen
Attorney, Agent, or Firm—Edward D. Manzo; Ted K. Ringsred

[57] ABSTRACT

A serial access memory consists of two or more memory cell arrays fabricated as a single integrated circuit. A serial input port is provided for input of data to one of the memory cell arrays. Separate serial output ports are provided for output of data from each of the memory cell arrays. Data are transferred among the memory cell arrays in parallel form by one or more internal transfer circuits.

59 Claims, 83 Drawing Sheets

⊠ DON'T CARE

DON'T CARE

DON'T CARE

DON'T CARE

DON'T CARE

DON'T CARE

DON'T CARE

MULTIPLE SERIAL-ACCESS MEMORY

BACKGROUND OF THE INVENTION

This invention relates to a serial-access memory device having a plurality of memory cell arrays in which data can be stored and among which data can be transferred.

The prior art abounds in serial-access memory devices with single memory cell arrays, ranging from the video random-access memory (VRAM) and multiport dynamic random-access memory (multiport DRAM) used in the frame buffers of workstations and personal computers to the first-in-first-out (FIFO) devices used in the field memories of digital television, facsimile machines, copy machines, and assorted video equipment. VRAM and multiport DRAM permit both random access to an arbitrary address and serial access starting from an arbitrary address. FIFO memories simply store serial input data starting at address zero and output the same serial data again from address zero.

Applications of serial-access memories are expected to increase with the rising performance requirements of workstations and personal computers, and the emergence of high-definition television (HDTV) and other advanced television technology. In many of these applications, and particularly in applications that implement complex data-processing functions, serial-access memory devices must be interconnected so that data can be transferred from one storage location to another.

Mutual interconnections among existing serial-access memories, however, require intermediary buffers and other peripheral devices. A large number of control signals must be provided to control both the memory devices themselves and their peripheral devices. The design of the memory system becomes unduly complex.

In many cases the memory system must also operate at very high speed. At present this is especially true in computer and workstation applications, but the need for high-speed memory is becoming more general because of the development of HDTV and advanced electronic office equipment. It is not easy to make a large and complex set of control signals meet high-speed timing requirements. Design of a high-speed memory system therefore becomes exacting, difficult, and expensive.

SUMMARY OF THE INVENTION

It is accordingly an object of the present invention to enable data to be transferred from one storage location to another without peripheral devices.

Another object of the invention is to enable data to be transferred without complex control signals.

Yet another object of the invention is to enable data to be transferred at high speed.

The invented serial access memory comprises a plurality of memory cell arrays fabricated as a single integrated circuit, together with a like plurality of serial output ports for output of data from the memory cell arrays. At least one serial input port is provided for input of serial data to one of the memory cell arrays. At least one transfer circuit is provided for transfer of data from one of the memory cell arrays to another of the memory cell arrays. Data are transferred in parallel form.

The memory cell arrays may be arranged in a series. In this case data are transferred from the input port to the first memory cell array in the series, and from each memory cell array in the series to the next, until the last memory cell array is reached.

Memory cells in the memory cell arrays are identified by X- and Y-addresses. According to one aspect of the invention, these addresses are externally provided. According to another aspect of the invention, the memory has internal counters that generate some or all of the addresses.

DETAILED DESCRIPTION OF THE INVENTION

Figure 1:
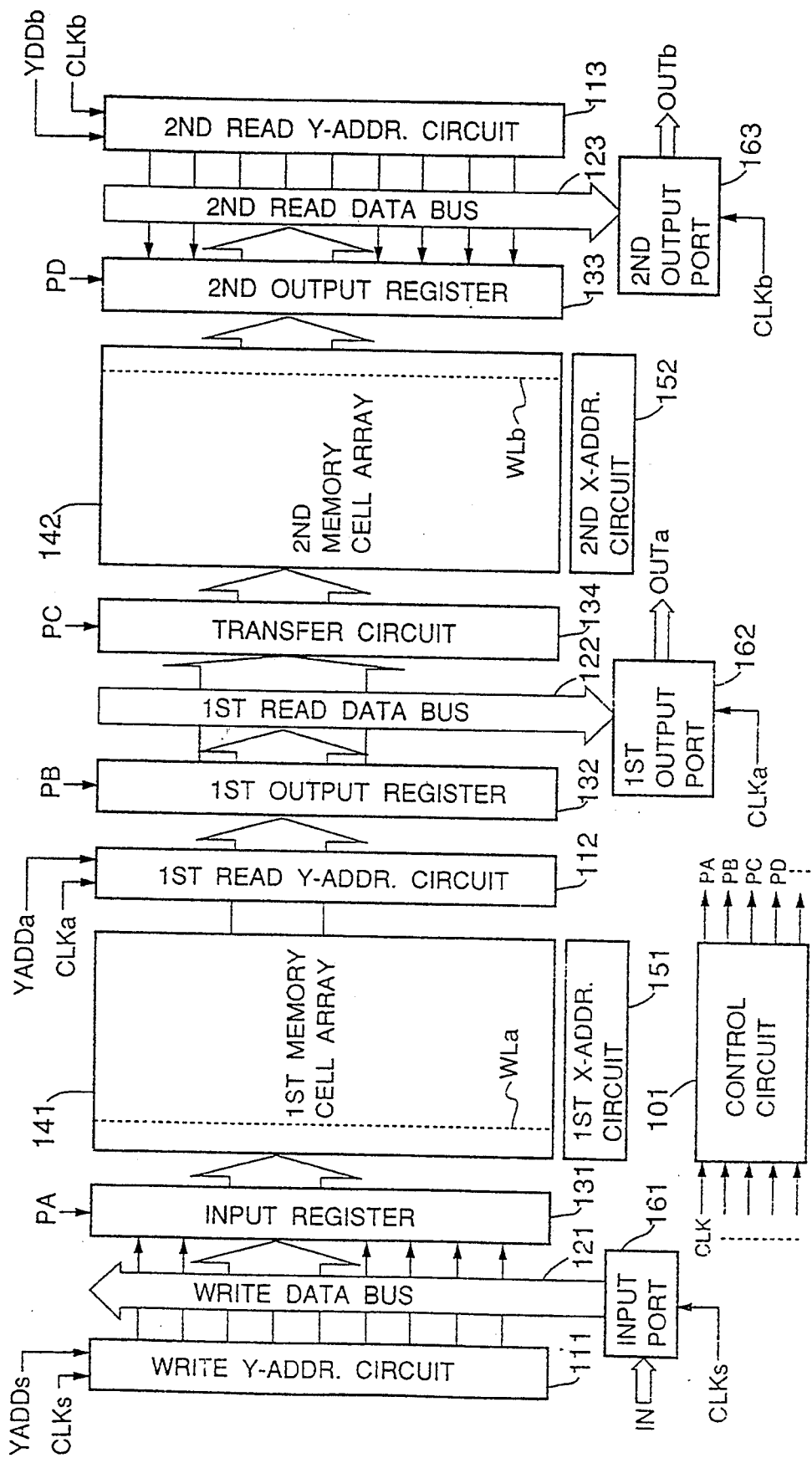
FIG. 1 is a block diagram illustrating the basic elements of the invented multiple serial-access memory.

Embodiments of the invention will be described with reference to the attached drawings. The drawings illustrate the invention but do not restrict its scope, which should be determined solely from the appended claims. In particular, the drawings show only two memory cell arrays, but the illustrated memories can easily be extended to greater numbers of arrays by integrating additional circuit elements of the type shown.

All signals shown in the drawings and mentioned in the claims are bi-valued signals having two states, referred to as high and low. In the case of certain control signals, one of these states is also described as an active state and the other as an inactive state. Control signals may be either active high or active low; the invention is not restricted to either scheme (and a mixture of the two schemes will be shown in the drawings). The term "address signal," even when used in the singular grammatical form, will refer to a plurality of bi-valued signals that collectively designate an X-address or a Y-address.

FIG. 1 is a block diagram shown the basic elements of the invented multiple serial-access memory. All the embodiments described below will be based on FIG. 1. A novel feature of the invention is that all the elements shown in FIG. 1 are formed as a single integrated circuit on a single substrate such as a semiconductor chip.

One of the elements is a control circuit 101 that generates internal control signals such as data transfer control signals PA, PB, PC, and PD. These internal signals are generated from external clock signals and other external signals, which differ in different embodiments of the invention. The control circuit 101 in FIG. 1 is shown as a general representation of various specific control circuits that will be illustrated in the embodiments.

The memory in FIG. 1 has three Y-addressing circuits 111, 112, and 113. The write Y-addressing circuit 111 decodes a write Y-address signal YADDs in synchronization with a write clock signal CLKs and controls interconnections between a write data bus 121 and an input register 131. The first read Y-addressing circuit 112 decodes a first read Y-address signal YADDa in synchronization with a first read clock signal CLKa and controls interconnections between a first read data bus 122 and a first output register 132. The second read Y-addressing circuit 113 decodes a second read Y-address signal YADDb in synchronization with a second read clock CLKb and controls interconnections between a second read data bus 123 and a second output register 133. The first output register 132 is also connected to a transfer circuit 134, which is another novel feature of the invention.

There are two memory cell arrays 141 and 142. The first memory cell array 141 has a plurality of word lines such as WLa in the drawing which are selected by a first X-addressing circuit 151. The second memory cell array 142 has a plurality of word lines such as WLb in the drawing which are selected by a second X-addressing circuit 152.

The write data bus 121 is coupled to an input port 161 that receives serial data from an input terminal (denoted IN). The first read data bus 122 and second read data bus 123 are likewise coupled to a first output port 162 and second output port 163 that provide serial data to respective output terminals (denoted OUTa and OUTb). Serial data input and output are synchronized with the clock signals CLKs, CLKa, and CLKb mentioned above.

Certain parts of the memory in FIG. 1 will now be described in more detail with reference to FIGS. 2 and 3. Since it is impractical to show all memory cells, word lines, and other circuitry, dotted lines in the drawings are used to represent omitted elements. The invention is not restricted to any particular size of memory cell array.

Figure 2:
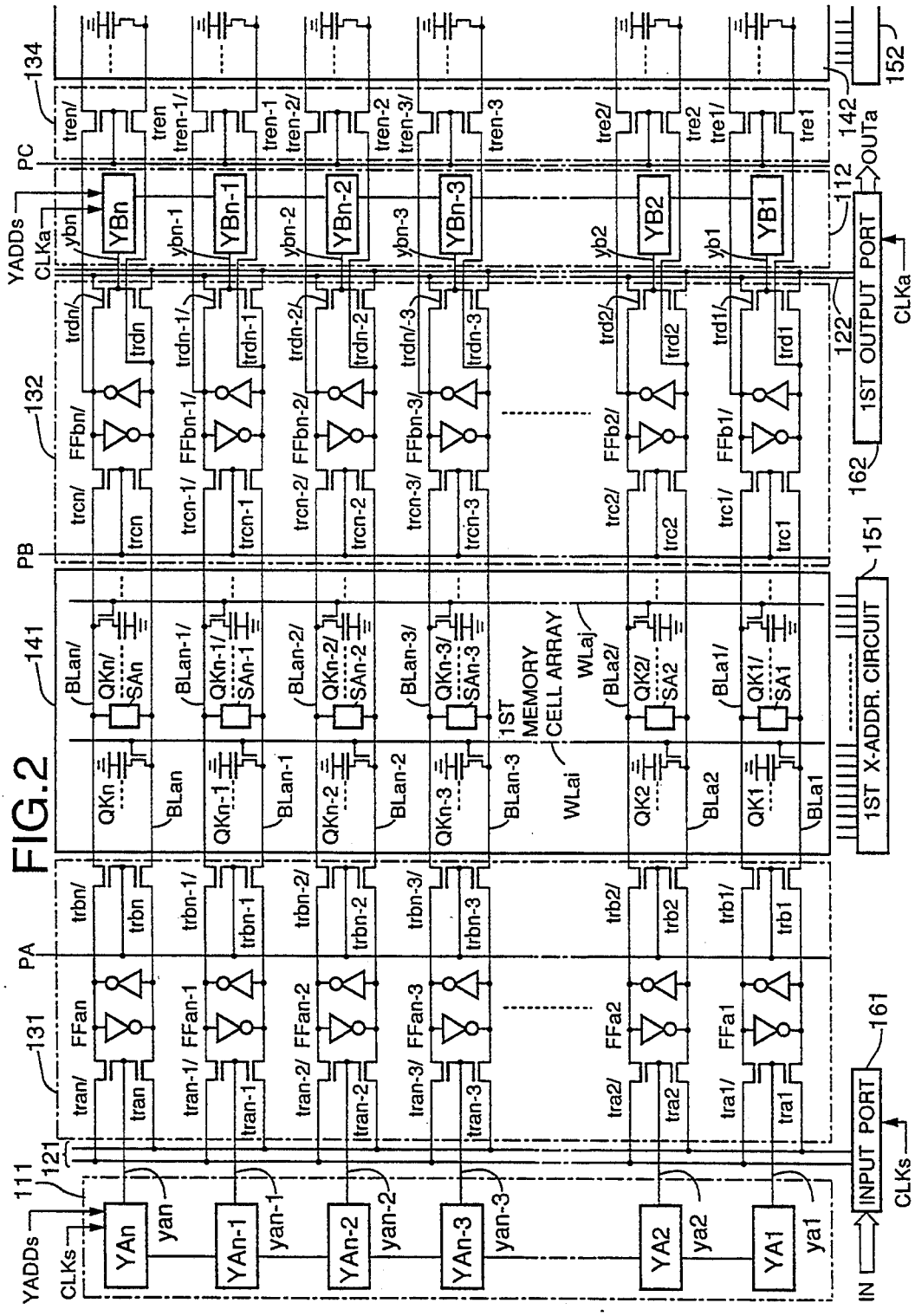
FIG. 2 is a circuit diagram of part of the memory in FIG. 1.

Referring to FIG. 2, the write Y-addressing circuit 111 comprises a plurality of decoder units YA1, YA2, ..., YAn. The write Y-address signal YADDs selects one of these decoder units YAi, which generates an active (high) output signal yai. At most one of the signals ya1, ya2, ..., yan can be active at a time.

The write data bus 121 comprises a pair of complementary signal lines. These bus lines are driven by the input port 161 according to data input from the input terminal IN so that one of the complementary signal lines is in the high state while the other is low.

The input register 131 comprises a plurality of pairs of transistors tra1, tra1/, ..., tran, tran/ that are switched on and off by the signals ya1, ..., yan. More specifically, for any integer i from 1 to n, trai and trai/ are on when yai is high and off when yai is low. A plurality of flip-flops FFa1, ..., FFan are coupled through these transistors to the write data bus 121. Each flip-flop comprises, for example, a pair of cross-coupled inverters. The flip-flops are coupled through further pairs of transistors trb1, trb1/, ..., trbn, trbn/ to pairs of complementary bit lines BLa1, BLa1/, ..., BLan, BLan/ in the first memory cell array 141. The transistors trb1, trb1/, ..., trbn, trbn/ are all turned on and off together by the data transfer signal PA.

The first memory cell array 141 comprises the pairs of complementary bit lines BLa1, BLa1/, ..., BLan, BLan/, word lines such as WLai and WLaj, a plurality of memory cells such as QKi and QIi/, and a plurality of sense amplifiers SA1, ..., SAn. Each memory cell is disposed near the intersection of a bit line and a word line, to which it is coupled. Memory cells Q1i, Q2i, ..., QKi, ... are coupled to the bit line BLai, and memory cells Q1i/, Q2i/, ..., QKi/, ... to the bit line BLai/. Memory cells QK1, QK2, ..., QKn are connected to one word line WLai, and memory cells QK1/, QK2/, ..., QKn/ to another word one WLaj. The sense amplifier SAi is coupled to the complementary bit lines BLai and BLai/ and, when activated, amplifies the voltage difference between these bit lines.

Each word line is identified by an X-address, and each pair of complementary bit lines by a Y-address. A memory cell is identified by the X-address and Y-address of the word line and bit line to which it is coupled.

The memory cells are of the well-known dynamic type, each comprising a capacitor and a transistor. When a word line is selected by the first X-addressing circuit 151, the transistors in all the memory cells connected to that word line turn on, coupling the capacitors in those memory cells to their respective bit lines.

The first output register 132 is similar to the input register 131, and comprises the following elements: transistors trc1, trc1/, ..., trcn, trcn/ that are switched on and off together by the data transfer signal PB; flip-flops FFb1 ..., FFbn coupled through these transistors to the bit lines in the first memory cell array 141; and transistors trd1, trd1/, ..., trdn, trdn/ that couple these flip-flops to the first read data bus 122 and are switched on and off in pairs by signals yb1, ..., ybn from the first read Y-address circuit 112. The first read Y-addressing circuit 112 is similar to the write Y-addressing circuit 111, comprising decoder units YB1, ..., YBn that generate the signals yb1, ..., ybn in response to the first read Y-address signal YADDa. The first read data bus 122 is similar to the write data bus 121, comprising a pair of complementary bus lines.

The transfer circuit 134 comprises transistors tre1, tre1/, ..., tren, tren/ that are switched on and off together by the data transfer signal PC. These transistors couple the flip-flops FFb1, ..., FFbn in the first output register 132 to bit lines in the second memory cell array. 142 only part of which is shown in FIG. 2.

Figure 3:
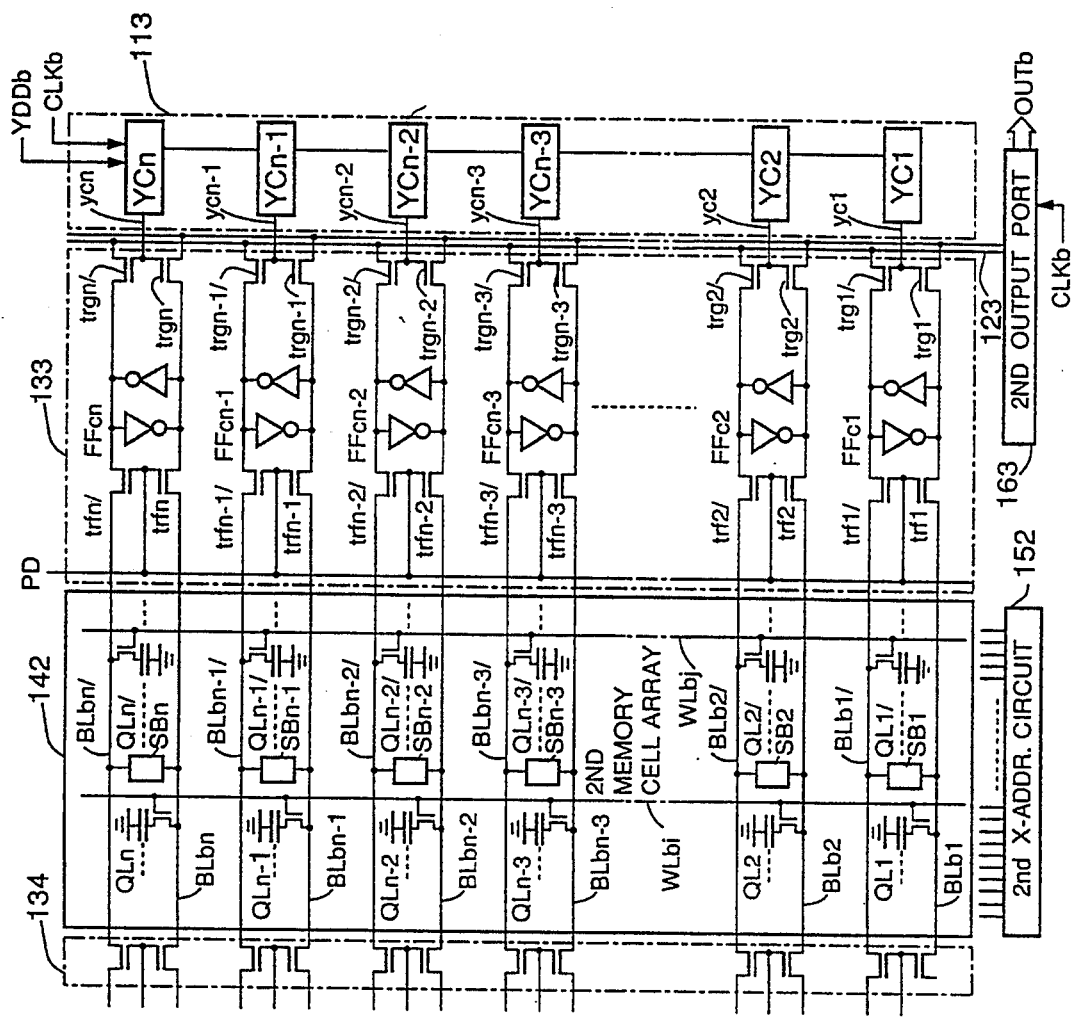
FIG. 3 is a circuit diagram of another part of the memory in FIG. 1.

Referring to FIG. 3, the left-hand portion of which overlaps the right-hand portion of FIG. 2, the second memory cell array 142 is similar to the first memory cell array 141, comprising memory cells QL1, QL1/, ..., QLn, QLn/ coupled to bit lines BLb1, BLb1/, ..., BLbn, BLbn/ and word lines WLB1, ..., WLBi, ..., WLBj .... The bit lines BLb1, BLb1/, ..., BLbn, BLbn/ are coupled to respective transistors tre1, tre1/, ..., tren, tren/ in the transfer circuit 134, and to respective transistors trf1, trf1/, ..., trfn, trfn/ in the second output register 133. Memory cells in the second memory cell array 142 are identified by the same X- and Y-addresses as used in the first memory cell array 141.

The second output register 133 is similar to the first output register 132, comprising the transistors trf1, trf1/, ..., trfn, trfn/, which are switched on and off together by the data transfer signal PD, flip-flops FFc1 ..., FFcn, and transistors trg1, trg1/, ..., trgn, trgn/ that are switched on and off in pairs by signals yc1, ..., ycn from the second read Y-addressing circuit 113. The second read Y-addressing circuit 113 is similar to the first read Y-addressing circuit 112, comprising decoder units YC1, ..., YCn that generate these signals yc1, ..., ycn in response to the second read Y-address signal YADDb. The second read data bus 123 is similar to the first read data bus 122, comprising a pair of complementary bus lines.

A first embodiment of the invention will now be described with reference to FIG. 4. Elements in FIG. 4 that are identical to elements in FIGS. 1, 2, and 3 have the same reference numerals.

Figure 4:
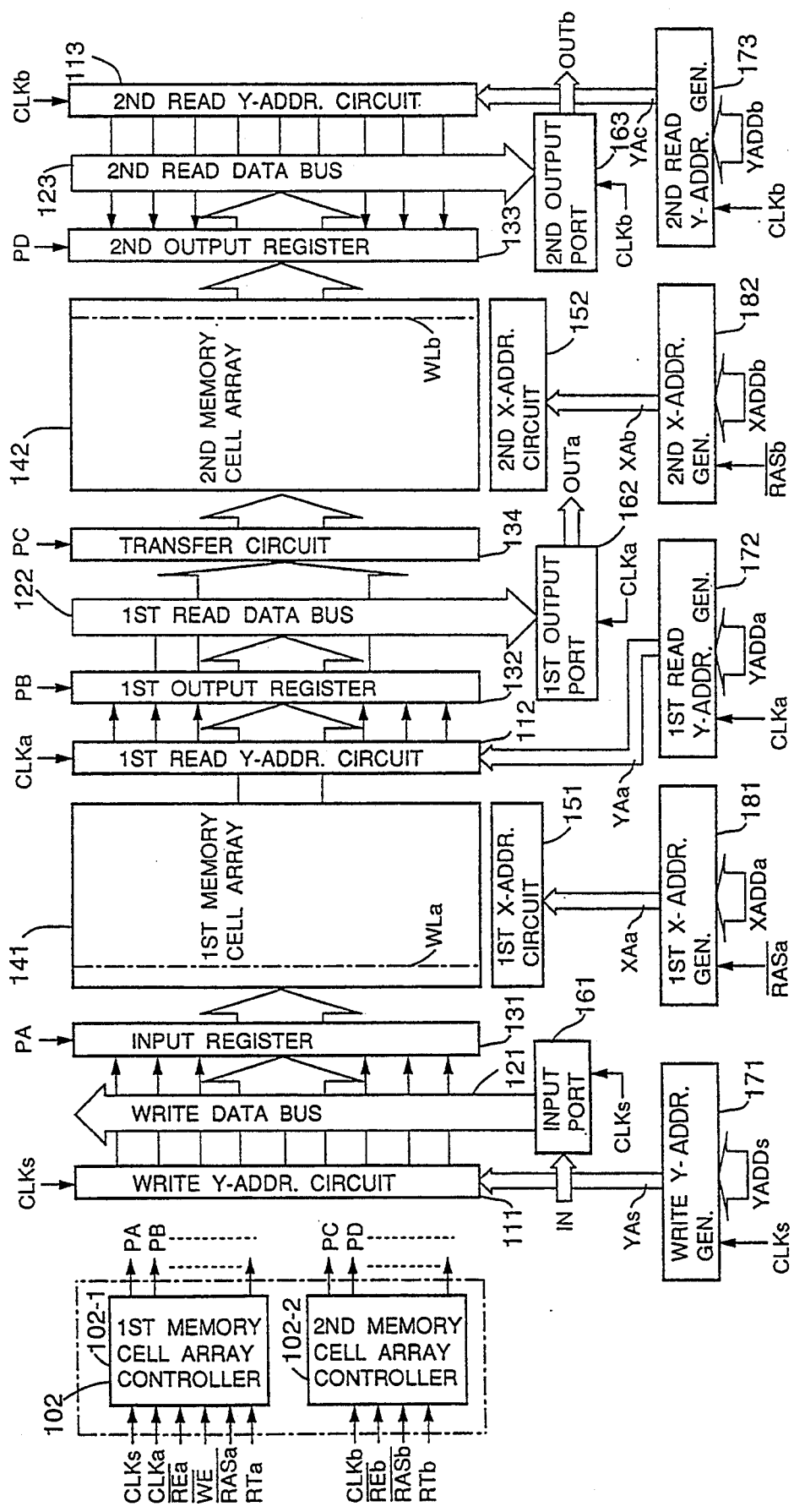
FIG. 4 is a block diagram illustrating a first embodiment of the invented multiple serial-access memory.

Instead of the control circuit 101 in FIG. 1, the memory in FIG. 4 has a dual control circuit 102. The write Y-address YADDs signal is not input directly to the write Y-addressing circuit 111, but to a write Y-address generator 171 comprising, for example, a transparent latch. Operating in synchronization with the write clock signal CLKs, the write Y-address generator 171 latches the Y-address signal YADDs and sends it as an internal write Y-address signal YAs to the write Y-addressing circuit 111.

Similarly, a first read Y-address generator 172 operating in synchronization with the first read clock signal CLKa latches the first read Y-address signal YADDa and sends it as an internal read Y-address YAa to the first read Y-addressing circuit 112; a second read Y-address generator 173 operating in synchronization with the second read clock CLKb receives the second read Y-address signal YADDb and sends it as an internal read Y-address YAb to the second read Y-addressing circuit 113; a first X-address generator 181 operating in synchronization with a first row address strobe signal $\overline{RASa}$ latches the first X-address signal XADDa and sends it as an internal X-address XAa to the first X-addressing circuit 151; and a second X-address generator 182 operating in synchronization with the second row address strobe signal $\overline{RASb}$ latches the second X-address signal XADDb and sends it as an internal X-address XAb to the second X-addressing circuit 152.

The dual control circuit 102 comprises a first memory cell array controller 102-1 and a second memory cell array controller 102-2. The first memory cell array controller 102-1 receives the clock signals CLKs and CLKa, a first read enable signal $\overline{REa}$, a write enable signal $\overline{WE}$, the first row address strobe signal $\overline{RASa}$, and a first read transfer signal RTa, and generates PA, PB, and other internal control signals. The second memory cell array controller 102-2 receives the clock signal CLKb, a second read enable signal $\overline{REb}$, the second row address strobe signal $\overline{RASb}$, and a second read transfer signals RTb, and generates PC, PD, and other internal control signals. Horizontal bars over control signal names indicate signals that are active low.

Table 1 indicates how the data transfer control signals PA, PB, PC, and PD are generated from $\overline{RASa}$, $\overline{RASb}$, RTa, and RTb. Basically, when $\overline{RASa}$ goes low, data moves into the first memory cell array 141 if RTa is low and out of the first memory cell array 141 if RTa is high. Similarly, when $\overline{RASb}$ goes low, data move into the second memory cell array 142 if RTb is low and out of the second memory cell array 142 if RTb is high. PB, PC, and PD are generated with a slight delay from the high-to-low transition of $\overline{RASa}$ or $\overline{RASb}$, as will be seen later.

TABLE 1

| Data Transfer Signals | | | |
|---|---|---|---|
| $\overline{RASa}$ | RTa | Active data transfer signal | Data transfer (1st memory cell array) |
| Low | Low | PA | Into 1st memory cell array |
| Low | High | PB | Out of 1st memory cell array |
| High | — | Neither | None |
| $\overline{RASb}$ | RTb | Active data transfer signal | Data transfer (2nd memory cell array) |
| Low | Low | PC | Into 2nd memory cell array |
| Low | High | PD | Out of 2nd memory cell array |
| High | — | Neither | None |

The memory in FIG. 4 can input serial data from the input terminal IN, store the data in the first memory cell array 141, output data from the first memory cell array 141 to the output terminal OUTa, transfer data from the first memory cell array 141 to the second memory cell array 142, and output data from the second memory cell array 142 to the output terminal OUTb. Examples of these operations will be described next.

Figure 5:
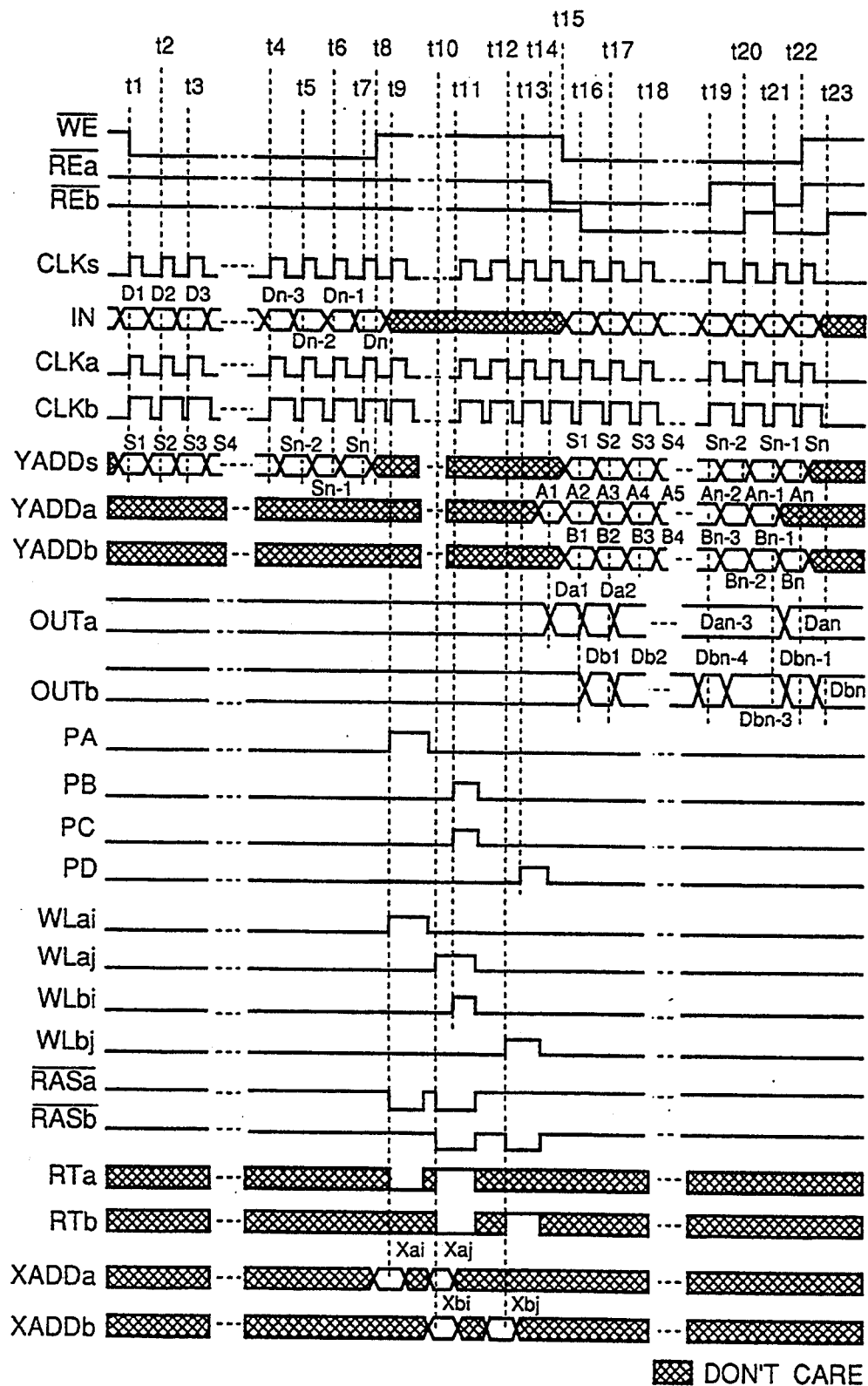
FIG. 5 is a timing diagram illustrating the operation of the first embodiment.

Referring to FIG. 5, at time t1 an external device initiates the input of data to the memory by supplying an address S1 as the write Y-address YADDs, sending data D1 to the input terminal IN, and driving the write enable signal $\overline{WE}$ to its active state (low). The input port 161 latches the data D1 at the rise of the write clock signal CLKs. The write Y-address generator 171 latches the address signal S1 at the rise of CLKS and sends it as an internal address YAs to the write Y-addressing circuit 111, causing one of the decoder units YAj shown in FIG. 2 to output a high signal yaj (where j is some integer between 1 and n). This signal turns on the transistors traj and traj/ in the input register 131, so that the input port 161 transfers the data D1 through the write data bus 121 and transistors traj and traj/ to the flip-flp FFaj in the input register 131.

At times t2 to t7 this same operation is repeated with new Y-addresses and data. If the addresses S1, . . . , Sn are all different, the data D1, . . . , Dn will all be stored in different flip-flops in the input register 131. The write enable signal $\overline{WE}$ remains low throughout this operation.

The addresses S1, . . . , Sn may be supplied in ascending sequence, descending sequence, or a random sequence, random addressing often being required in workstation and personal-computer applications. The external device has complete freedom in determining how to supply the addresses and data. Different data can be routed to the same address, for example, or the number of addresses can be less than n, updating data in only some of the flip-flops in the input register 131.

At time t8 the write enable signal $\overline{WE}$ goes high. The first memory cell array controller 102-1 responds by generating a control signal (not indicated drawings) that prevents further transfer of data from the input port 161 to the input register 131. For example, this signal disables all of the decoder units in the write Y-addressing circuit 111, so that all the signals ya1, . . . , yln are low and all the transistors tra1, tra1/, . . . , tran, tran/ are turned off in the input register 131.

At time t9 the external device supplies an address XAi as the first X-address signal XADDa, drives the first read transfer signal RTa low (if it is not already low), and drives the first row address strobe signal $\overline{RASa}$ low. This causes the first X-address generator 181 to send XAi as an internal address to the first X-addressing circuit 151. The first X-addressing circuit 151 drives the corresponding word line WLai to the high state. At the same time, the first memory cell array controller 102-1 drives the data transfer signal PA high, turning on all the transistors trb1, trb1/, . . . , trbn, trbn/ in the input register 131. The data stored in the flip-flops in the input register 131 at times t1 to t7 are thereby transferred over the bit lines to the memory cells coupled to the word line WLai, with amplification by the sense amplifiers SA1, . . . , SAn, and stored in these memory cells.

The preceding operations complete the storage of data in the first memory cell array 141. Next, the operation of transferring data from the first memory cell array 141 to the second memory cell array 142 will be described.

At time t10, the external device supplies a new address Xaj at the first X-address signal XADDa and an address Xbi as the second X-address signal XADDb, drives the first read transfer signal RTa high, drives the second read transfer signal RTb low, and drives both $\overline{RASa}$ and $\overline{RASb}$ low. At the high-to-low transition of $\overline{RASa}$ and $\overline{RASb}$ the addresses Xaj and Xbi are latched by the first and second X-address generators 181 and 182 and sent as internal addresses to the first and second X-addressing circuits 151 and 152. The first X-addressing circuit 151 immediately drives the corresponding word line WLaj to the high state. Data stored in the memory cells coupled to word line WLaj in the first memory cell array 141 are placed on the bit lines BLa1, BLa1/, . . . , BLan, BLan/ and amplified by the sense amplifiers SA1, . . . , SAn. The word line WLbi and sense amplifiers SB1, . . . , SBn in the second memory cell array 142 remain inactive.

At time t11, the second X-addressing circuit 152 drives the word line WLbi high in the second memory cell array 142 and the second memory cell array controller 102-2 drives PB and PC high, turning on the transistors trc1, trc1/, . . . , trcn, trcn/ and tre1, tre1/, . . , tren, tren/. The data on the bit lines BLa1, BLa1/, . . . , BLan, BLan/ in the first memory cell array 141 are thereby transferred to the bit lines BLb1, BLb1/, . . . , BLbn, BLbn/ in the second memory cell array 142. The data are again amplified by the sense amplifiers SB1, . . . , SBn and stored in the memory cells coupled to word line WLbi. The data are also stored in the flip-flops FFb1, . . . , FFbn in the first output register 132.

This completes the transfer of data between the two memory cell arrays. Next data with X-address Xaj in the first memory cell array 141, which are now stored in the first output register 132, will be read out to the output terminal OUTa. In addition, data with another X-address Xbj in the second memory cell array 142 will be read out to the output terminal OUTb, and new data will be input and stored in the input register 131. These three operations will moreover be carried out simultaneously and asynchronously.

At time t12, the external device supplies the address Xbj as the second X-address signal XADDb, drives the second read transfer signal RTb high, and drives the second row address strobe signal $\overline{RASb}$ low. The second X-address generator 182 sends the address Xbj as an internal address to the second X-addressing circuit 152, which drives the corresponding word line WLbj high in the second memory cell array 142. Data from the memory cells coupled to this word line are placed on the bit lines and amplified by the sense amplifiers SB1, . . . , SBn.

At time t13, the data transfer signal PD goes high, turning on the transistors trf1, trf1/, . . . , trfn, trfn/ in the second output register 133 and transferring the data from the bit lines in the second memory cell array 142 to the flip-flops FFc1, . . . , FFcn in the second output register 133.

At time t14, the external device supplies an address A1 as the first read Y-address YADDa and drives the first read enable signal $\overline{REa}$ low. The first read Y-address generator 172 latches the address A1 at the rise of the first read clock signal CLKa and sends it as an internal address to the first read Y-addressing circuit 112. This causes a decoder unit YBj in the first read Y-addressing circuit 112 to output a high signal ybj, turning on the transistors trdj and trdj/, thereby transferring the data held in the flip-flop FFbj in the first output register 132 to the first read data bus 122. The first output port 162 outputs the data from the first read data bus 122 to the output terminal OUTa as the data Da1.

At time t15, the external device also drives the write enable signal $\overline{WE}$ low to start a serial write cycle. From time t15 to time t22 it supplies a new series of Y-addresses S1, S2, . . . , Sn and new data, which are stored in the flip-flops of the input register 131 by the process explained earlier (the process carried out at times t1 to t7). Although this is not shown in the drawing, the data can next be stored in the first memory cell array 141 by driving $\overline{WE}$ high and driving $\overline{RTa}$ and $\overline{RASa}$ low as was done at times t8 and t9.

At time t16, a next Y-address YADDa A2 is latched by the first read Y-address generator 172 and decoder by the first read Y-addressing circuit 112, causing output of new data Da2 from the first output register 132 to the output terminal OUTa. In addition, the external device supplies an address B1 as the second read Y-address signal YADDb and drives the second read enable signal $\overline{REb}$ low to start reading the data that were transferred from the second memory cell array 142 to the second output register 133 at time t13. The second read Y-address generator 173 latches the address B1 at the rise of the second read clock CLKb and sends it as an internal address to the second read Y-addressing circuit 113. The second read Y-addressing circuit 113 decodes this address and activates one of the signals ycj, turning on transistors trgj and trgj/ in the second output register 133 and coupling the flip-flop FFcj to the second read data bus 123. The second read data bus 123 conveys the data held in flip-flop FFcj to the second output port 163, to be output at the output terminal OUTb as the data Db1.

At times t17 and t18, the above operations continue, synchronized with the clock signals CLKs, CLKa, and CLKb. The signals $\overline{WE}$, $\overline{REa}$, and $\overline{REb}$ remain low.

At time t19, the external device drives $\overline{REa}$ high to temporarily halt the transfer of data from the first output register 132 to the first output port 162. The first output port 162 continues to output the preceding data Dan-3 at OUTa. Data corresponding to addresses An-2 and An-1 are skipped.

At time t20, the external device also drives $\overline{REb}$ high to temporarily halt the transfer of data from the second output register 133 to the second output port 163. The output terminal OUTb continues to output the preceding data Dbn-3, skipping the data corresponding to address Bn-2.

At time t21, the external device drives $\overline{REa}$ and $\overline{REb}$ low again. Serial data output then continues with output of data Dan from OUTa and Dbn-1 from OUTb.

At time t22, the external device drives $\overline{WE}$ high to end serial data input, and drives $\overline{REa}$ high to end serial output at OUTa. The input terminal IN is now in a don't-care condition: the write Y-addressing circuit 111 is disabled, so further input data will now be transferred to the input register 131. The first output port 162 continues to output the last serial data Dan from the output terminal OUTa.

At time t23, $\overline{REb}$ is also driven high, ending serial output from the second output port 163. The output terminal OUTb continues to output the last serial data Dbn.

The invented memory accordingly permits three processes to proceed concurrently: serial input to the first memory cell array 141, serial output from the first memory cell array 141, and serial output from the second memory cell array 142. More precisely, the serial input is to the input register 131, from which an entire row of data is transferred to the first memory cell array 141 after serial input is completed, and serial output is from the first and second output registers 132 and 133, to which data have previously been transferred from the first and second memory cell arrays 141 and 142. The three processes have independent clock signals and can be controlled independently by the $\overline{WE}$, $\overline{REa}$, and $\overline{REb}$ signals.

By controlling the $\overline{REa}$ or $\overline{REb}$ signal, for example, it is possible to output only selected data bits. This feature is useful when output of only even bits or only odd bits is desired, or when only every k-th bit (where k is a positive integer) is desired.

A particular advantage of the invented memory is that when data are transferred from the first memory cell array 141 to the first output register 132, the same data can be transferred in the same cycle to the second memory cell array 142. The array-to-array transfer takes place for the cells corresponding to an entire word line at a time, which is much faster than transferring data serially from one memory device to another as in the prior art.

Moreover, by provision of appropriate X-addresses it is possible to transfer data from memory cells connected to any word line in the first memory cell array 141 to memory cells connected to any word line in the second memory cell array 142. Data can accordingly be stored in one order in the first memory cell array 141, then rearranged and stored in a different order in the second memory cell array 142. Data can furthermore be output in any desired order from either the first or second memory cell array 141 or 142, by provision of the appropriate X- and Y-addresses. These features are useful in many types of data processing, particularly in high-speed data manipulations performed in workstations and personal computers.

Next a second embodiment of the invention will be described with reference to FIGS. 6 and 7. This embodiment is generally similar to the first but has three-state outputs. Elements in FIG. 6 that are identical to elements in FIG. 4 have the same reference numerals.

Figure 6:
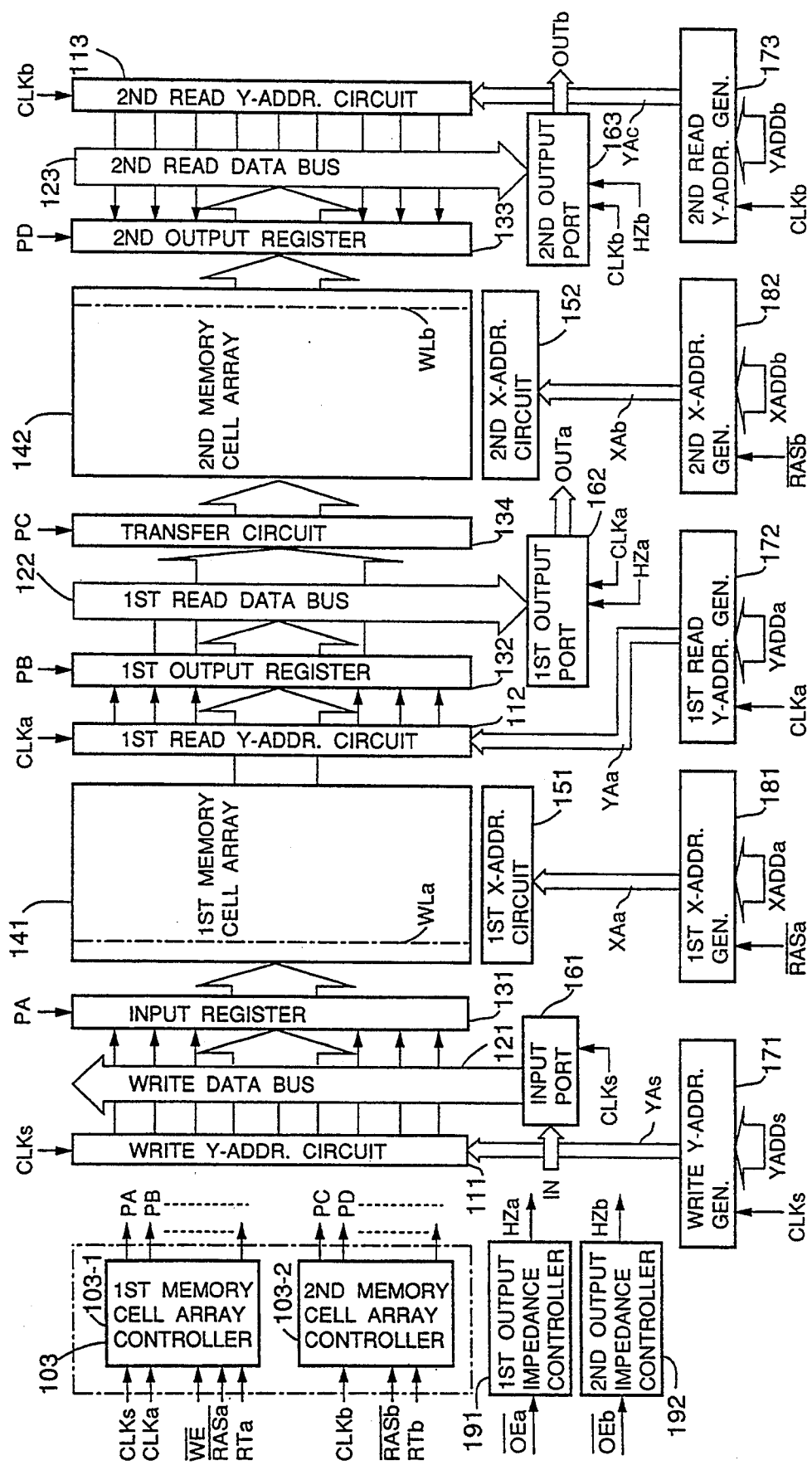
FIG. 6 is a block diagram illustrating a second embodiment of the invented multiple serial-access memory.

Referring to FIG. 6, this embodiment has a dual control circuit 103 comprising memory cell array controllers 103-1 and 103-2. The input signals to these controllers are the same as in FIG. 4 except that there are no read enable signals $\overline{REa}$ and $\overline{REb}$. The third embodiment also has two output impedance controllers 191 and 192 that independently control the output ports 162 and 163.

The first output impedance controller 191 receives a first external output enable signal $\overline{OEa}$ and generates an internal signal HZa that controls the output impedance of the first output port 162. The second output impedance controller 192 receives a second external output enable signal $\overline{OEb}$ and generates an internal signal HZb that controls the output impedance of the second output port 163. Impedance control can be synchronized with the clock signals CLKa and CLKb: when $\overline{OEa}$ or $\overline{OEb}$ changes state, the output impedance at OUTa or OUTb does not change until the rise of CLKa or CLKb. Alternatively, impedance control can be synchronized directly to $\overline{OEa}$ and $\overline{OEb}$, independent of other signals.

The operation of the second embodiment will be explained with reference to FIG. 7. The operations of storing serial input data in the first memory cell array 141 and transferring data from the first memory cell array 141 to the second memory cell array 142 at times t1 to t13 are the same in FIG. 5, so a description will be omitted. During these operations the output enable signals $\overline{OEa}$ and $\overline{OEb}$ are both high (inactive) and the output terminals OUTa and OUTb are both in the high-impedance state.

At time t14, the read Y-address A1 is latched by the first read Y-address generator 172 at the rise of the first read clock signal CLKa and decoded by the first read Y-addressing circuit 112, causing transfer of data Da1 from a flip-flop in the first output register 132 to the first output port 162 via the first read data bus 122. At the same time, the output enable signal $\overline{OEa}$ is driven low, causing the output terminal OUTa to change from the high-impedance to the low-impedance state and enabling output of the data Da1.

At time t15 the write enable $\overline{WE}$ is driven low, initiating the same serial data input sequence as in FIG. 5, which proceeds in synchronization with the write clock signal CLKs.

At time t16, the first read Y-address generator 172 latches and the first read Y-addressing circuit 112 decodes another Y-address A2. The first output enable signal $\overline{OEa}$ is still low, so the output terminal OUTa outputs the corresponding data Da2. In addition, the second output enable signal $\overline{OEb}$ is now driven low, enabling output to take place from the output terminal OUTb. An address B1 is latched by the second read Y-address generator 173 at the rise of the second read clock CLKb and decoded by the second read Y-addressing circuit 113, causing transfer of corresponding data Db1 from a flip-flop in the second output register 133 to the second output port 163 and output of data Db1 from the output terminal OUTb.

These input and output operations continue at times t17 and t18 in synchronization with the clock signals CLKs, CLKa, and CLKb.

At time t19, $\overline{OEa}$ is driven high to temporarily disable output from first output port 162. The output terminal OUTa returns to the high-impedance state. Output data Dan-2 and Dan-1 are transferred to the first output port 162 but not output from the output terminal OUTa.

At time t20, $\overline{OEb}$ is driven high to temporarily disable the output from the second output port 163. The output terminal OUTb returns to the high-impedance state. The second output port 163 receives but does not output data Dbn-2.

At time t21, $\overline{OEa}$ and $\overline{OEb}$ are driven low again to resume output from the output terminals OUTa and OUTb. At time t22, $\overline{OEa}$ goes high and output terminal OUTa returns to the high-impedance state. At time t23, $\overline{OEb}$ goes high, returning output terminal Outb to the high-impedance state, and $\overline{WE}$ goes high, ending serial data input.

An advantage of the output impedance control scheme in the second embodiment is that it enables the output terminals OUTa and OUTb to be connected to external bus lines shared with other devices. It is even possible for OUTa and OUTb to be connected to the same bus line, if care is taken not to allow $\overline{OEa}$ and $\overline{OEb}$ to be active simultaneously. Another advantage is that power can be conserved by placing the output terminals OUTa and OUTb in the high-impedance state when output is not required.

Next a third embodiment of the invention will be described with reference to FIGS. 8 and 9. This embodiment combines the features of the first and second embodiments. Elements in FIG. 8 that are identical to elements in FIGS. 4 and 6 have the same reference numerals.

Figure 8:
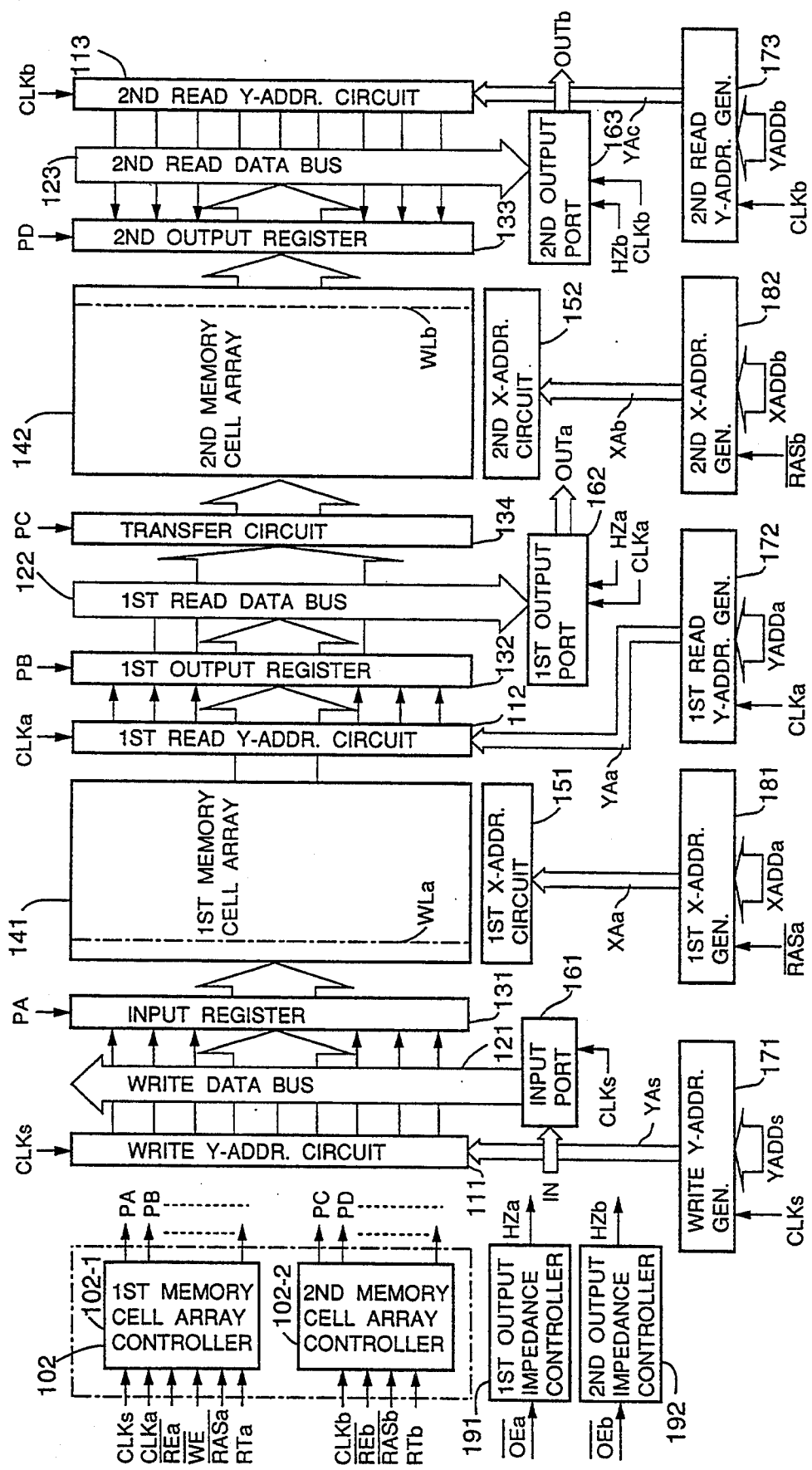
FIG. 8 is a block diagram illustrating a third embodiment of the invented multiple serial-access memory.

Referring to FIG. 8, the third embodiment has the same dual control circuit 102 as the first embodiment, which receives read enable signals $\overline{REa}$ and $\overline{REb}$, but also has output impedance controllers 191 and 192 that control the output impedance of the first output port 162 nad second output port 163. As before, output impedance control can be synchronized with CLKa and CLKb, or directly to $\overline{OEa}$ and $\overline{OEb}$.

Figure 7:
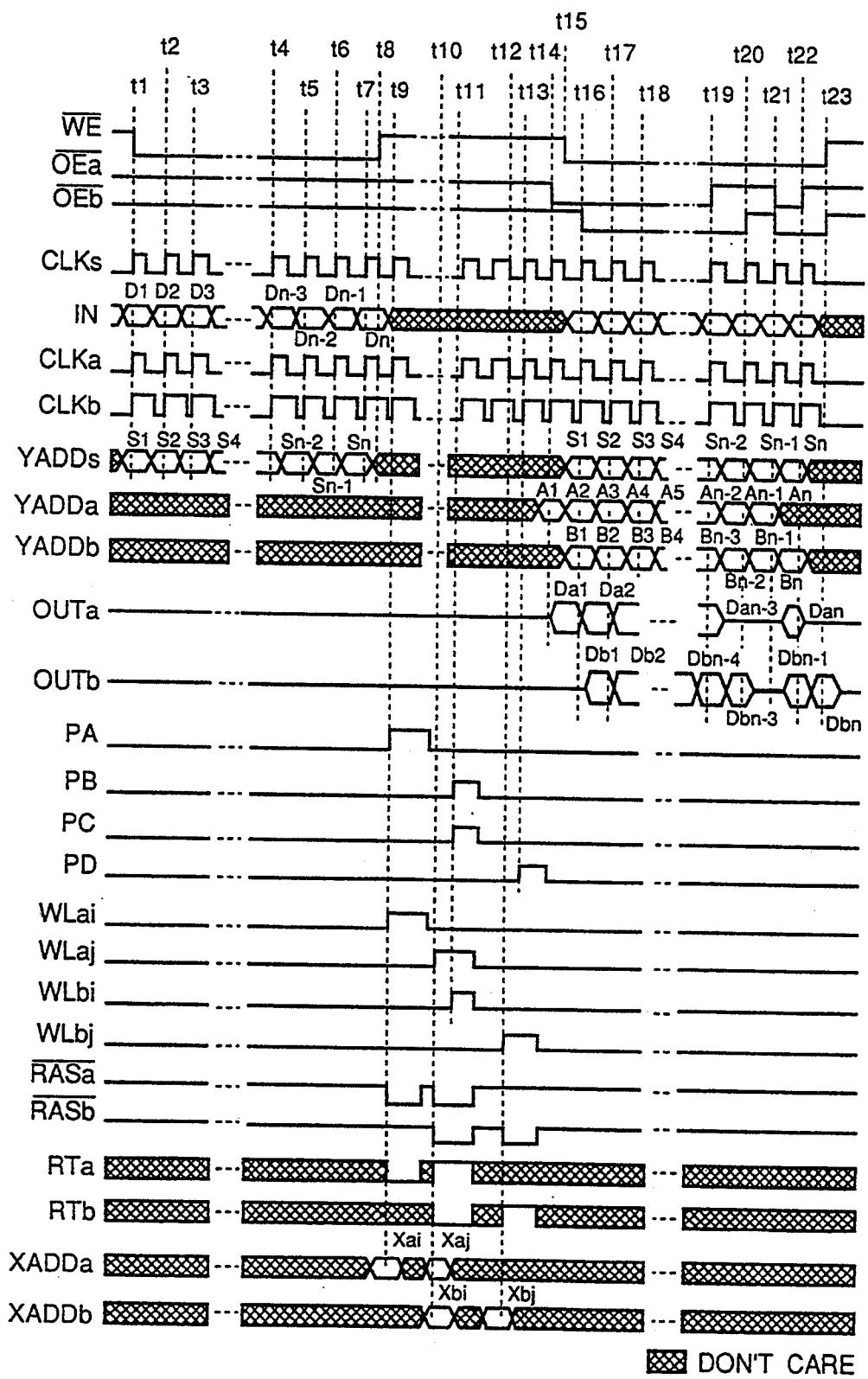
FIG. 7 is a timing diagram illustrating the operation of the second embodiment.
Figure 9:
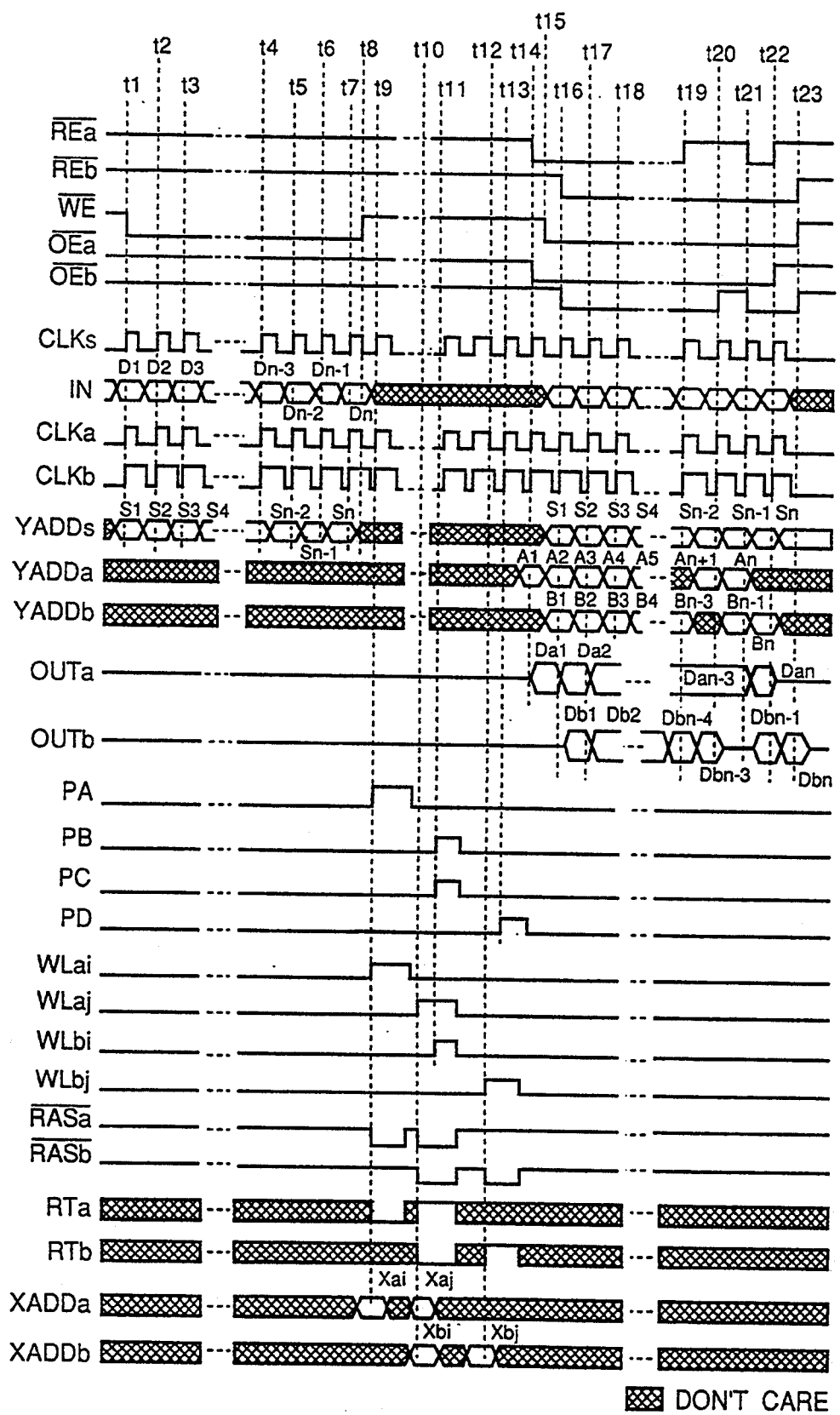
FIG. 9 is a timing diagram illustrating the operation of the third embodiment.

Referring to FIG. 9, the operations from time t1 to time t18 are the same as in FIGS. 5 and 7. At time t14 $\overline{REa}$ and $\overline{OEa}$ both go low, enabling transfer of data Da1, Da2, ... from flip-flops in the first output register 132 to the first output port 162 and output of these data from the output terminal OUTa. Similarly, at time t16 $\overline{REb}$ and $\overline{OEb}$ both go low, enabling transfer of data Db1, Db2, ... from flip-flops in the second output register 133 to the second output port 163 and output of these data from the output terminal OUTb.

At time t19, to temporarily extend output of the preceding data Dan-3 from the output terminal OUTa, the external device holds $\overline{OEa}$ low but drives $\overline{REa}$ high, inhibiting the transfer of new data from the second read Y-addressing circuit 113 to the second output port 163. Output of the data Dan-3 is prolonged by two extra CLKa cycles in this way.

At time t20, to temporarily disable the output of data from output terminal OUTb, the external device drives $\overline{OEb}$ high, placing OUTb in the high-impedance state. It is not necessary for $\overline{REb}$ to go high; even if new data are transferred from the second output register 133 to the second output port 163, the data will not be output.

At time t21, $\overline{REa}$ and $\overline{OEb}$ are drive low again. Data Dan and Dbn-1 are now output from OUTa and OUTb, respectively. At time t22 $\overline{REa}$ and $\overline{OEa}$ go high, ending output from OUTa, which returns to the high-impedance state. At time t23 $\overline{REb}$ and $\overline{OEb}$ go high, ending output from OUTb, which also returns to the high-impedance state, and $\overline{WE}$ goes high, ending the input of serial data at the input terminal IN.

The third embodiment has the advantages of both the first and second embodiments. Data output from OUTa or OUTb can be disabled by driving the corresponding output enable signal high. In addition, during a serial output sequence, output of desired data can be extended for extra cycles by holding the output enable signal low but driving the read enable signal high.

Next a fourth embodiment of the invention will be described with reference to FIGS. 10 and 11. This embodiment is generally similar to the third but has a single chip enable signal instead of two output enable signals. Elements in FIG. 10 that are identical to elements in FIG. 8 have the same reference numerals.

Figure 10:
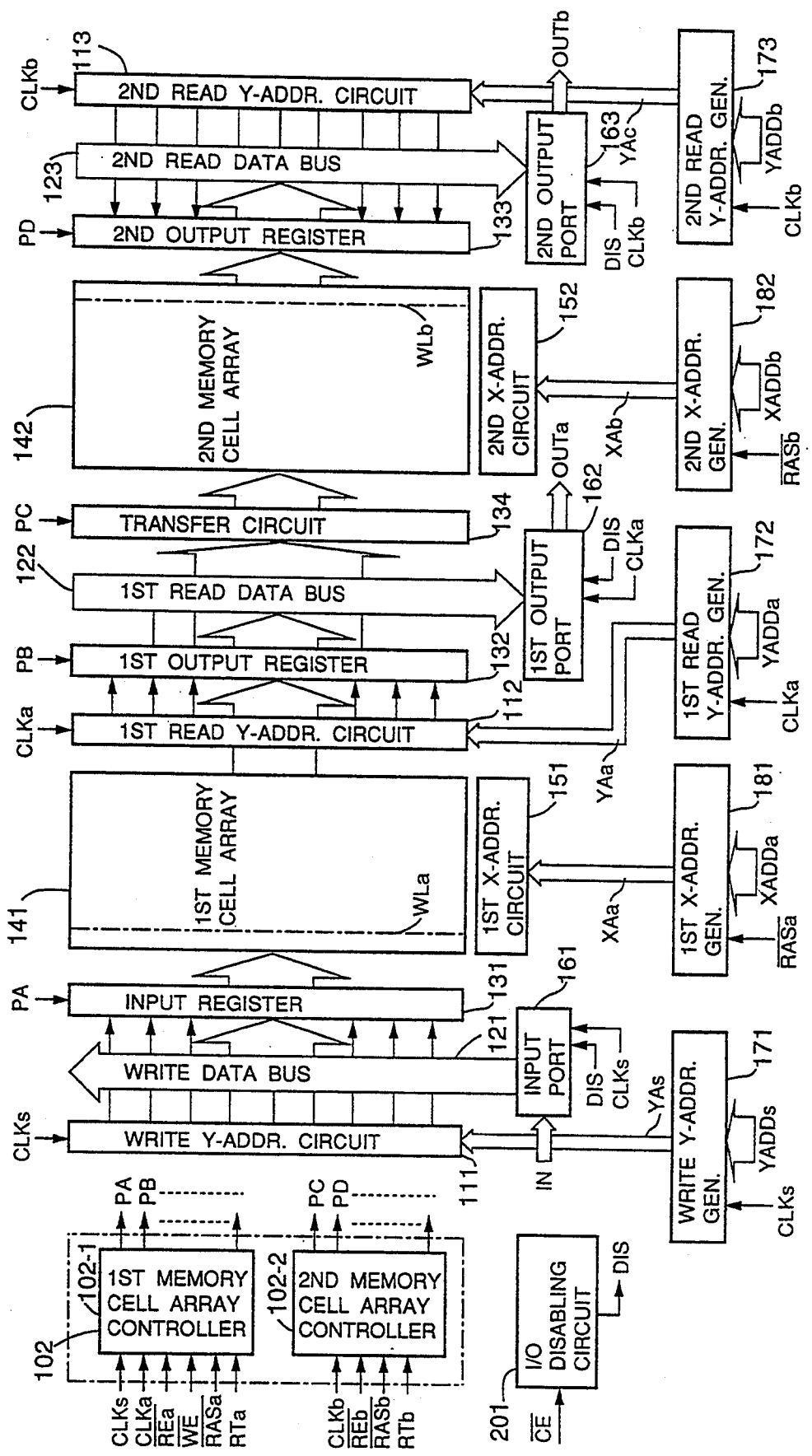
FIG. 10 is a block diagram illustrating a fourth embodiment of the invented multiple serial-access memory.

Referring to FIG. 10, the chip enable signal $\overline{CE}$ is received by an input/output disabling circuit 201. From $\overline{CE}$, the input/output disabling circuit 201 generates an internal disable signal DIS. When active, DIS disables input of data from the input terminal IN to the input port 161 and causes the first output port 162 and second output port 163 to place the output terminals OUTa and OUTb in the high-impedance state. DIS is active (high) when $\overline{CE}$ is inactive (high) and inactive (low) when $\overline{CE}$ is active (low).

Figure 11:
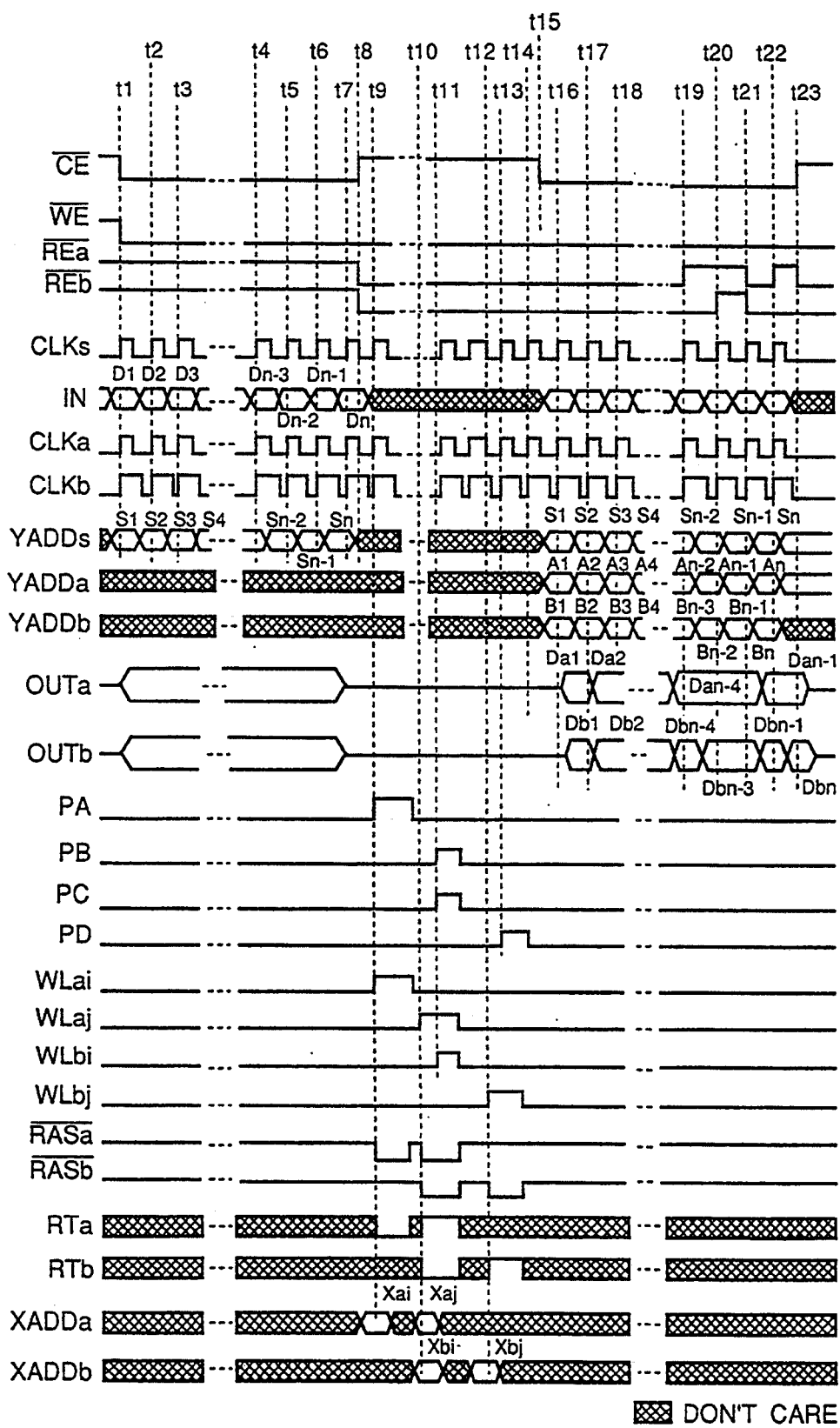
FIG. 11 is a timing diagram illustrating the operation of the fourth embodiment.

Referring to FIG. 11, at time t1 $\overline{CE}$ and $\overline{WE}$ go low to begin a serial input operation, which is carried out in the manner already described. At time t8 $\overline{CE}$ goes high, disabling the input port 161 and ending serial input. While $\overline{CE}$ is high the input port 161 can neither receive data from the input terminal IN nor transfer data to the input register 131. $\overline{REa}$ and $\overline{REb}$ go low at time t8, but no data are output from OUTa and OUTb, because $\overline{CE}$ is high.

Transfers of data from the input register 131 to the first memory cell array 141 and from the first memory cell array 141 to the first output register 132 and second memory cell array 142, however, are not disabled while CE is high. These transfers take place at times t9 to t13 as described in FIG. 5.

At time t15 CE goes low again, resuming input of serial data at the input terminal IN, together with serial output from OUTa and OUTb. REa goes high between times t19 and t21 and at time t22, and REb goes high between times t20 and t21, temporarily extending the output of data Dan-4 and Dan-1 from OUTa and Dbn-3 from OUTb. At time t23 CE goes high again, ending all input and output.

An advantage of the fourth embodiment is that WE, REa, and REb can be left in the active state (low) while CE is inactive (high). This feature is particularly useful when two or more memory devices are connected to a common bus. The same WE, REa, and REb signals can be supplied to all the memories, each of which has its own CE signal. Control by WE, REa, and REb will apply only to the memory selected by CE. In addition, memory-to-memory data transfers internal to a single memory device can be carried out even when the device is not selected, as at times t10 and t11 in FIG. 11.

Even in systems not using a common bus there is the advantage that two or more input/output operations can be controlled by a single CE signal, instead of always requiring separate control by WE, REa, and REb.

Next a fifth embodiment of the invention will be described with reference to FIGS. 12 and 13. The fifth embodiment combines the features of the second and fourth embodiments. Elements in FIG. 12 that are identical to elements in FIGS. 6 and 10 have the same reference numerals.

Figure 12:
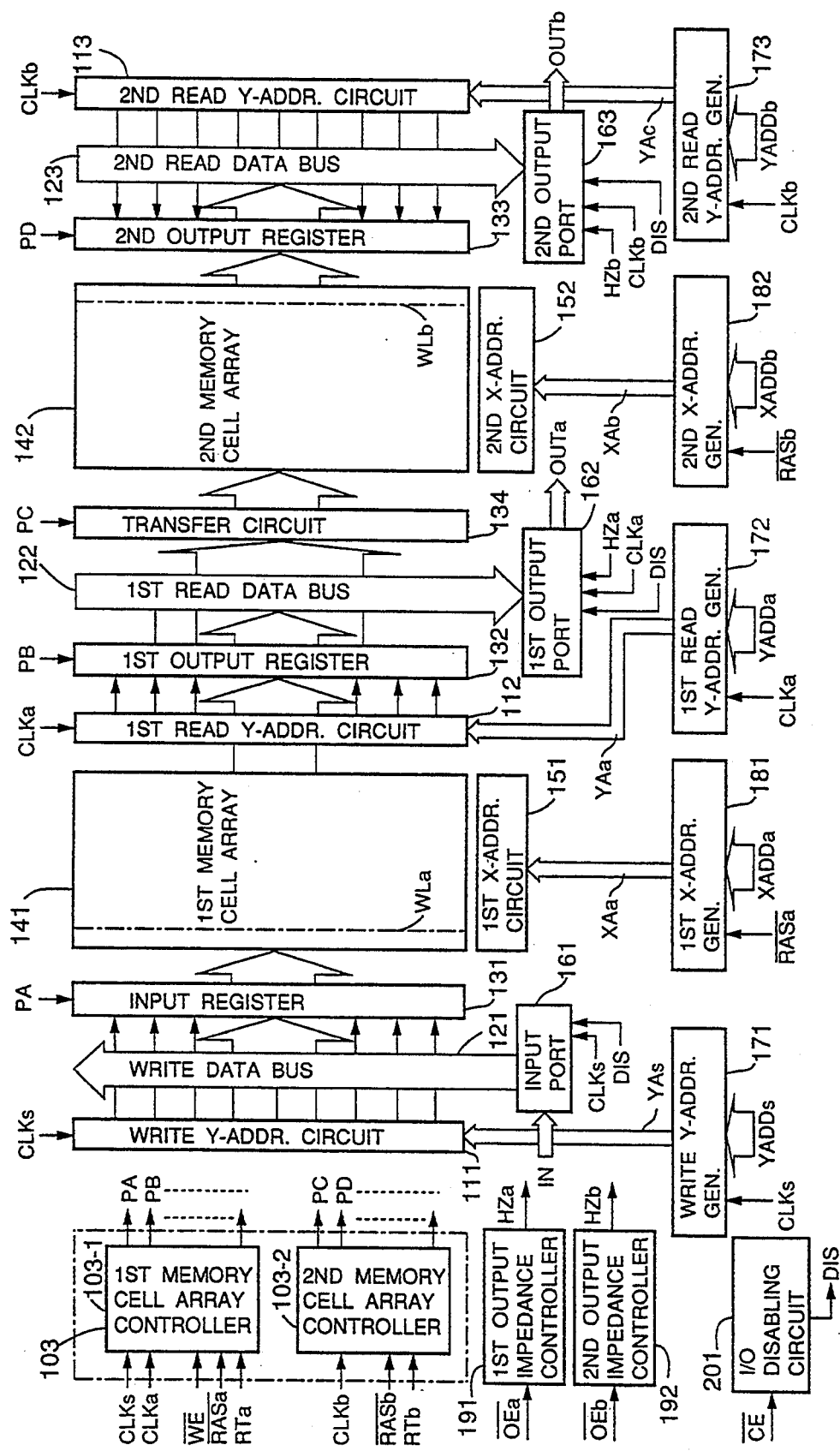
FIG. 12 is as block diagram illustrating a fifth embodiment of the invented multiple serial-access memory.

Referring to FIG. 12, the fifth embodiment has the same dual control circuit 103 and output impedance controllers 191 and 192 as the second embodiment, and the same input/output disabling circuit 201 as the fourth embodiment. Input control signals include OEa, OEb, and CE, but not REa or REb.

Figure 13:
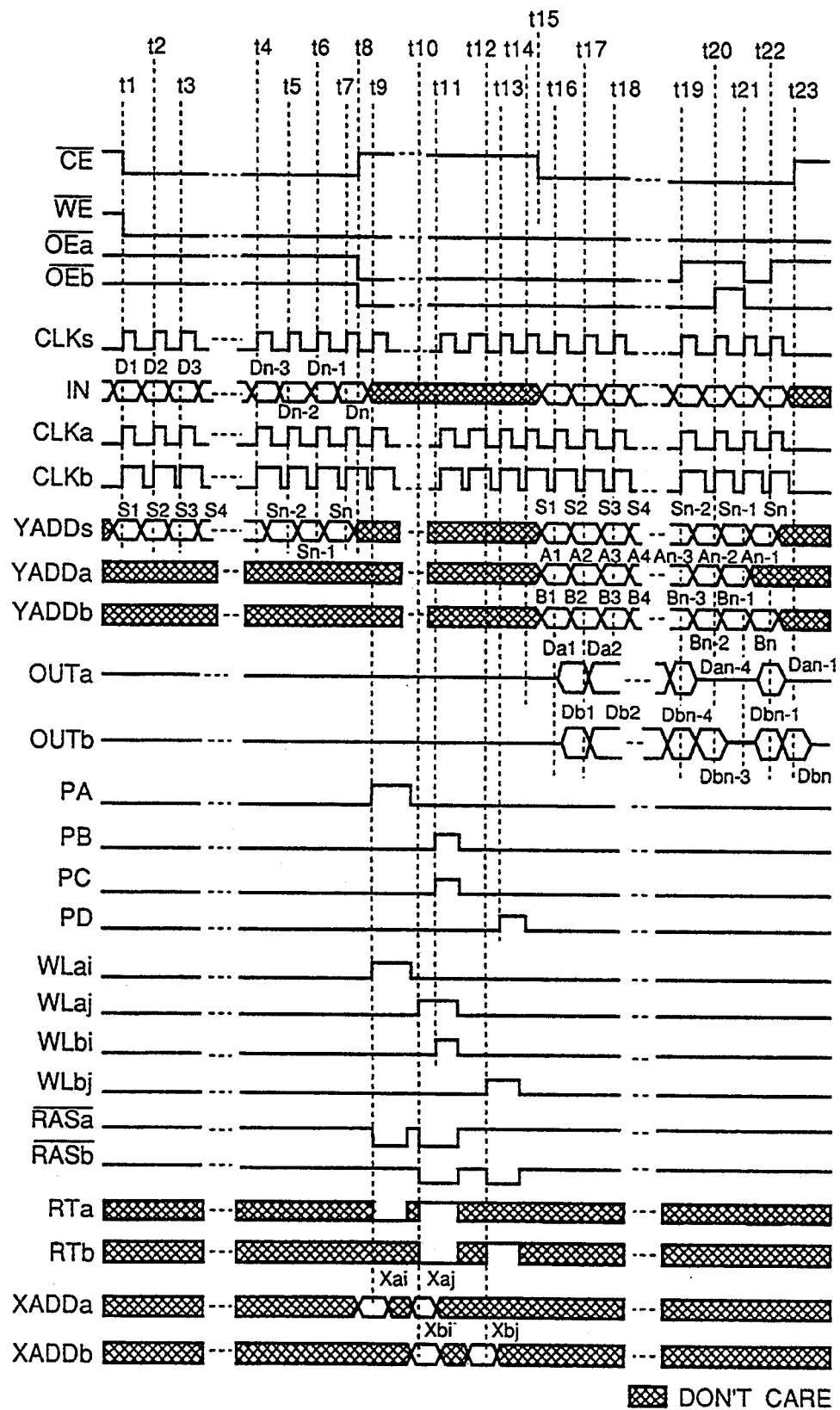
FIG. 13 is a timing diagram illustrating the operation of the fifth embodiment.

Referring to FIG. 13, serial input and output operate in the same way as in the second embodiment while CE is low, but are disabled while CE is high. Accordingly WE, OEa, and OEb can be left low while CE is high, as they are from time t8 to time t15, for example. Serial output at OUTa and OUTb does not start until CE goes low at time t15. Serial output from OUTa ends with data Dan-1 when OEa goes high at time t22, one cycle before serial output from OUTb is terminated by CE at time t23.

The fifth embodiment has the advantages of both the second and fourth embodiments. The output impedance of OUTa and OUTb can be controlled independently by OEa and OEb, or together by CE. When two or more memories are coupled to a common bus the same OEa and OEb signals can be provided to all of them, individual CE signals being used to select the memory to which OEa and OEb control applies.

Next a sixth embodiment of the invention will be described with reference to FIGS. 14 and 15. This embodiment combines the features of the third and fourth embodiments. Elements in FIG. 14 that are identical to elements in FIGS. 8 and 10 have the same reference numerals.

Figure 14:
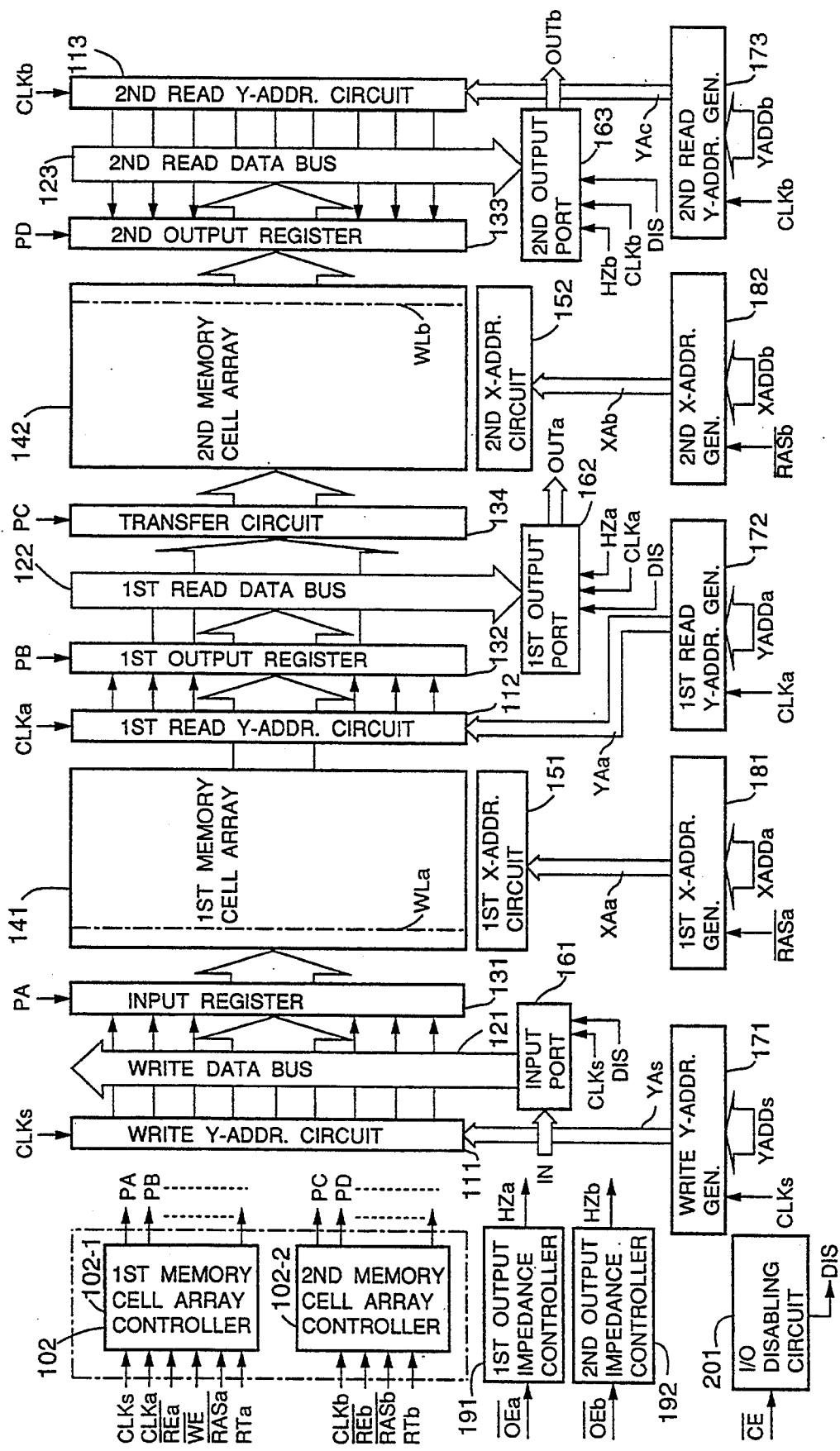
FIG. 14 is a block diagram illustrating a sixth embodiment of the invented multiple serial-access memory.

Referring to FIG. 14, the sixth embodiment has the same dual control circuit 102 and output impedance controllers 191 and 192 as the third embodiment, and the same input/output disabling circuit 201 as the fourth embodiment. Input control signals include WE, REa, REb, OEa, OEb, and CE.

Figure 15:
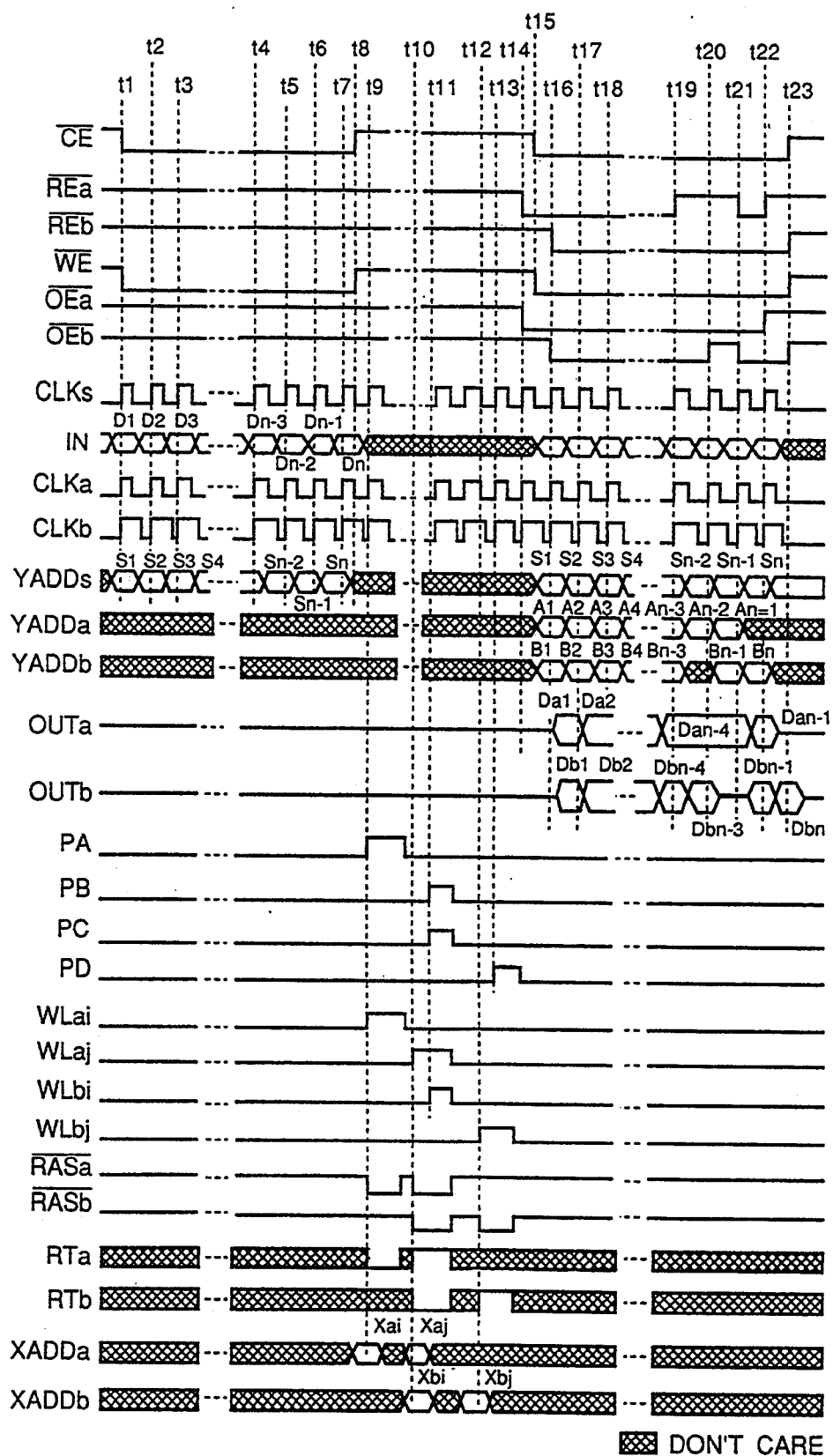
FIG. 15 is a timing diagram illustrating the operation of the sixth embodiment.

Referring to FIG. 15, serial input and output operate in the same way as in the third embodiment while CE is low, but are disabled while CE is high. Accordingly REa, REb, WE, OEa, and OEb can be left low while CE is high, although this is not shown in the drawing. During serial output, output of specific data can be extended, as at OUTa by REa from time t19 to time 21, or skipped, as at OUTb by OEb at time t20 to time 21. Output impedance can be controlled independently at OUTa and OUTb, as by OEa at time t22. The sixth embodiment combines the advantages of all the preceding embodiments.

Next a seventh embodiment of the invention will be described with reference to FIGS. 16 and 17. This embodiment is generally similar to the first embodiment, but the outputs from the output terminals OUTa and OUTb are synchronized with the same clock signal and share the same Y-addresses. Elements in FIG. 16 that are identical to elements in FIG. 4 have the same reference numerals.

Figure 16:
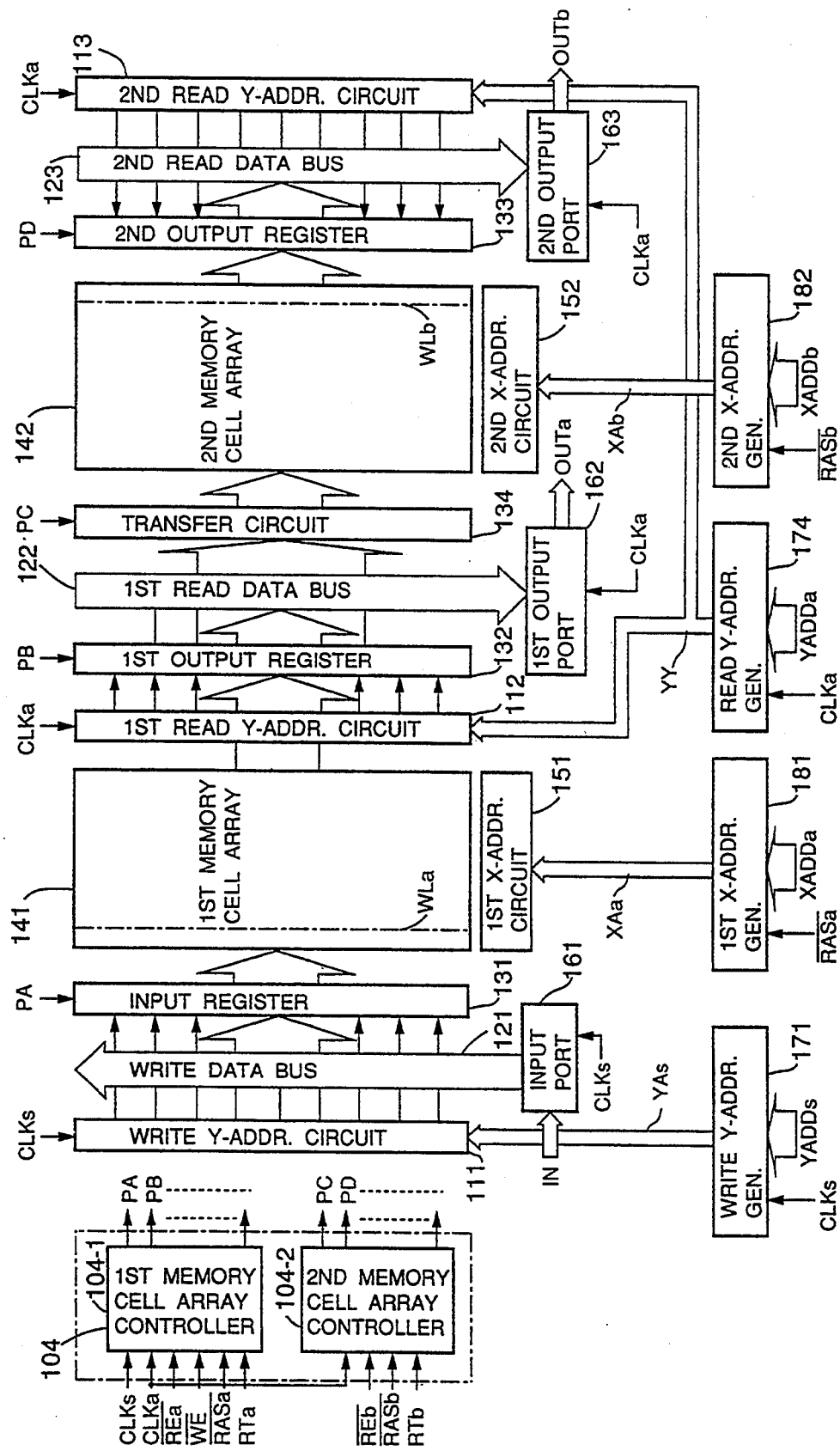
FIG. 16 is a block diagram illustrating a seventh embodiment of the invented multiple serial-access memory.

Referring to FIG. 16, this embodiment has a dual control circuit 104 comprising memory cell array controllers 104-1 and 104-2. The input signals to these controllers are the same as in FIG. 4 except that there is no second read clock CLKb. Instead, the first read clock signal CLKa is supplied to both memory cell array controllers 104-1 and 104-2. CLKa is also supplied to the second read Y-addressing circuit 113 and second output port 163, as well as to the first read Y-addressing circuit 112 and first output port 162.

In place of the first and second read Y-address generators 172 and 173 of the first embodiment, the seventh embodiment has a common read Y-address generator 174 that receives a read Y-address YADDa and generates an internal Y-address YY in synchronization with CLKa. The address YY is supplied to both the first and second read Y-addressing circuits 112 and 113.

Figure 17:
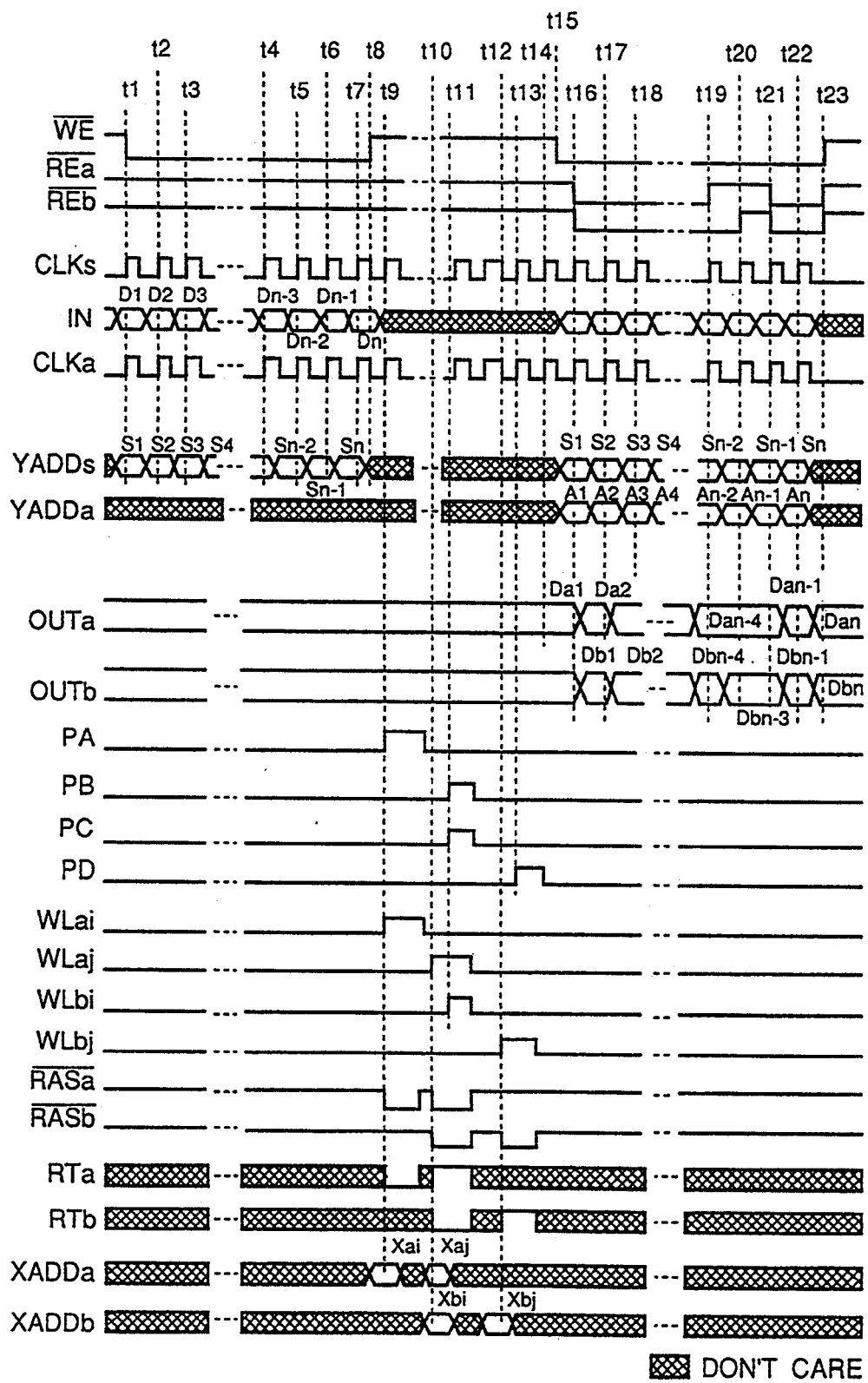
FIG. 17 is a timing diagram illustrating the operation of the seventh embodiment.

Referring to FIG. 17, the seventh embodiment operates in the same way as the first embodiment except that the clock signal CLKa and Y-addresses A1, A2, ..., An control serial output from both OUTa and OUTb. The X-addresses XADDa and XADDb may be different, and output can be controlled independently by the REa and REb signals. For example, at time t19 REa goes high, extending output of data Dan-4 from OUTa; then at time t20 REb goes high, extending output of data Dab-3 from OUTb.

The seventh embodiment is useful in applications that compare lines of data for pattern matching, or compare a line of input data with a corresponding line input after a certain delay to detect changes over time, and in other applications in which the two serial outputs (from OUTa and OUTb) always have the same Y-address sequence. In such applications the seventh embodiment has the advantages of requiring fewer control signals and less chip area than the first embodiment.

Next an eighth embodiment that combines the features and advantages of the second and seventh embodiments will be described with reference to FIGS. 18 and 19. Elements in FIG. 18 that are identical to elements in FIGS. 6 and 16 have the same reference numerals.

Figure 18:
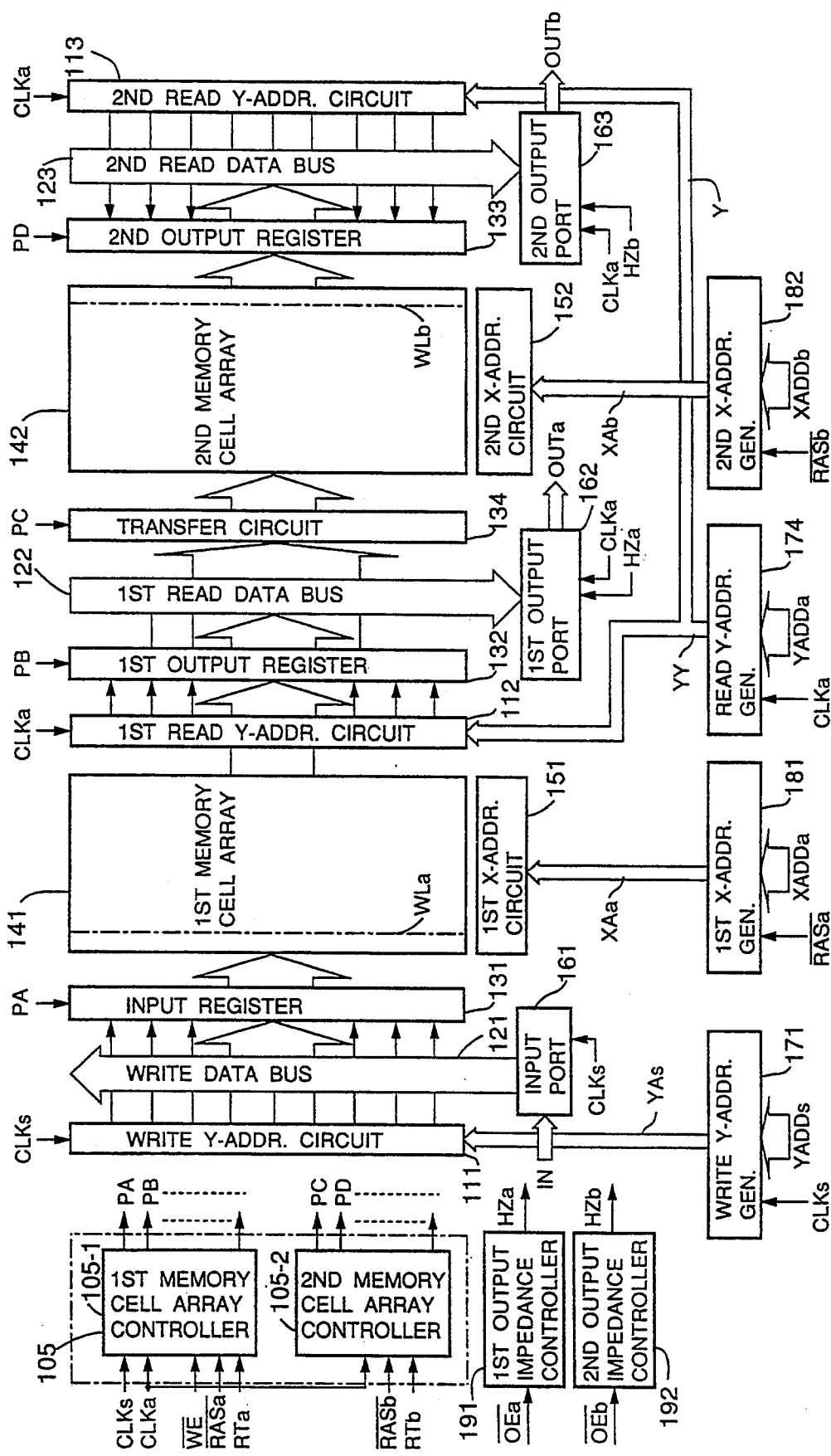
FIG. 18 is a block diagram illustrating an eighth embodiment of the invented multiple serial-access memory.

Referring to FIG. 18, this embodiment has a dual control circuit 105 comprising memory cell array controllers 105-1 and 105-2. The input signals to these controllers are the same as in FIG. 6 except that the first read clock signal CLKa is supplied to both the memory cell array controllers 105-1 and 105-2, replacing the second read clock CLKb. A common read Y-address generator 174 supplies an internal Y-address YY to both the first and second read Y-addressing circuits 112 and 113 as in FIG. 16.

Figure 19:
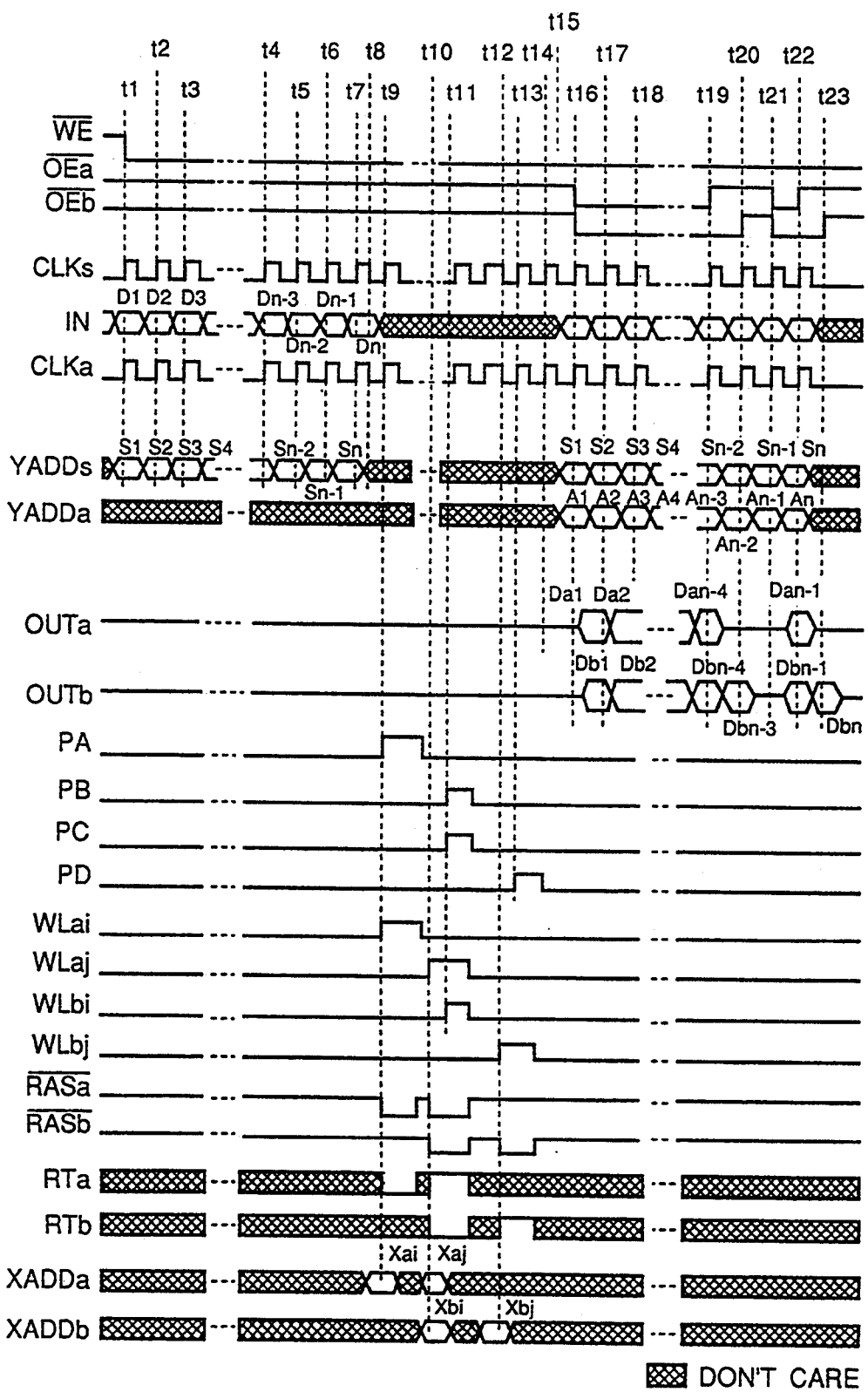
FIG. 19 is a timing diagram illustrating the operation of the eighth embodiment.

Referring to FIG. 19, the eighth embodiment operates in the same way as the second embodiment but uses the clock signal CLKa and Y-addresses A1, A2, ..., An to control serial output from both OUTa, and OUTb. Output from OUTa and OUTb can be started and stopped independently by the $\overline{OEa}$ and $\overline{OEb}$ signals, as illustrated at times t19 and t20.

Figure 20:
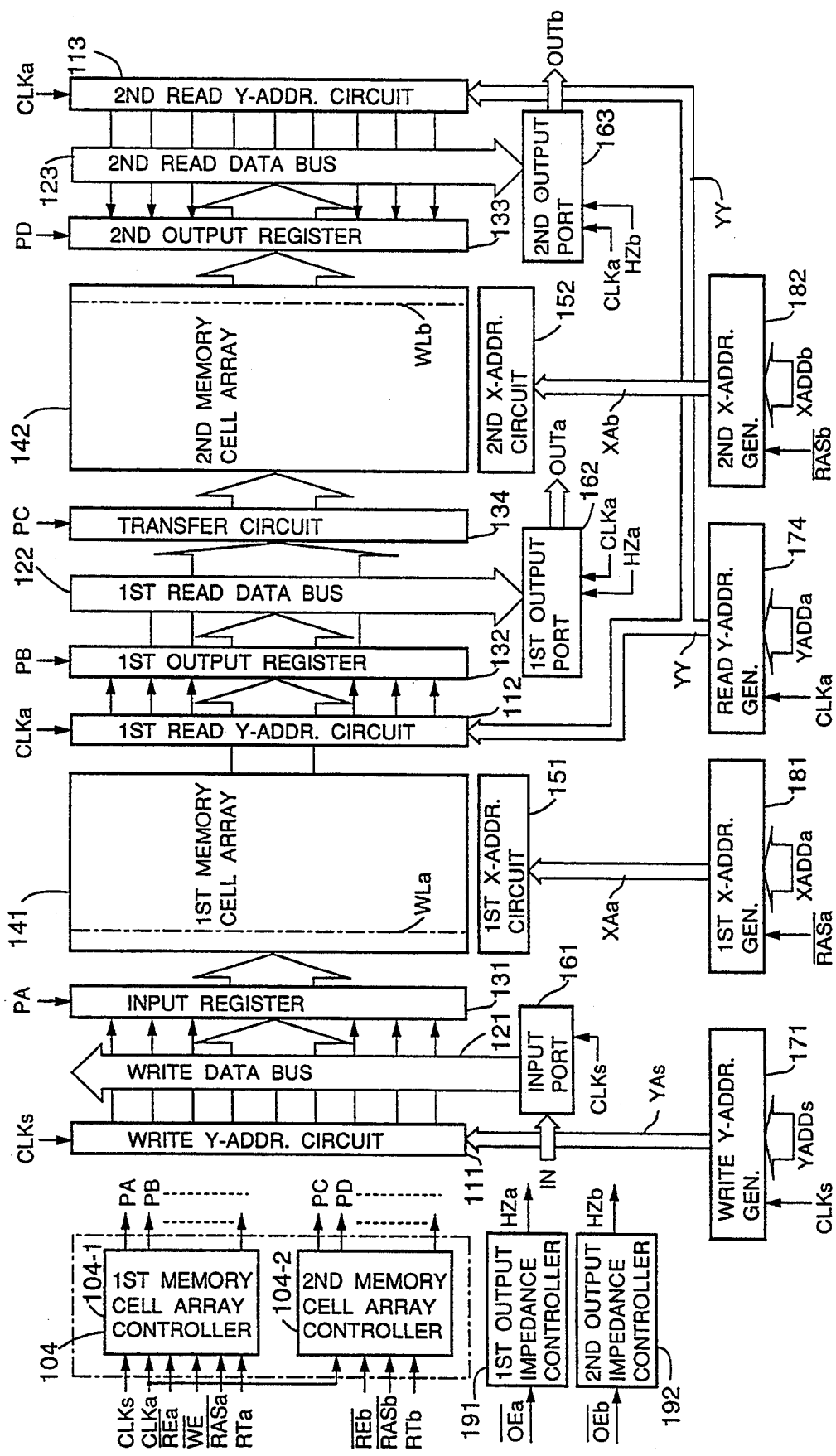
FIG. 20 is a block diagram illustrating a ninth embodiment of the invented multiple serial-access memory.
Figure 21:
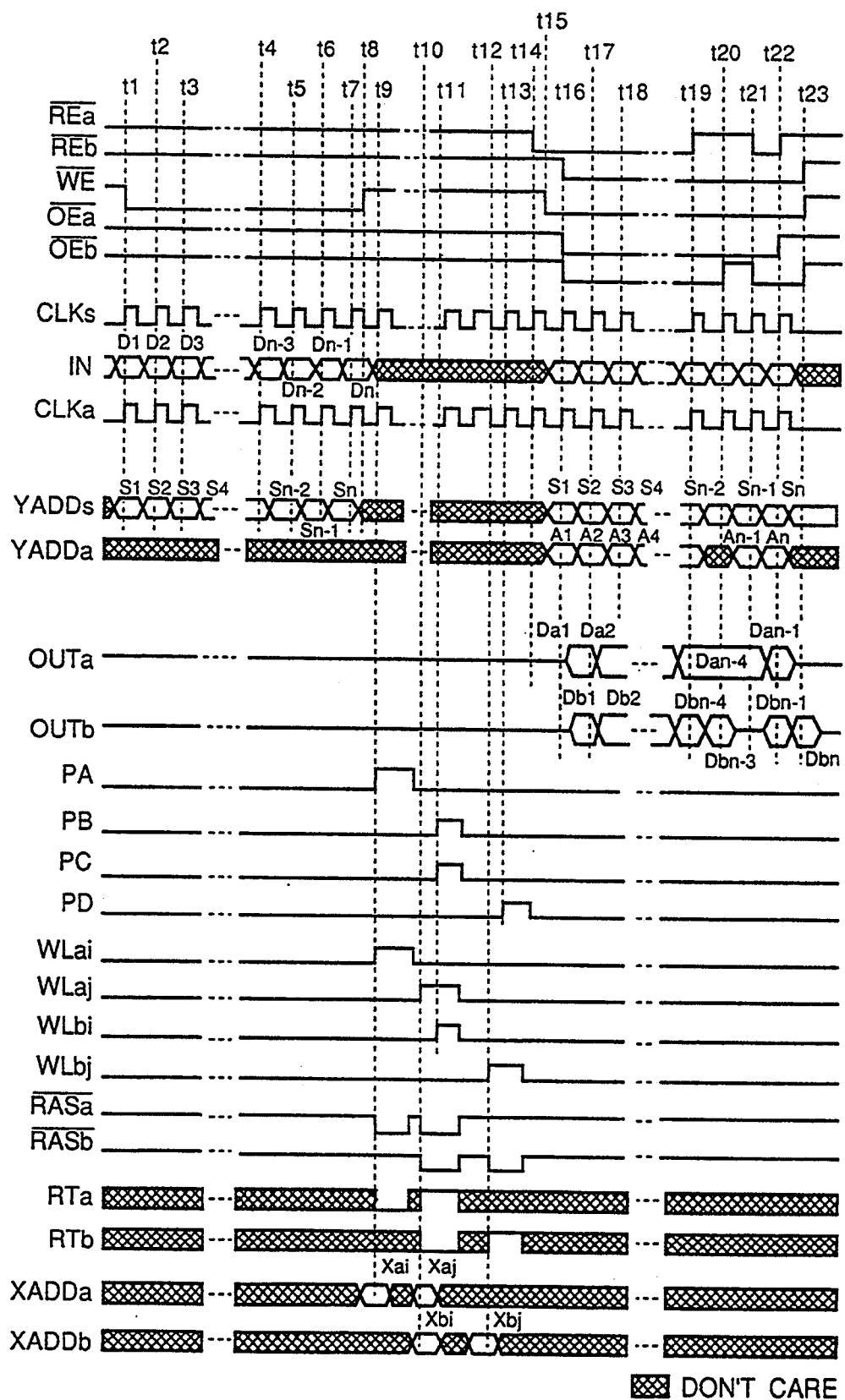
FIG. 21 is a timing diagram illustrating the operation of the ninth embodiment.
Figure 22:
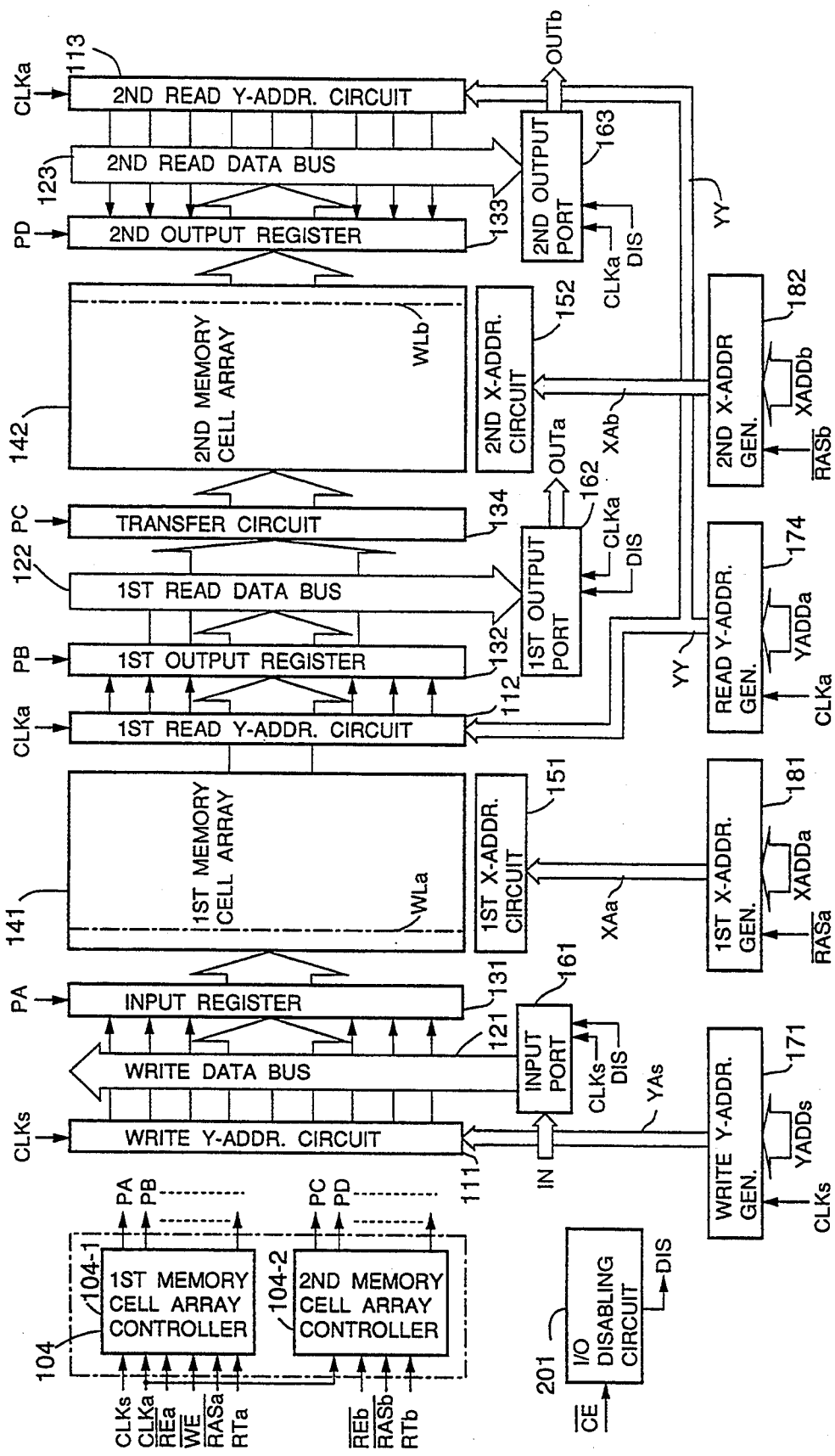
FIG. 22 is a block diagram illustrating a tenth embodiment of the invented multiple serial-access memory.
Figure 23:
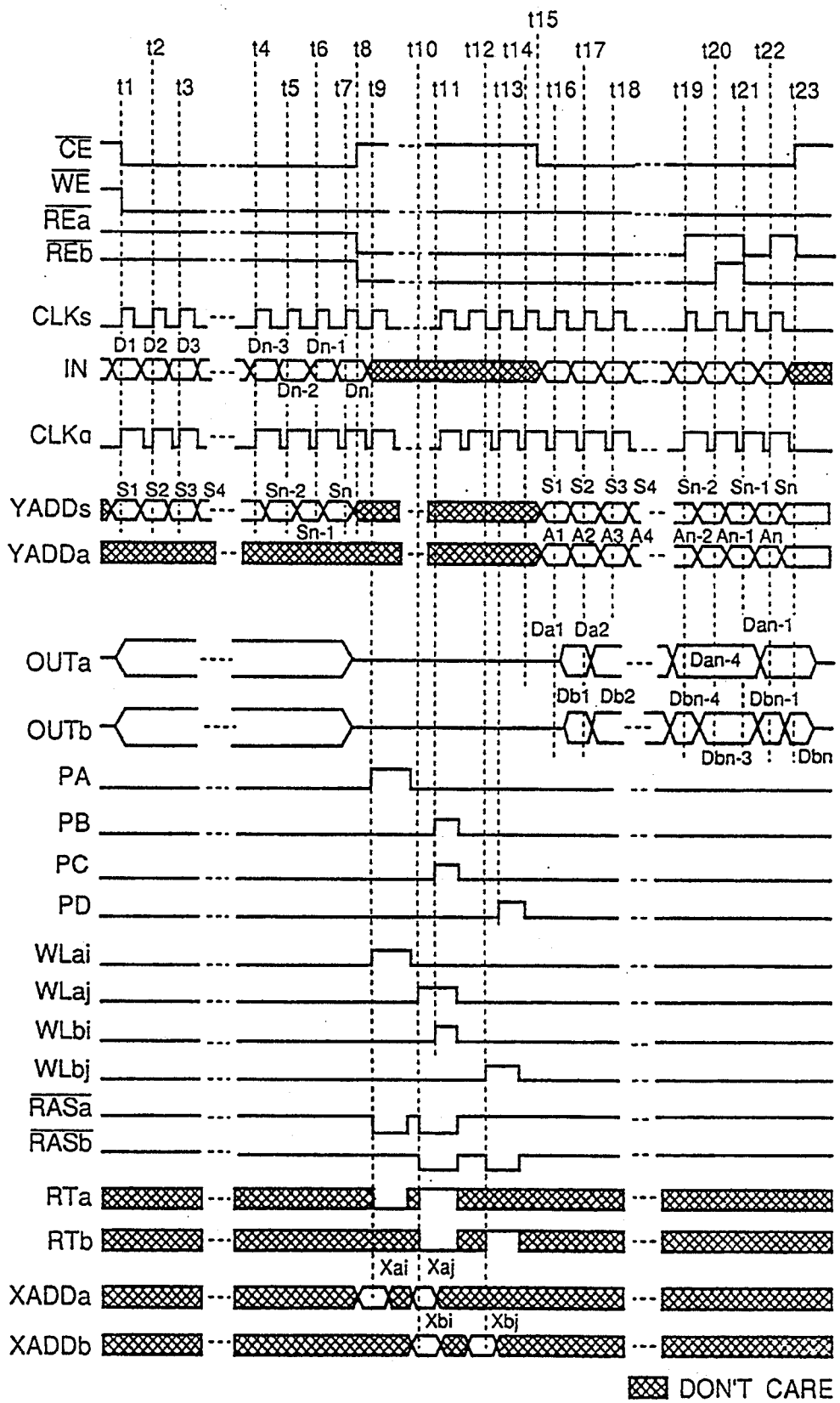
FIG. 23 is a timing diagram illustrating the operation of the tenth embodiment.
Figure 24:
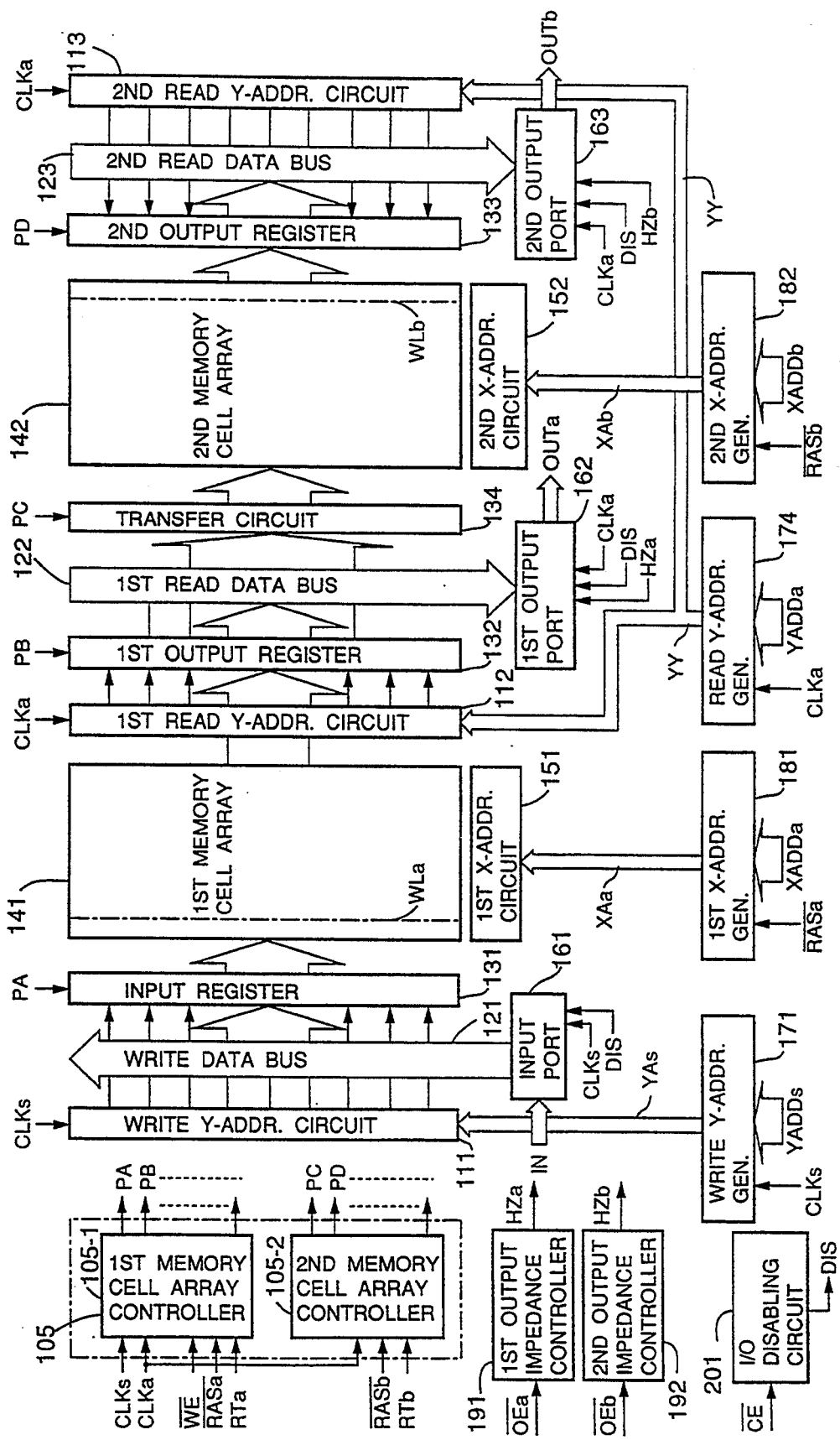
FIG. 24 is a block diagram illustrating a eleventh embodiment of the invented multiple serial-access memory.
Figure 25:
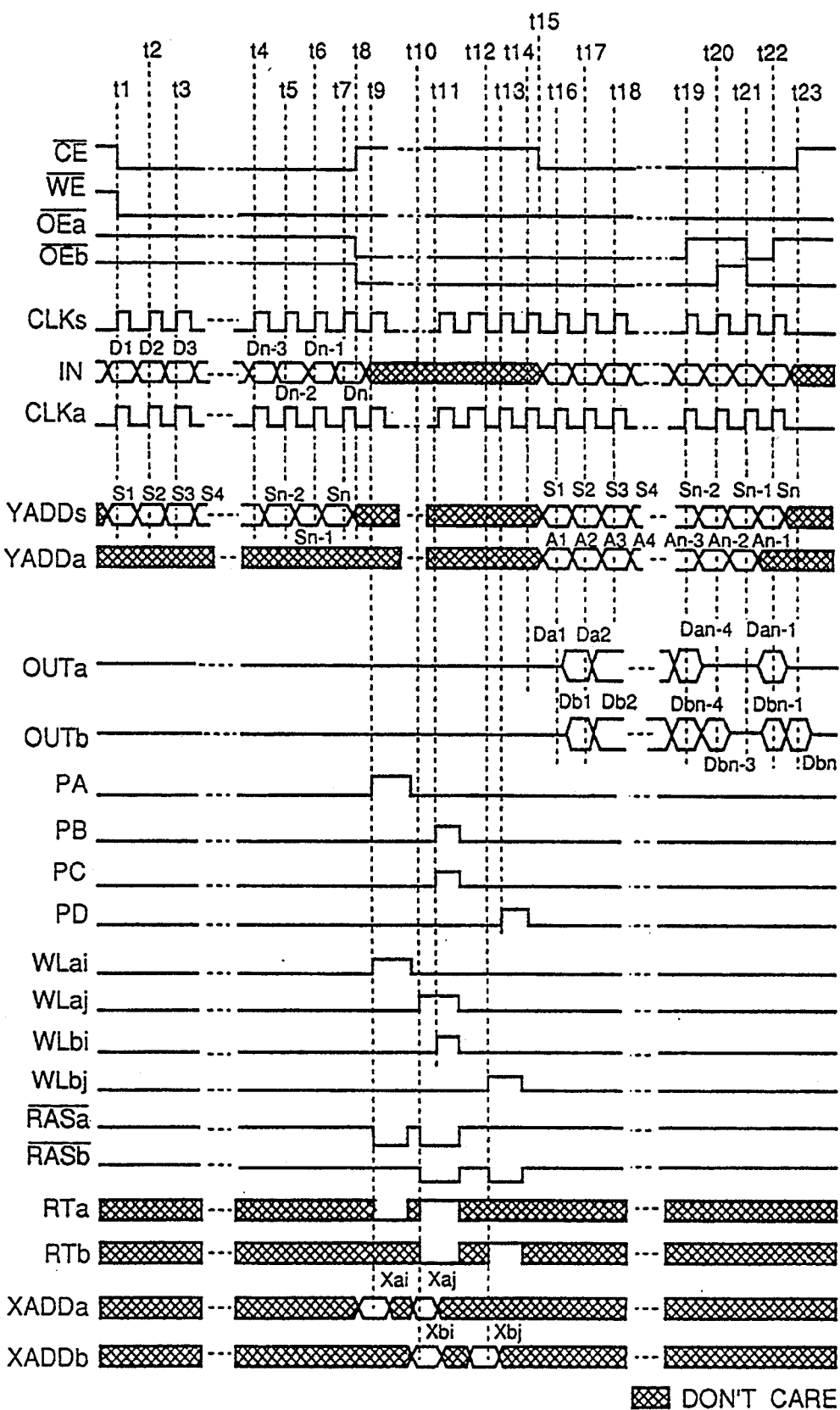
FIG. 25 is a timing diagram illustrating the operation of the eleventh embodiment.
Figure 26:
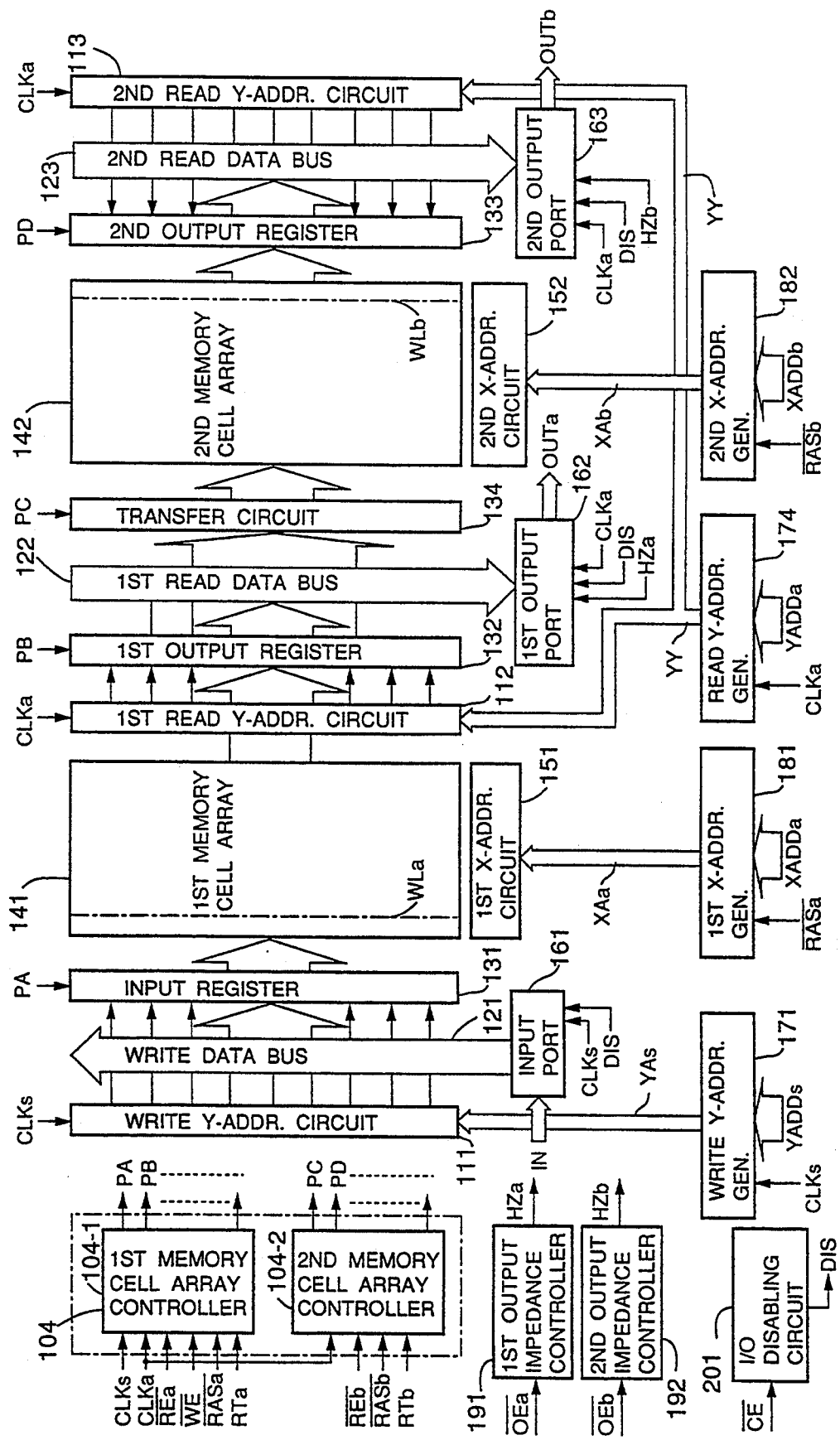
FIG. 26 is a block diagram illustrating a twelfth embodiment of the invented multiple serial-access memory.
Figure 27:
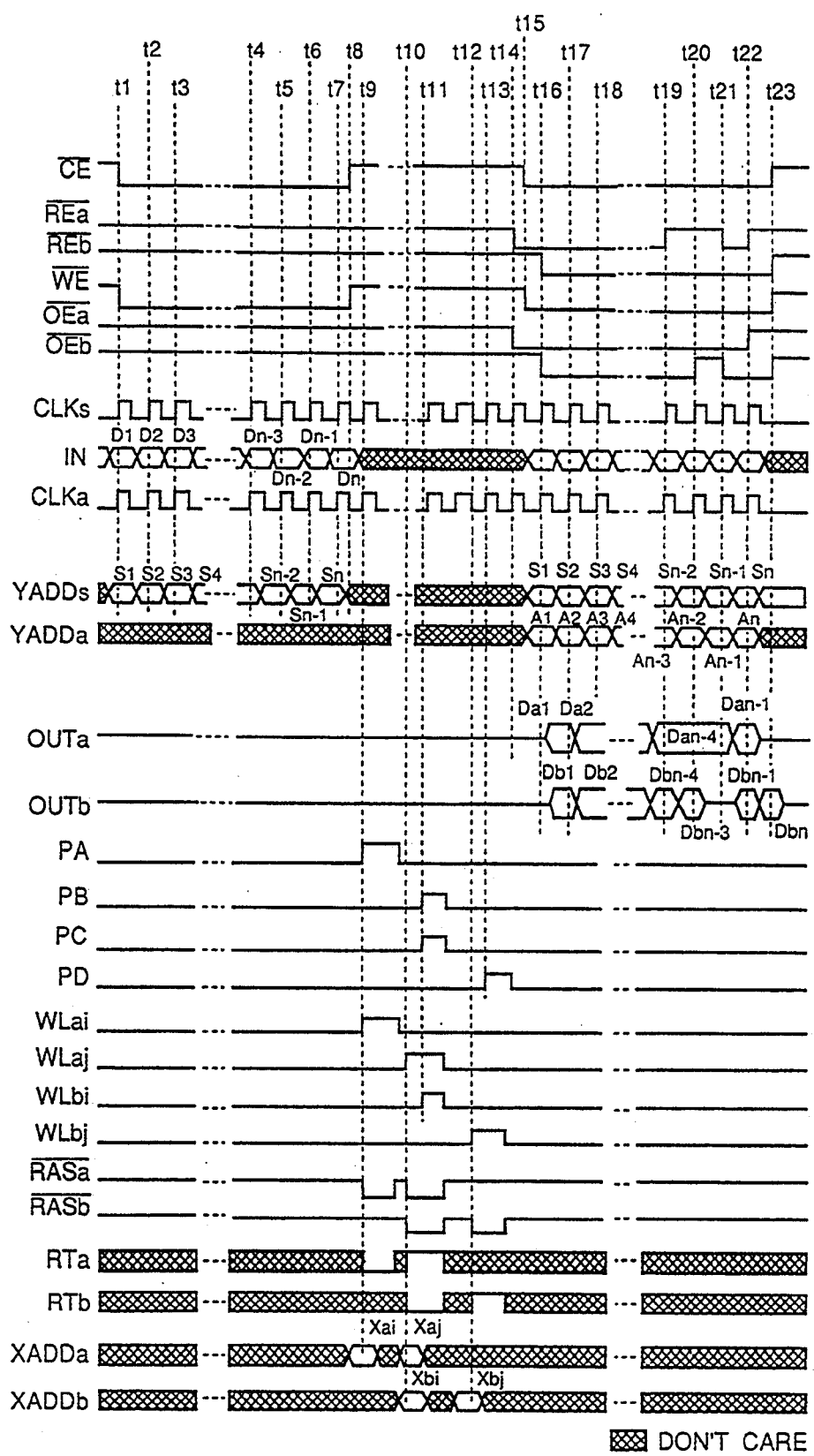
FIG. 27 is a timing diagram illustrating the operation of the twelfth embodiment.

The same modifications that were made to the first and second embodiments to produce the seventh and eighth embodiments can also be made to the third, fourth, fifth, and sixth embodiments. These modifications produce a ninth embodiment, illustrated in FIGS. 20 and 21, a tenth embodiment, illustrated in FIGS. 22 and 23, a eleventh embodiment, illustrated in FIGS. 24 and 25, a twelfth embodiment, illustrated in FIGS. 26 and 28. These embodiments operate like the third, fourth, fifth, and sixth embodiments, respectively, except that a single read clock signal CLKa, a single read Y-address signal YADDa, and a single read Y-address generator 174 serve all output ports and all read Y-addressing circuits.

Next a thirteenth embodiment of the invention will be described with reference to FIGS. 28 and 29. This embodiment is generally similar to the first embodiment, but uses the same clock signal and Y-addresses for all serial input and output. Elements in FIG. 28 that are identical to elements in FIG. 4 have the same reference numerals.

Figure 28:
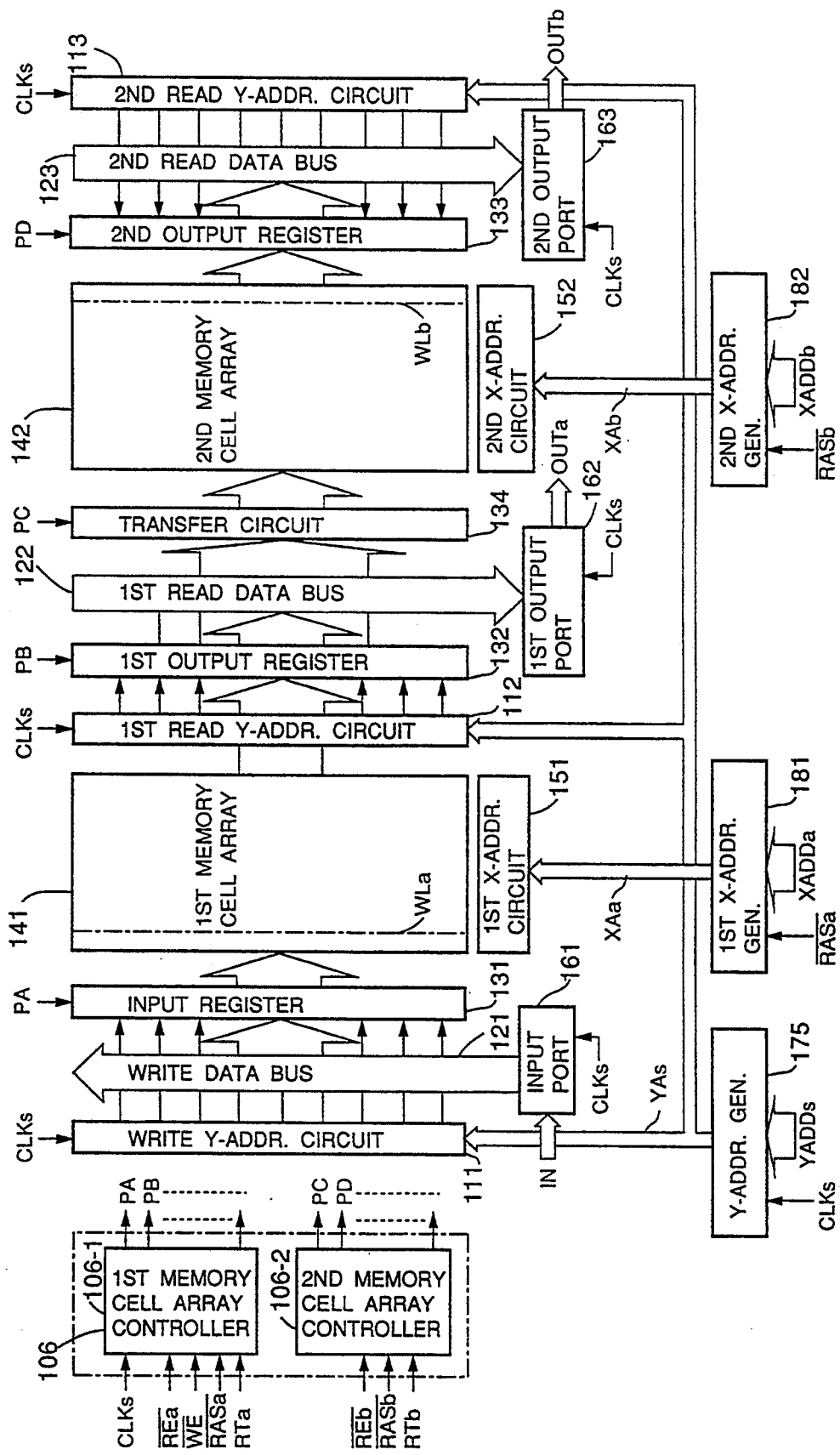
FIG. 28 is a block diagram illustrating an thirteenth embodiment of the invented multiple serial-access memory.

Referring to FIG. 28, this embodiment has a dual control circuit 106 comprising memory cell array controllers 106-1 and 106-2. The input signals to these controllers are the same as in FIG. 4 except that there is no first read clock signal CLKa or second read clock CLKb. The clock signal CLKs is supplied to all the Y-addressing circuits 111, 112, and 113, and all the input and output ports 161, 162, and 163.

In place of the read and write Y-address generators 171, 172, and 173 of the first embodiment, the thirteenth embodiment has a common Y-address generator 175 that latches a write Y-address signal YADDs in synchronization with CLKs, and supplies it as an internal Y-address YAs to the write Y-addressing circuit 111, first read Y-addressing circuit 112, and second read Y-addressing circuit 113.

Figure 29:
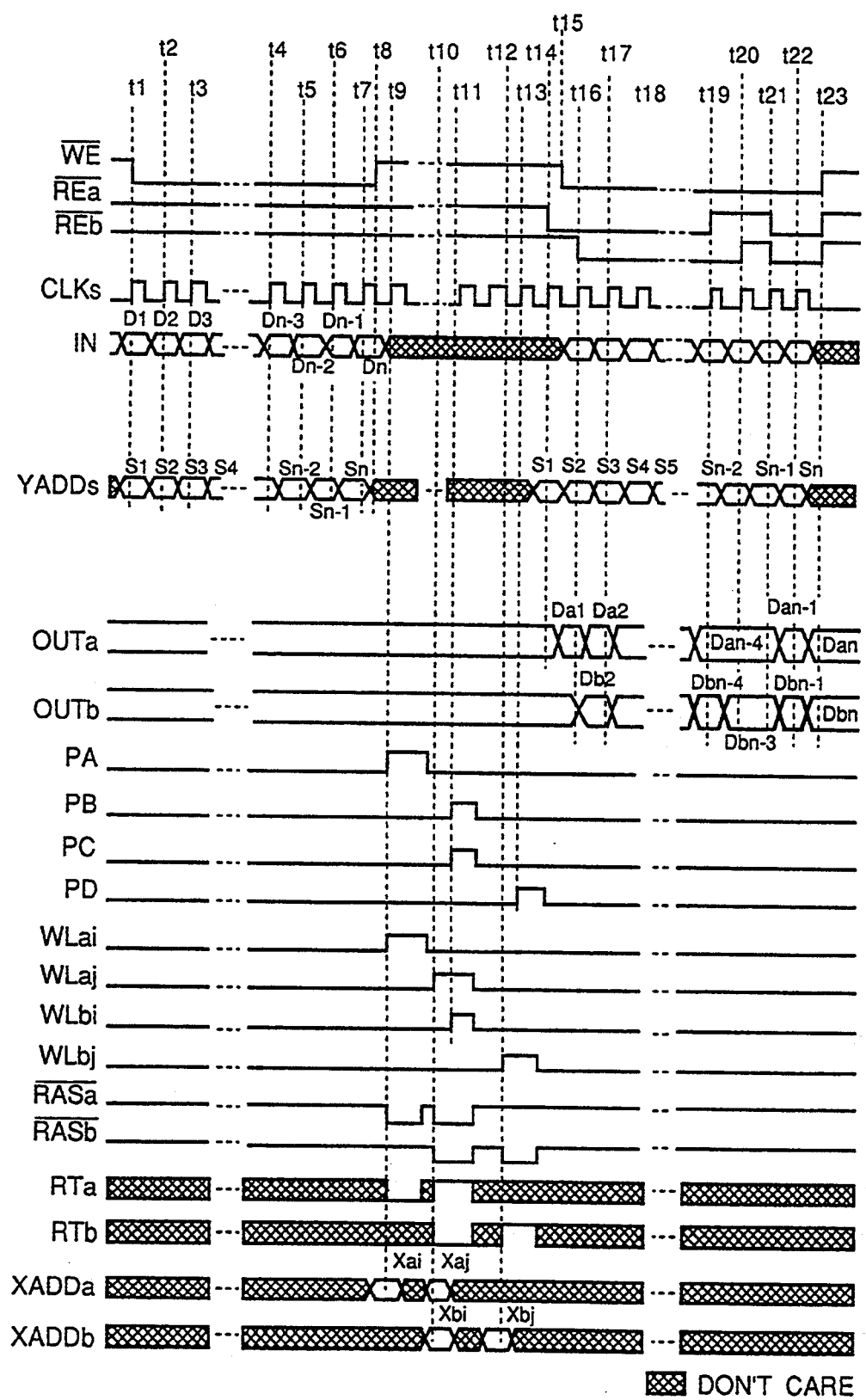
FIG. 29 is a timing diagram illustrating the operation of the thirteenth embodiment.

Referring to FIG. 29, the thirteenth embodiment operates like the first embodiment except that the clock signal CLKs and Y-addresses S1, S2, ..., Sn control both serial input at the IN terminal and serial output at the OUTa and OUTb terminals. Input and output can be started at independent times by the $\overline{WE}$, $\overline{REa}$, and $\overline{REb}$ signals, as illustrated at times t14, t15, and t16. Output of particular data can be extended independently by $\overline{REa}$ and $\overline{REb}$, as illustrated at times t19 to t21.

The thirteenth embodiment is useful in television and facsimile applications, and in other devices such as copy machines that always use the same sequence of Y-addresses for both input and output. Compared with the first and seventh embodiments, the thirteenth embodiment has the advantages of requiring fewer control signals and less chip area.

Next a fourteenth embodiment that combines the features and advantages of the second and thirteenth embodiments will be described with reference to FIGS. 30 and 31. Elements in FIG. 30 that are identical to elements in FIGS. 6 and 28 have the same reference numerals.

Figure 30:
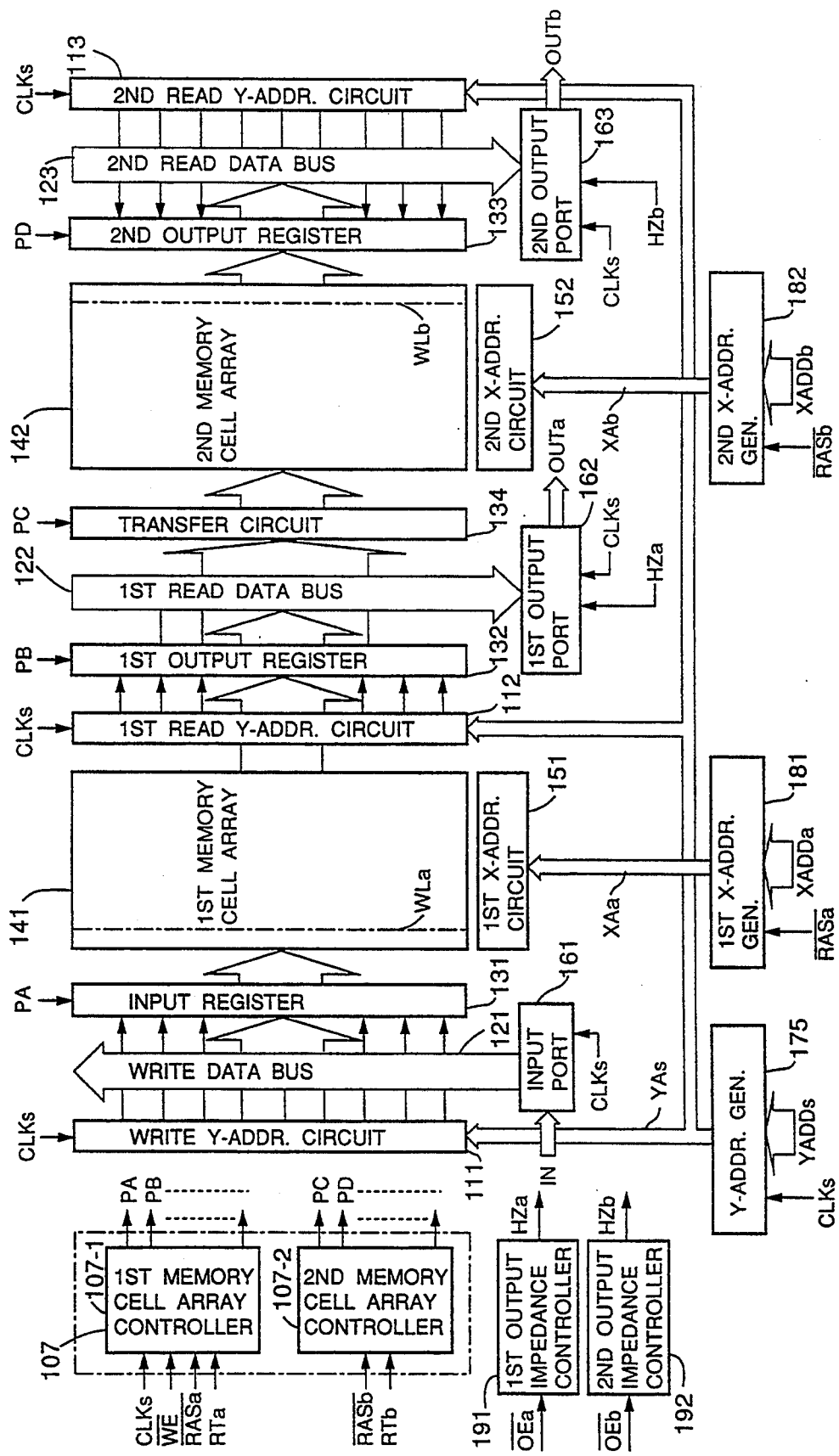
FIG. 30 is a block diagram illustrating an fourteenth embodiment of the invented multiple serial-access memory.

Referring to FIG. 30, this embodiment has a dual control circuit 107 comprising memory cell array controllers 107-1 and 107-2. The input signals to these controllers are the same as in FIG. 6 except that no read clock signal CLKa or CLKb is supplied. A common Y-address generator 175 supplies an internal Y-address YAs to all the Y-addressing circuits 111, 112, and 113 as in FIG. 28.

Figure 31:
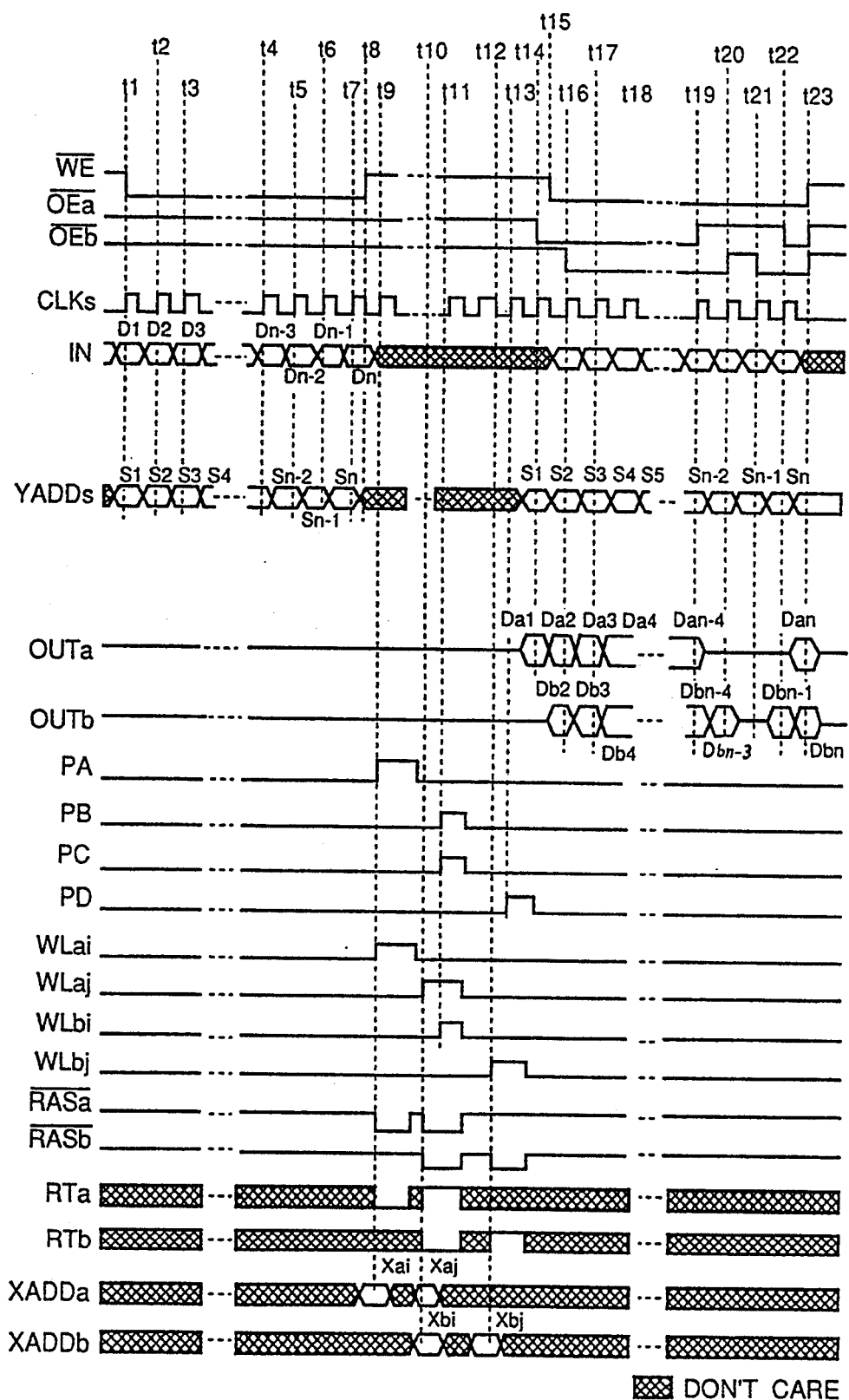
FIG. 31 is a timing diagram illustrating the operation of the fourteenth embodiment.

Referring to FIG. 31, the fourteenth embodiment operates in the same way as the second embodiment but uses the clock signal CLKs and Y-addresses S1, S2, ..., Sn for all serial input and output. Input and output can be started and stopped independently by the $\overline{WE}$, $\overline{OEa}$, and $\overline{OEb}$ signals, as illustrated at times t14 to t22.

Figure 32:
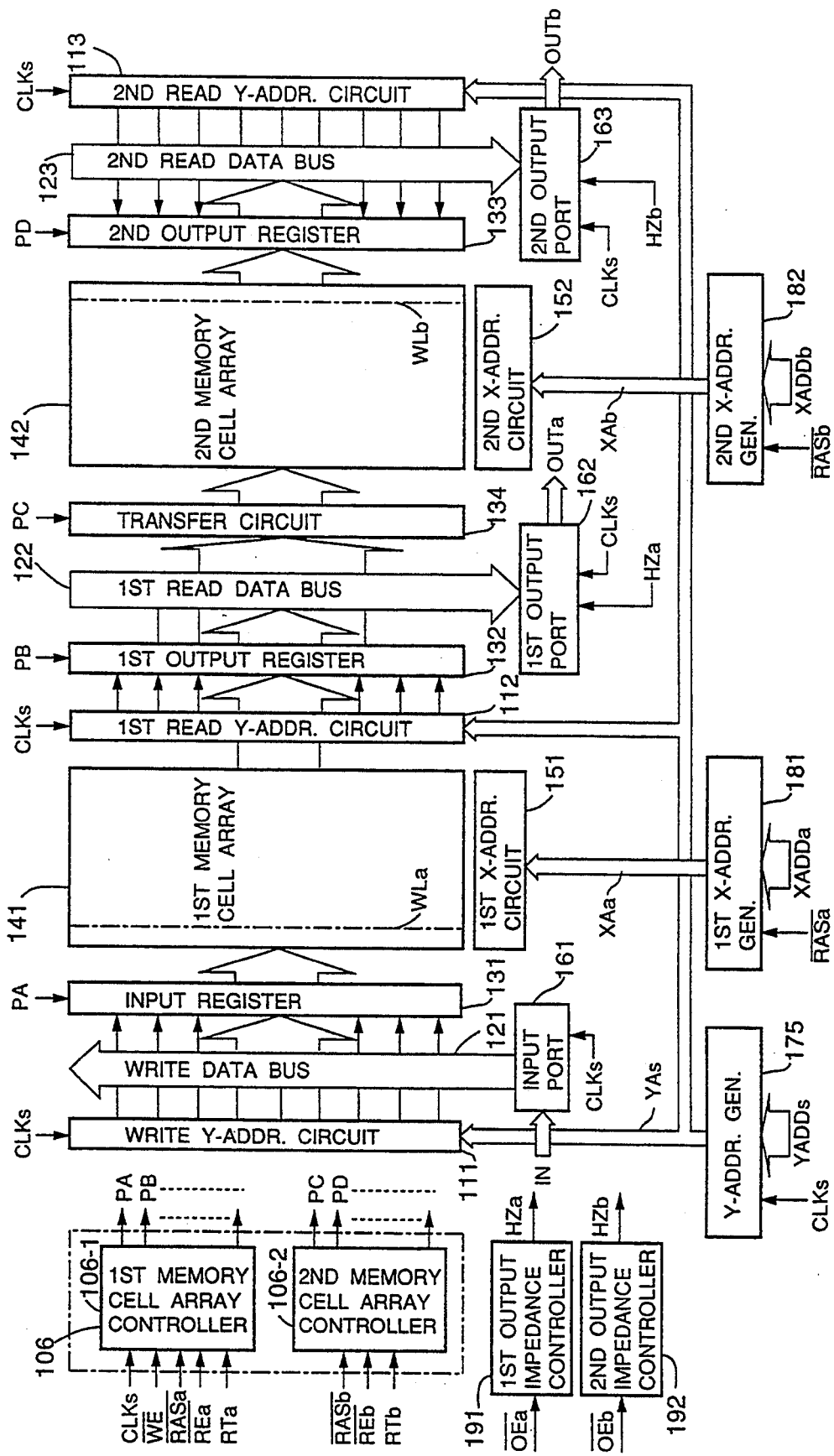
FIG. 32 is a block diagram illustrating an fifteenth embodiment of the invented multiple serial-access memory.
Figure 33:
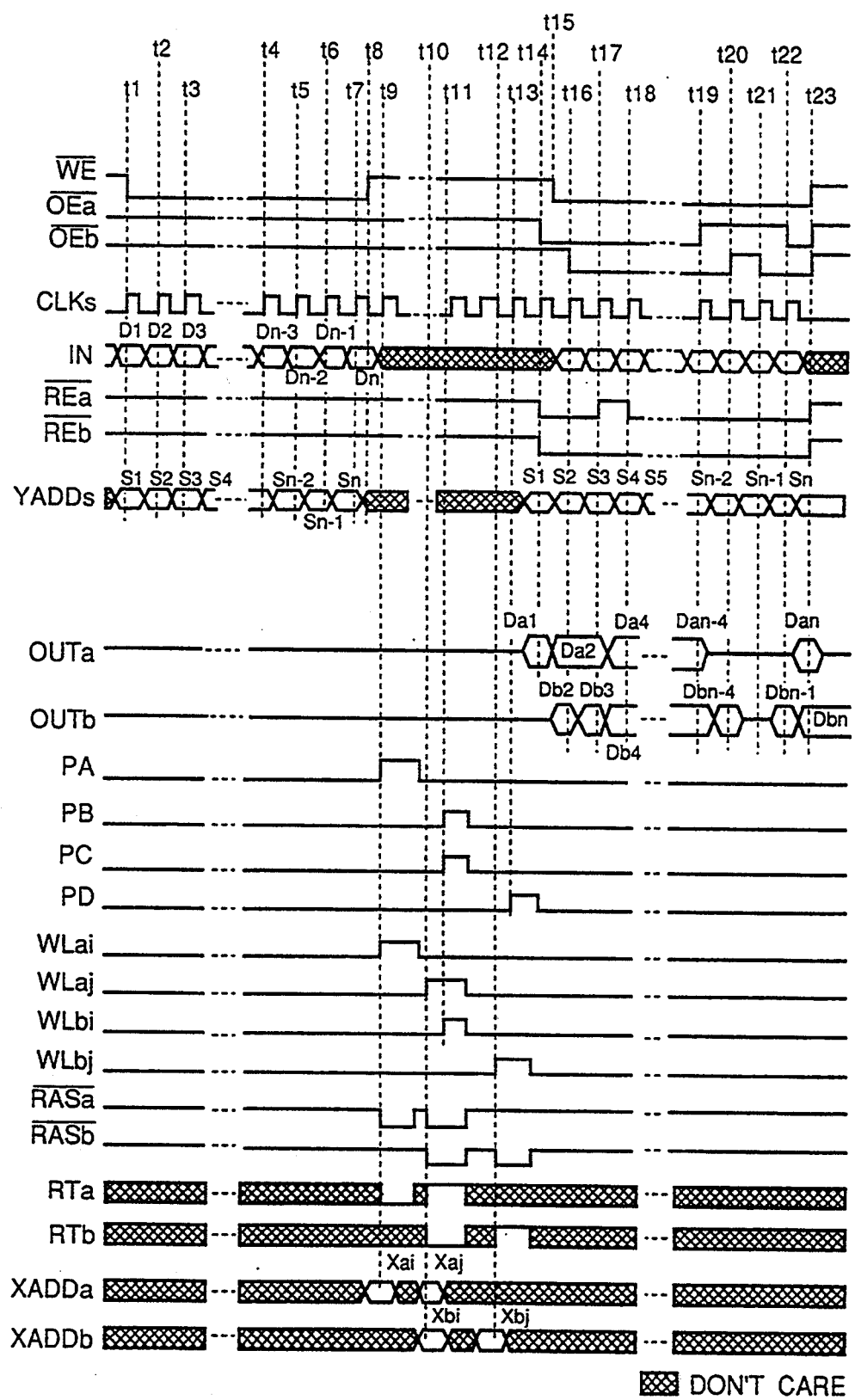
FIG. 33 is a timing diagram illustrating the operation of the fifteenth embodiment.
Figure 34:
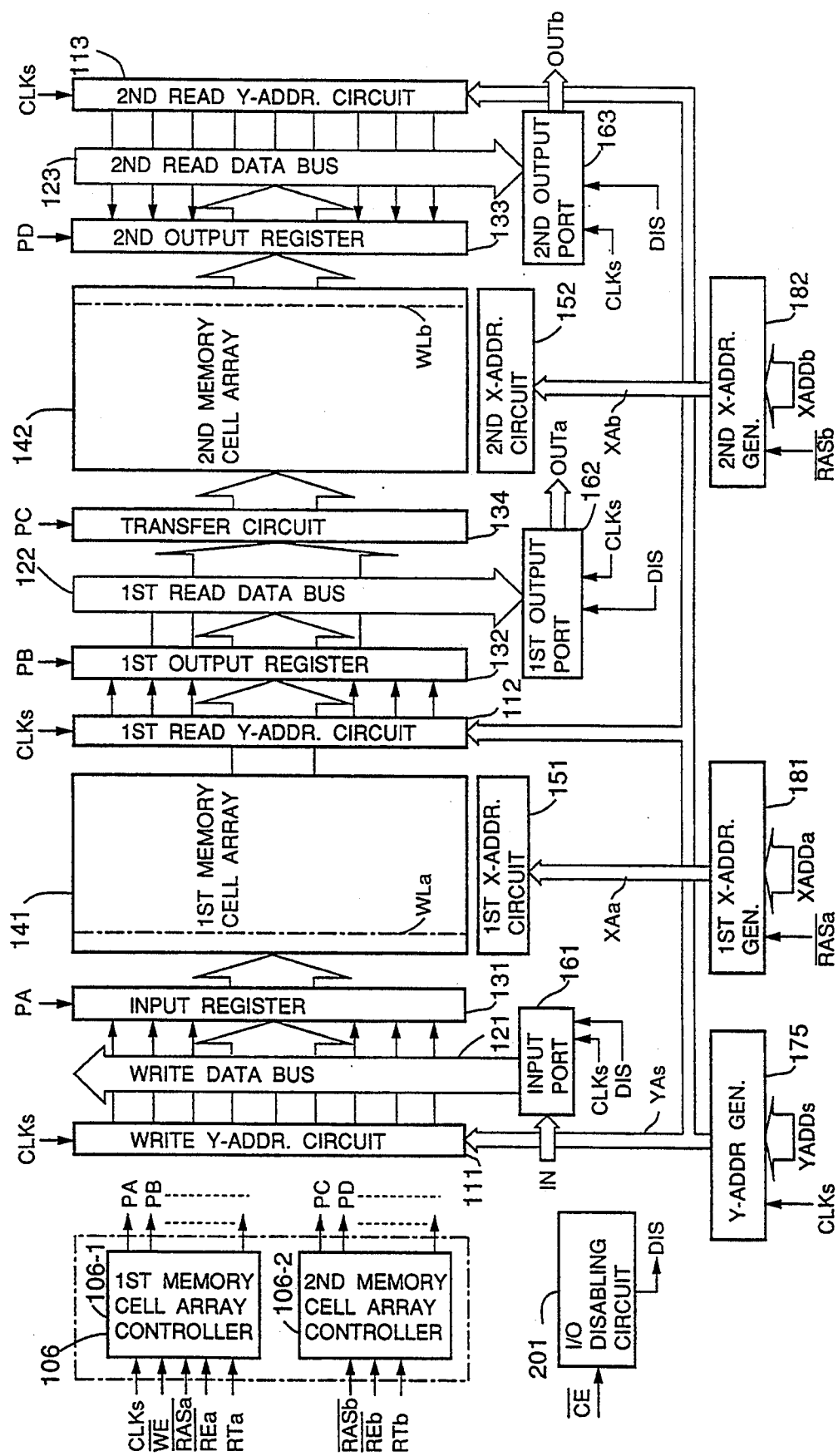
FIG. 34 is a block diagram illustrating an sixteenth embodiment of the invented multiple serial-access memory.
Figure 35:
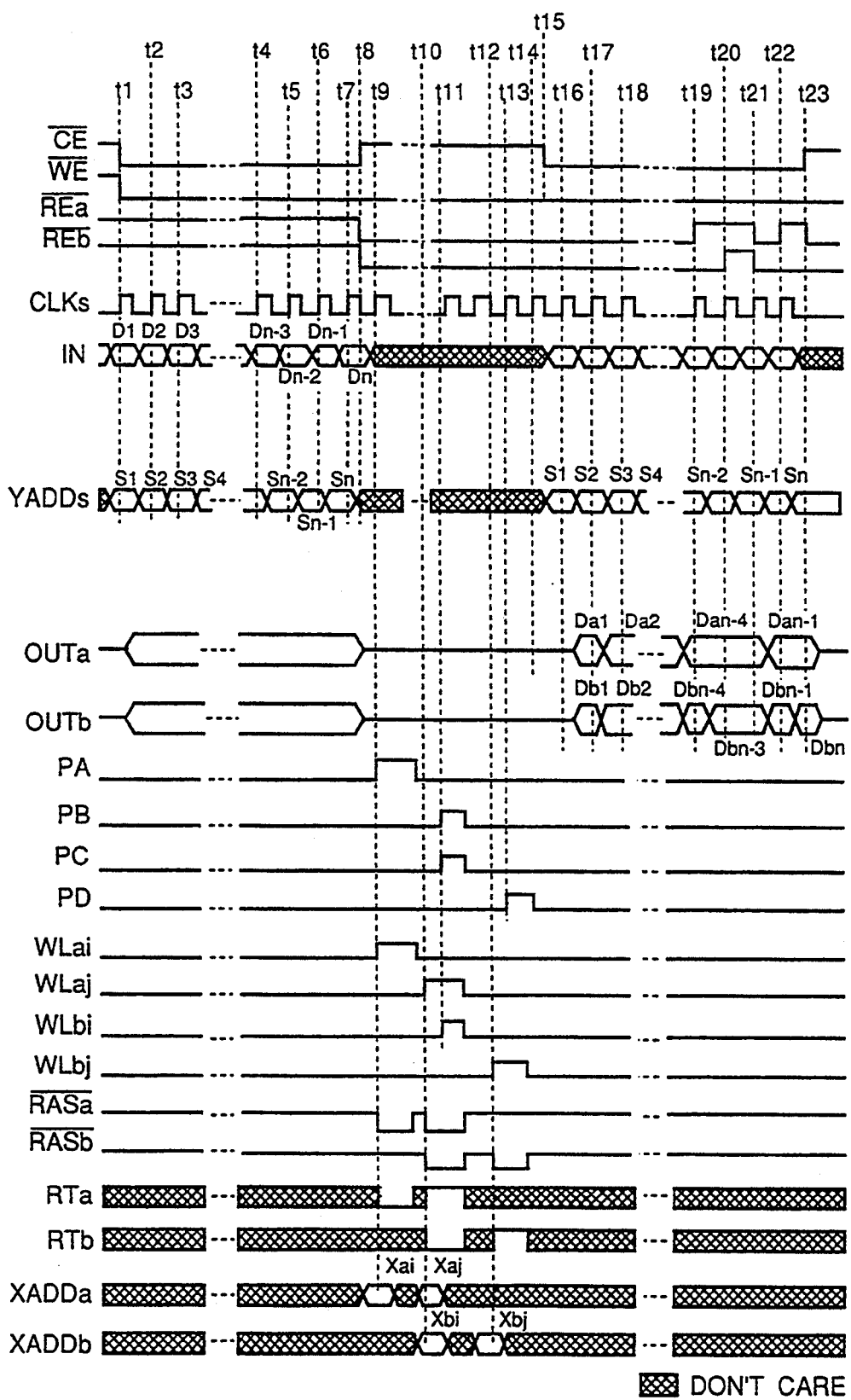
FIG. 35 is a timing diagram illustrating the operation of the sixteenth embodiment.
Figure 36:
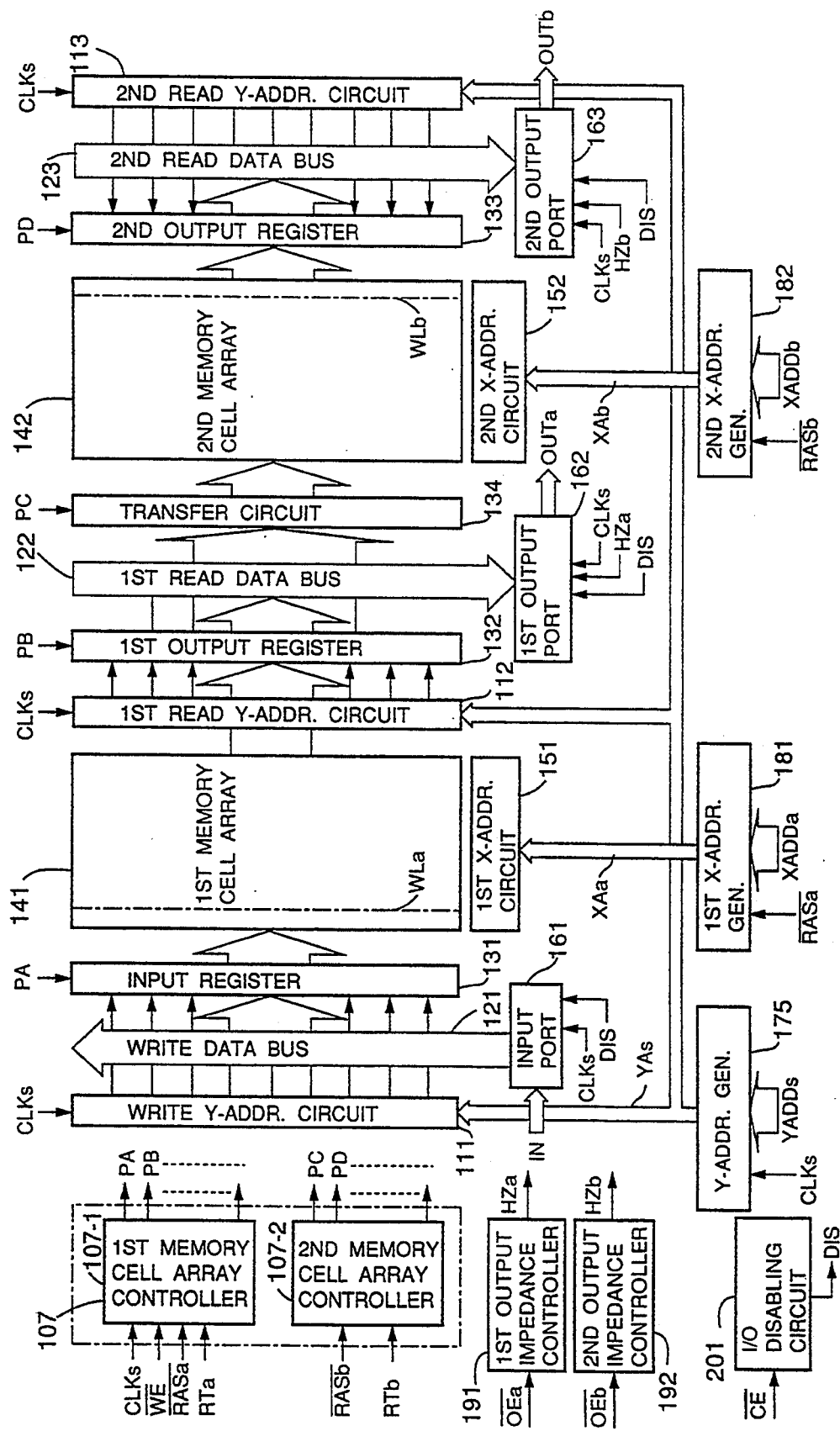
FIG. 36 is a block diagram illustrating an seventeenth embodiment of the invented multiple serial-access memory.
Figure 37:
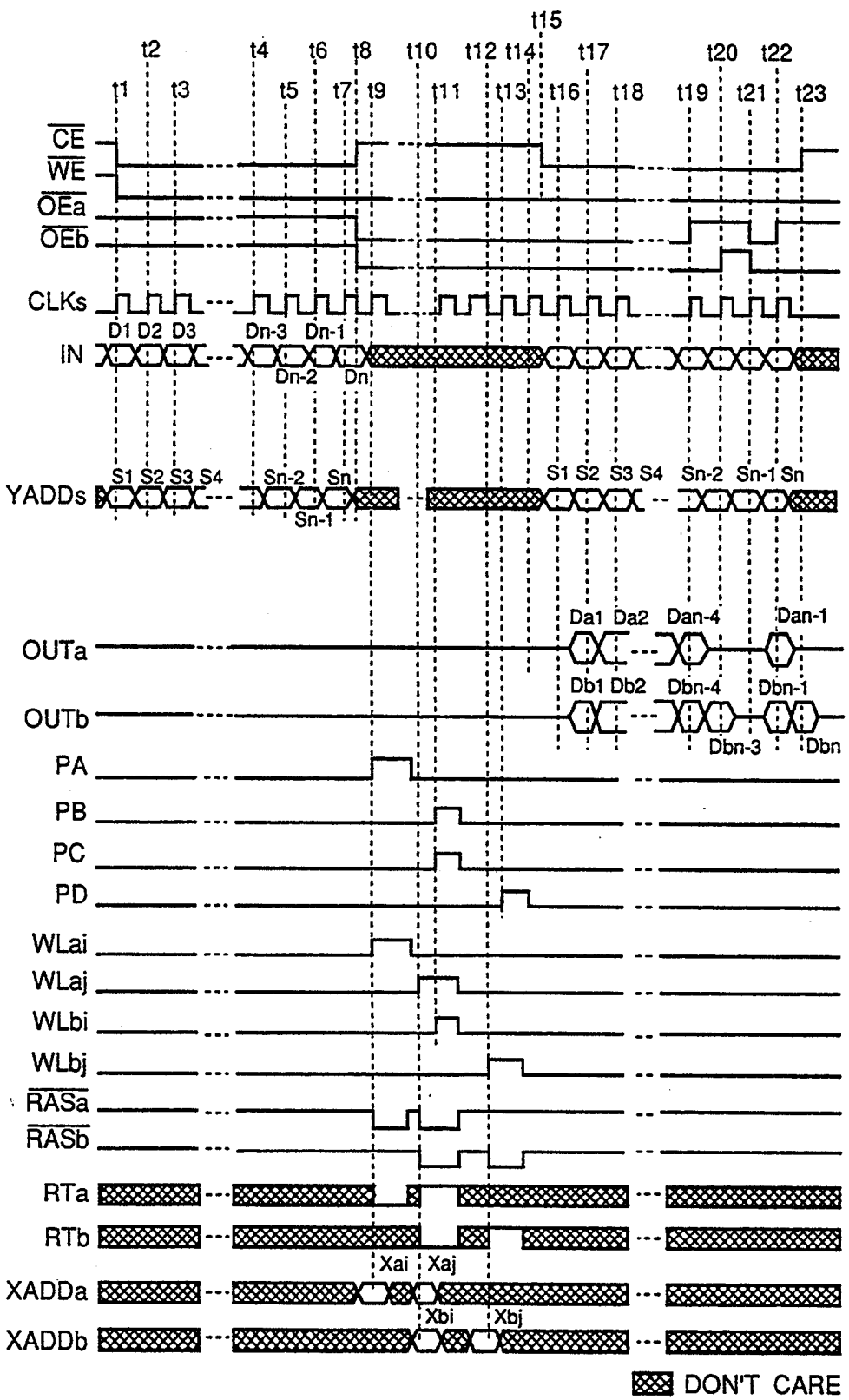
FIG. 37 is a timing diagram illustrating the operation of the seventeenth embodiment.
Figure 38:
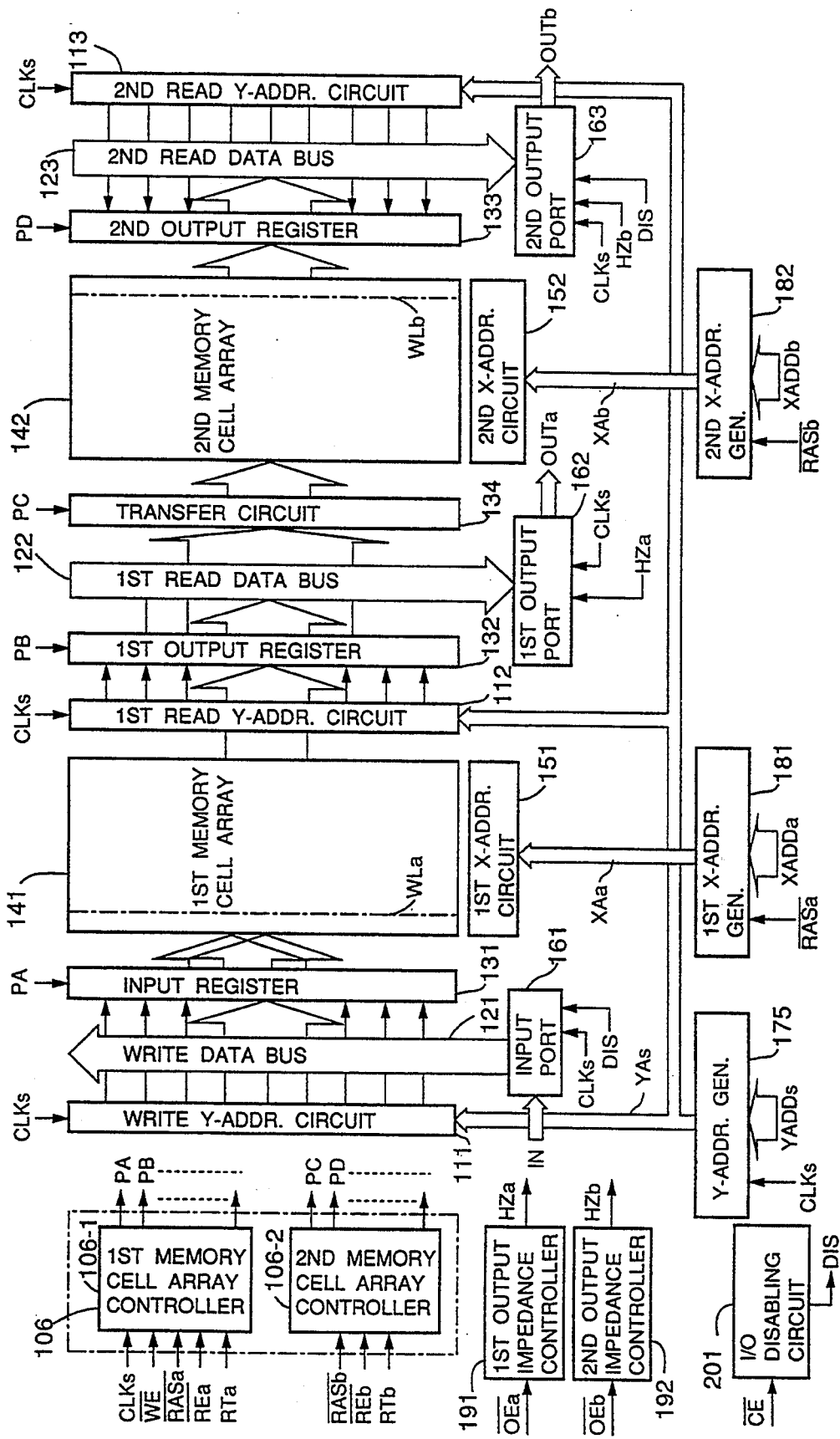
FIG. 38 is a block diagram illustrating an eighteenth embodiment of the invented multiple serial-access memory.
Figure 39:
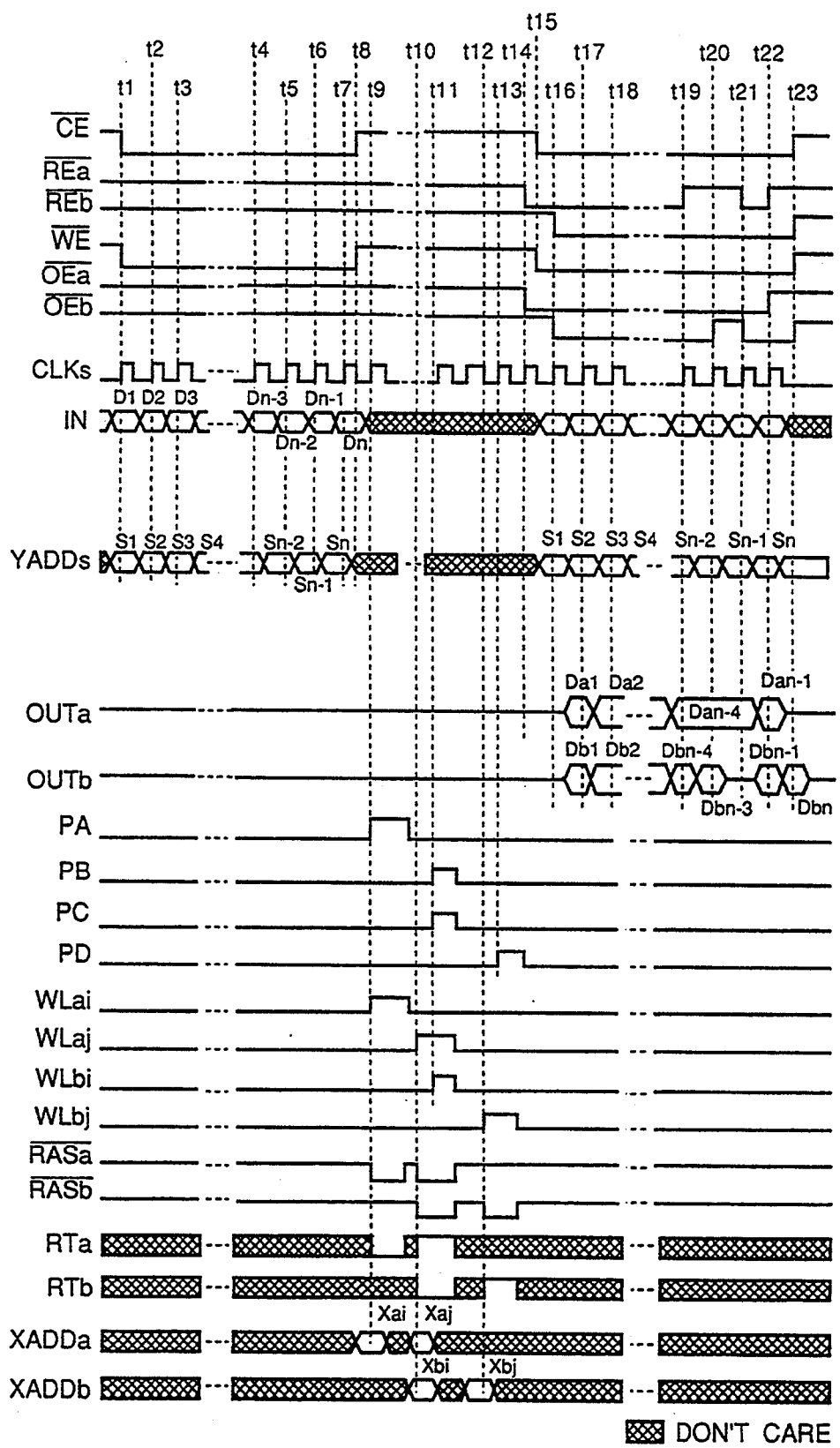
FIG. 39 is a timing diagram illustrating the operation of the eighteenth embodiment.

The same modifications that were made to the first and second embodiments to produce the thirteenth and fourteenth embodiments can also be made to the third, fourth, fifth, and sixth embodiments. These modifications produce a fifteenth embodiment, illustrated in FIGS. 32 and 33, a sixteenth embodiment, illustrated in FIGS. 34 and 35, a seventeenth embodiment, illustrated in FIGS. 36 and 37, and an eighteenth embodiment, illustrated in FIGS. 38 and 39. These embodiments operate like the third, fourth, fifth, and sixth embodiments, respectively, except that a single clock signal CLKs and a single Y-address signal YADDs serve all input and output ports and all Y-addressing circuits.

Next a nineteenth embodiment of the invention will be described with reference to FIGS. 40 and 41. This embodiment is generally similar to the first embodiment, but uses the same clock signal, same X-addresses, and same Y-addresses for all serial input and output. Elements in FIG. 40 that are identical to elements in FIG. 4 have the same reference numerals.

Figure 40:
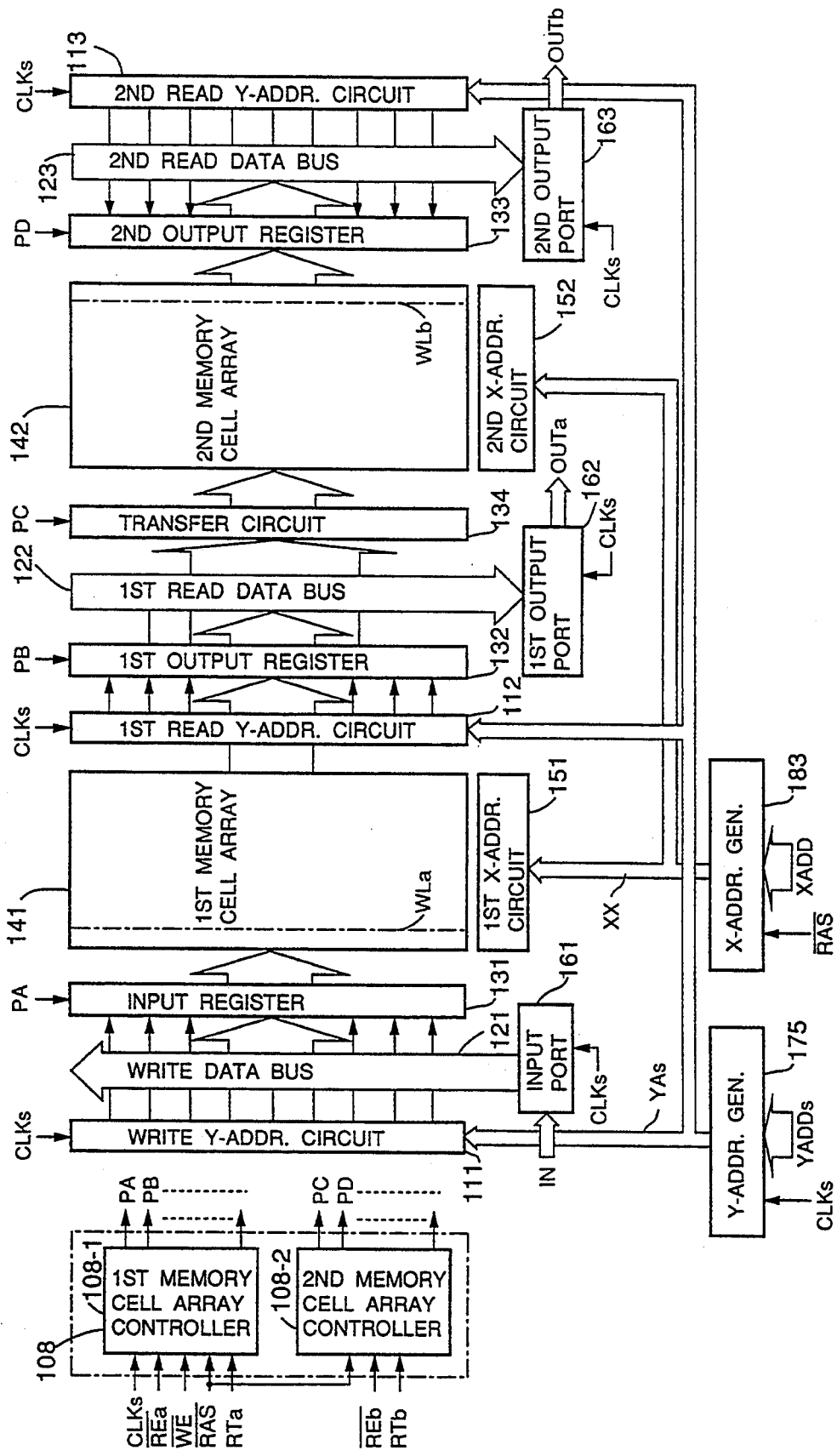
FIG. 40 is a block diagram illustrating an nineteenth embodiment of the invented multiple serial-access memory.

Referring to FIG. 40, this embodiment has a dual control circuit 108 comprising memory cell array controllers 108-1 and 108-2. The input signals to these controllers are the same as in FIG. 4 except that a single clock signal CLKs is supplied to the memory cell array controller 108-1 and a single row address strobe signal $\overline{RAS}$ is supplied to both memory cell array controllers 108-1 and 108-2. There are no CLKa, CLKb, $\overline{RASa}$, and $\overline{RASb}$ signals. CLKs is also supplied to all the Y-addressing circuits 111, 112, and 113 and all the input and output ports 161, 162, and 163.

In place of the read and write Y-address generators 171, 172, and 173 of the first embodiment, the nineteenth embodiment has the same common Y-address generator 175 as in the thirteenth to eighteenth embodiments. In place of the first and second X-address generators 181 and 182 of the first embodiment, the nineteenth embodiment has a common X-address generator 183 that latches an X-address XADD signal in synchronization with $\overline{RAS}$ and generates an internal X-address XX. The address XX is supplied to both of the X-addressing circuits 151 and 152.

Figure 41:
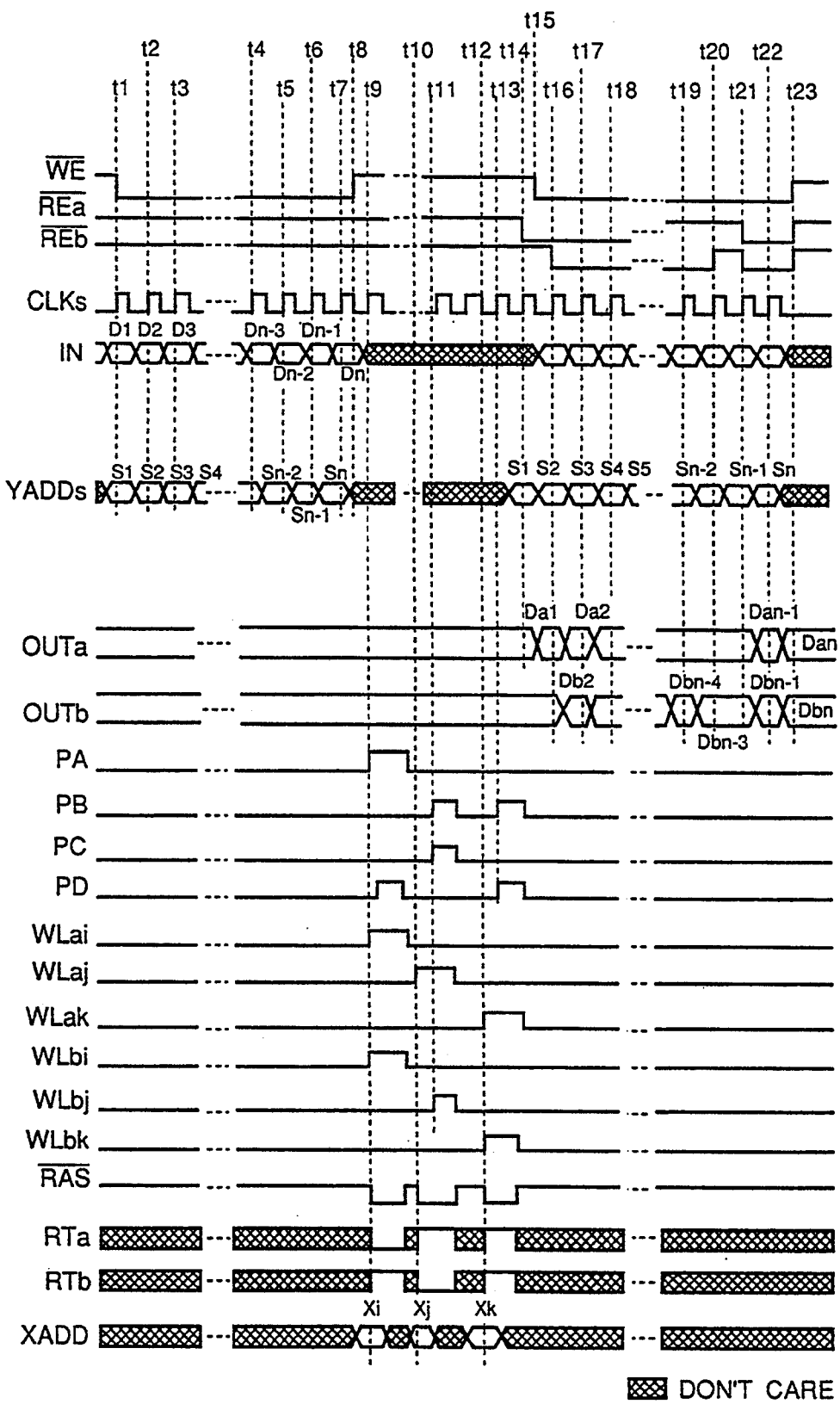
FIG. 41 is a timing diagram illustrating the operation of the nineteenth embodiment.

Referring to FIG. 41, input of serial data from the input terminal IN to the input register 131 in the nineteenth embodiment takes place in the same way as in the first embodiment, as illustrated at times t1 to t8. At time t9 the $\overline{RAS}$ and RTa signals are driven low while RTb is driven high. The common X-address generator 183 latches an X-address X1 and sends it as an internal address to the first X-addressing circuit 151, which activates word line WLai in the first memory cell array 141, so the input data are transferred to the memory cells coupled to this word line. The second X-addressing circuit 152 receives the same internal X-address and activates a word line WLbi in the second memory cell array 142, and data are transferred from the coupled memory cells to the second output register 133.

At time t10 RTa is driven high, RTb is driven low, and $\overline{RAS}$ is driven low again. The common X-address generator 183 latches another X-address Xj and sends it as an internal address to the first and second X-addressing circuits 151 and 152, which select corresponding word lines WLaj and WLbj in the first memory cell array 141 and second memory cell array 142. At time t11, data are transferred from the memory cells coupled to word line WLaj in the first memory cell array 141 to the memory cells coupled to word line WLbj in the second memory cell array 142, and also the first output register 132.

At time t12, RTa and RTb are both driven high and $\overline{RAS}$ is driven low yet again. The common X-address generator 183 latches a third X-addresses Xk and sends it as an internal X-address to the first and second X-addressing circuits 151 and 152, which select corresponding word lines WLak and WLbk in the first and second memory cell arrays 141 and 142. At time t13, the data from the memory cells coupled to these word lines are transferred to the first and second output registers 132 and 133, replacing the data that were latched in those registers at times t9 to t11.

At times t14 to t23, data are output from the first and second output registers 132 and 133 to the output terminals OUTa and OUTb, respectively, while new data are input from the input terminal IN to the input register 131. The same clock signal CLKs and Y-addresses S1, S2, ..., Sn are used for both input and output, but input and output can be started at independent times by the $\overline{WE}$, $\overline{REa}$, and $\overline{REb}$ signals, as illustrated at times t14, t15, and t16, and output of particular data can be extended independently by $\overline{REa}$ and $\overline{REb}$, as illustrated at times t19 to t21.

Since it has only a single row address strobe signal, the nineteenth embodiment does no allow data to be transferred into and out of the two memory cell arrays completely independently. This leads to certain restrictions: for example, data cannot be transferred between memory cells having different X-addresses as conveniently as in the previous embodiments. When these restrictions are acceptable, however, the nineteenth embodiment saves considerable chip area by consolidating all the address generators into a common Y-address generator 175 and a common X-address generator 183.

Next a twentieth embodiment that combines the features and advantages of the second and nineteenth embodiments will be described with reference to FIGS. 42 and 43. Elements in FIG. 42 that are identical to elements in FIGS. 6 and 40 have the same reference numerals.

Figure 42:
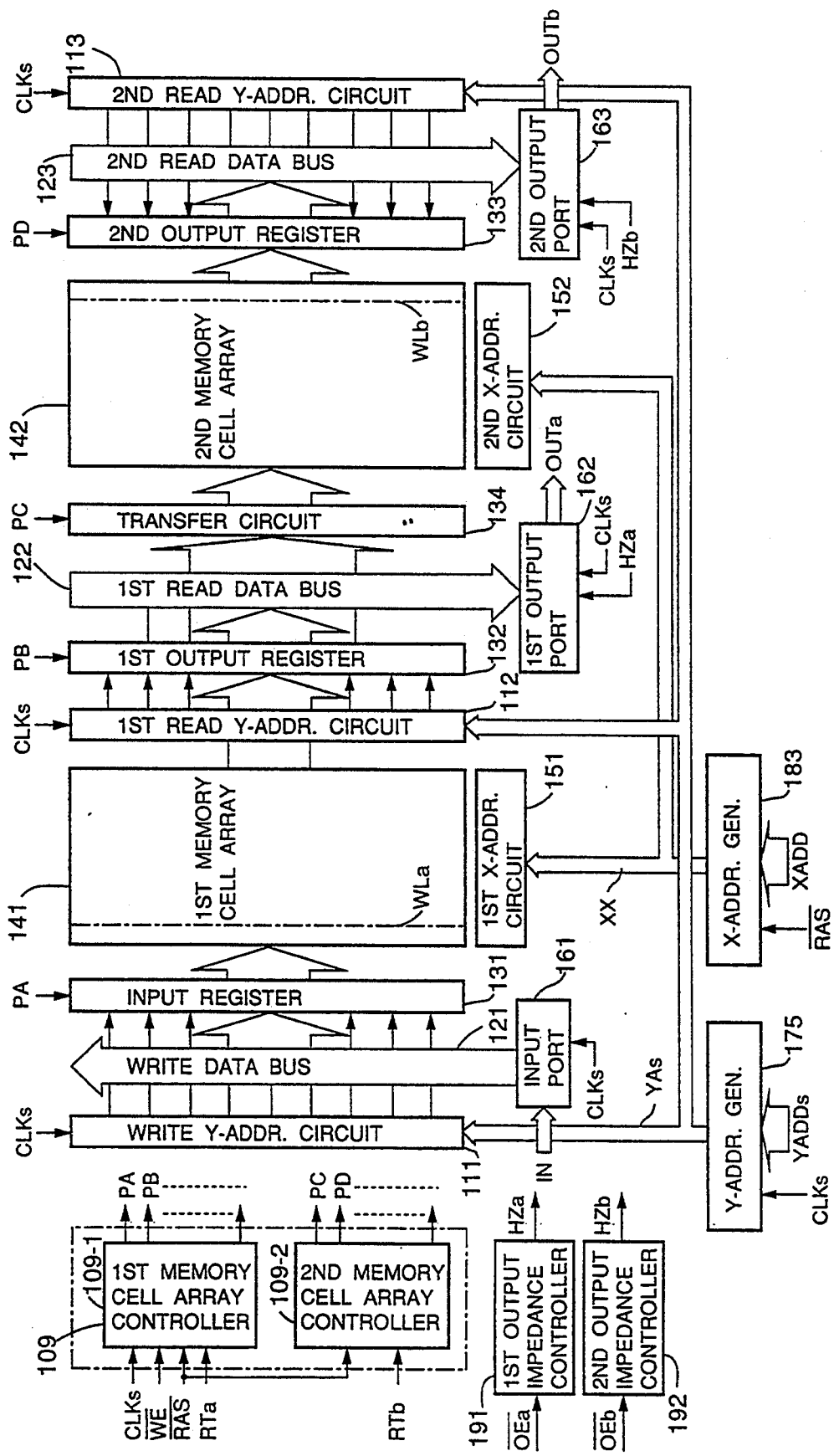
FIG. 42 is a block diagram illustrating an twentieth embodiment of the invented multiple serial-access memory.

Referring to FIG. 42, this embodiment has a dual control circuit 109 comprising memory cell array controllers 109-1 and 109-2. The input signals to these controllers are the same as in FIG. 40 except that no read enable signals are supplied.

Figure 43:
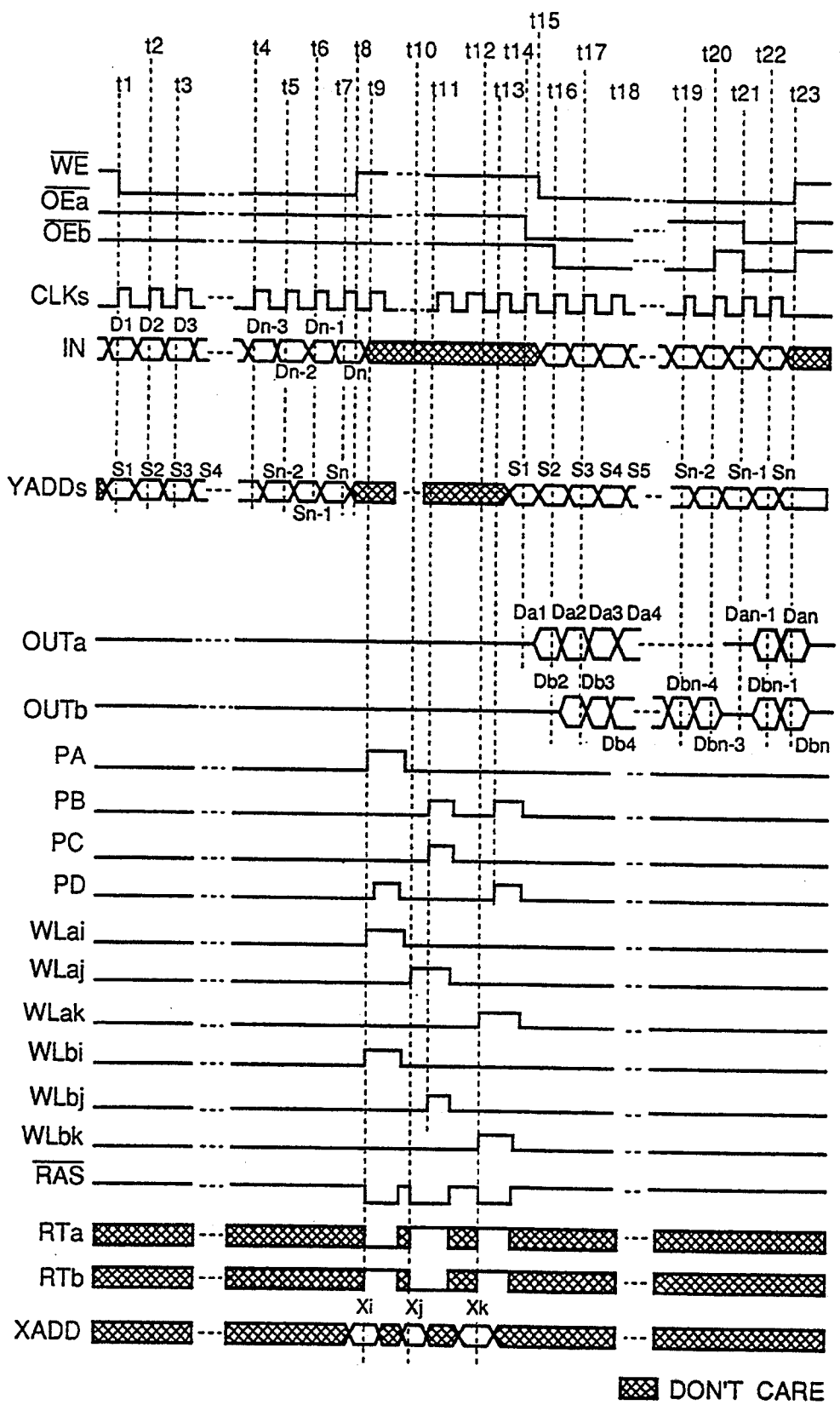
FIG. 43 is a timing diagram illustrating the operation of the twentieth embodiment.

Referring to FIG. 43, the twentieth embodiment operates as already described in relation to the second and nineteenth embodiments, with input and output controlled by the $\overline{WE}$, $\overline{OEa}$, and $\overline{OEb}$ signals, using the same clock CLKs, X-address signal XADD, and Y-address signal YADDs for all.

Figure 44:
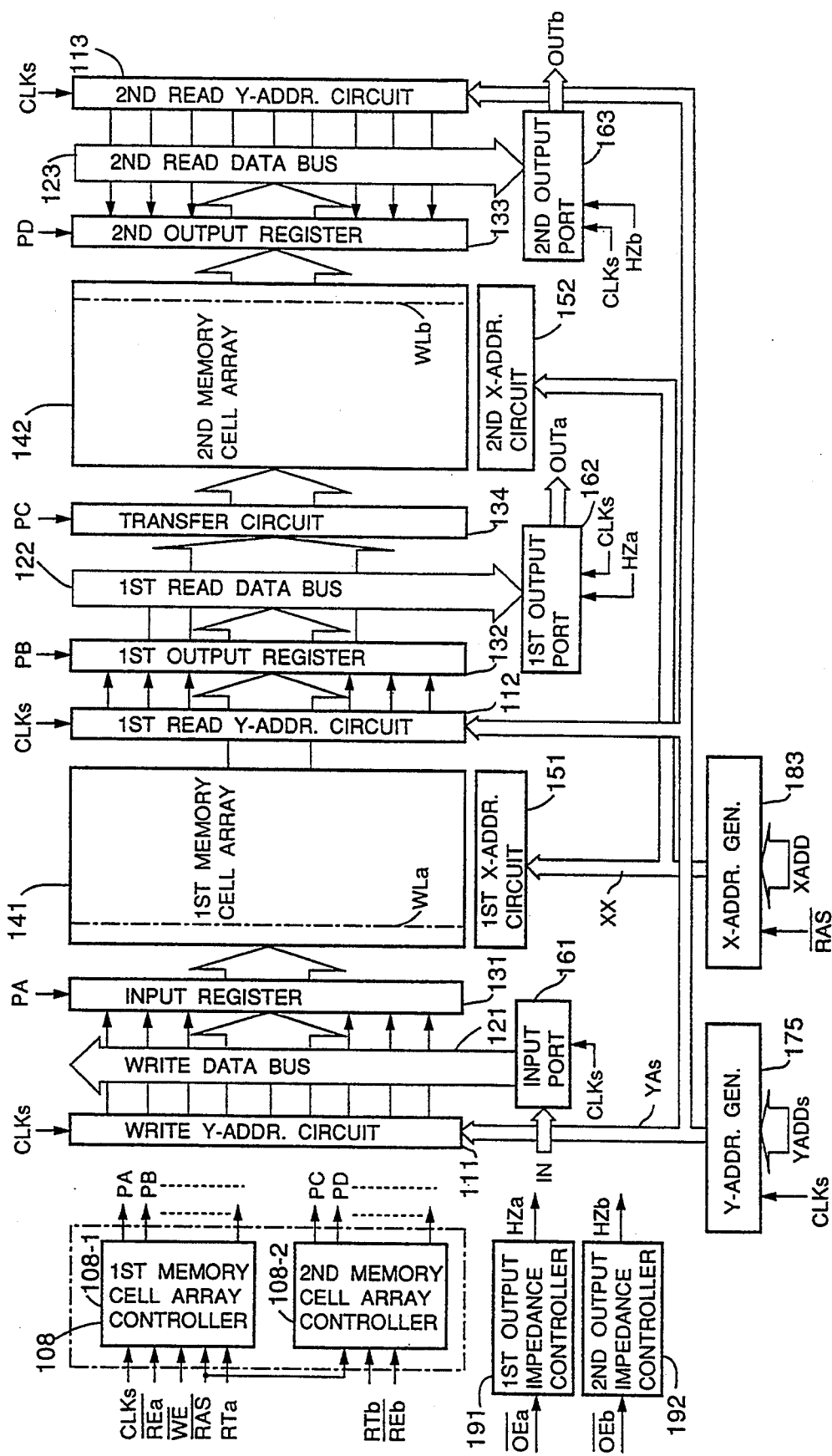
FIG. 44 is a block diagram illustrating an twenty-first embodiment of the invented multiple serial-access memory.
Figure 45:
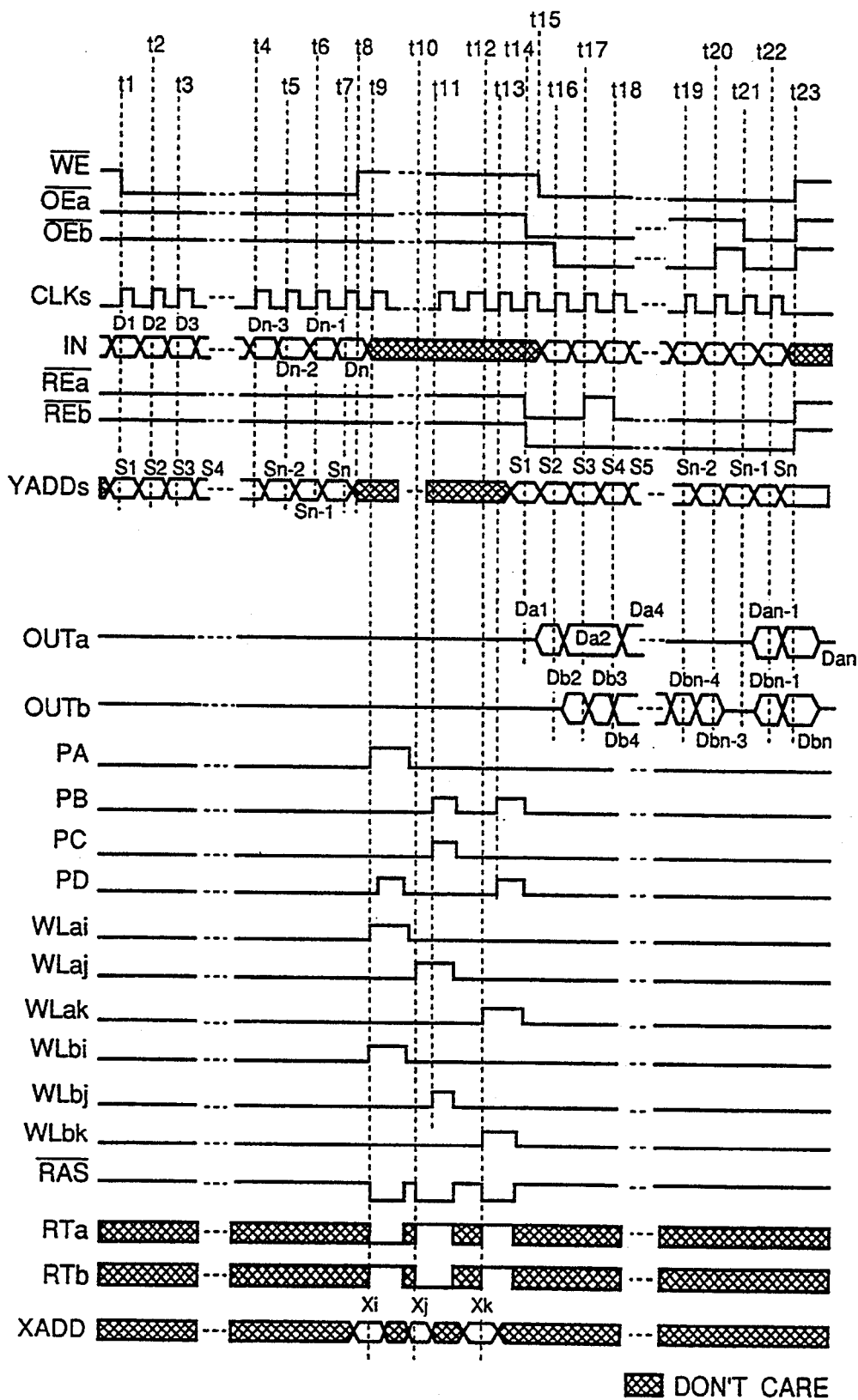
FIG. 45 is a timing diagram illustrating the operation of the twenty-first embodiment.
Figure 46:
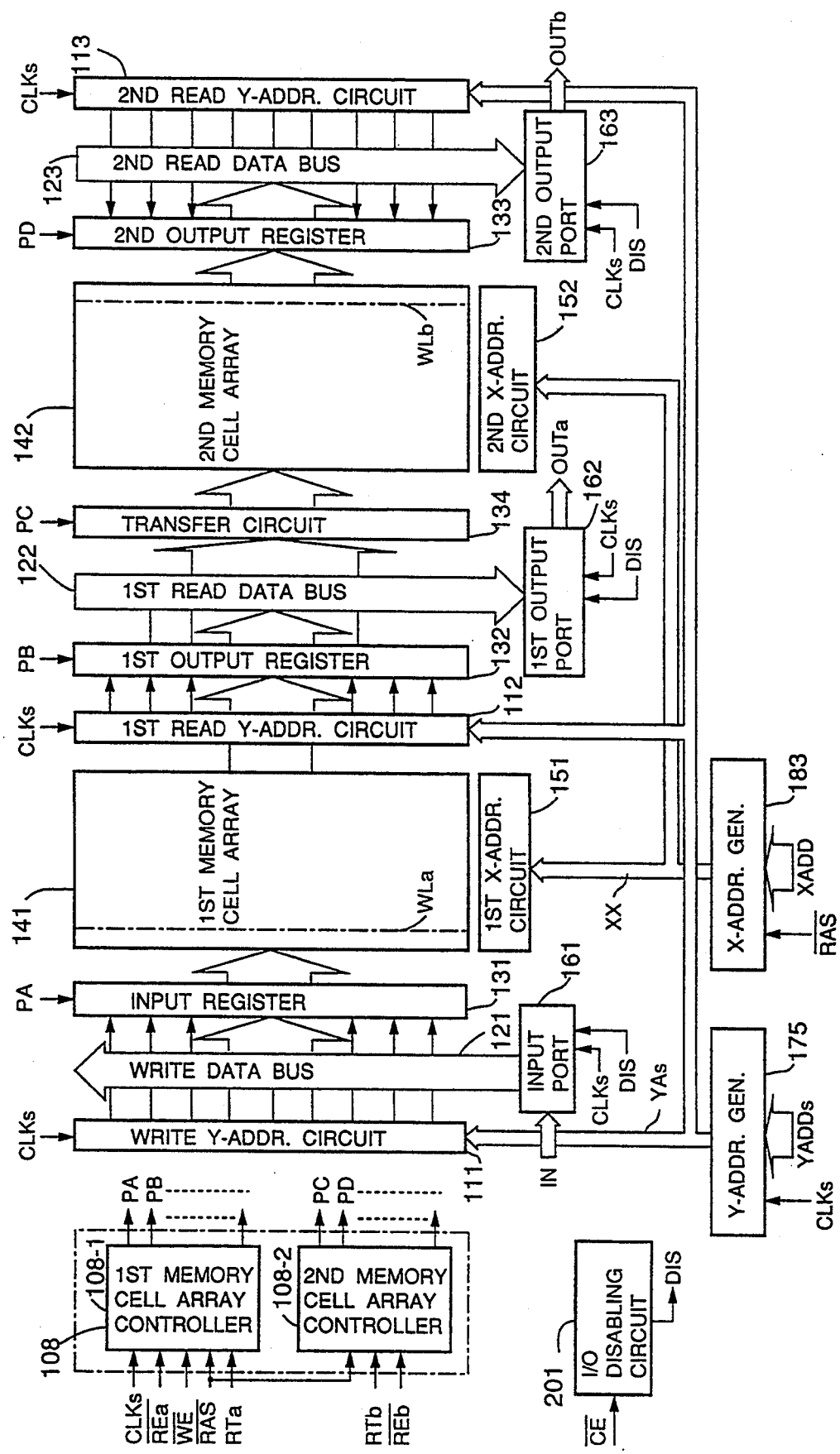
FIG. 46 is a block diagram illustrating an twenty-second embodiment of the invented multiple serial-access memory.
Figure 47:
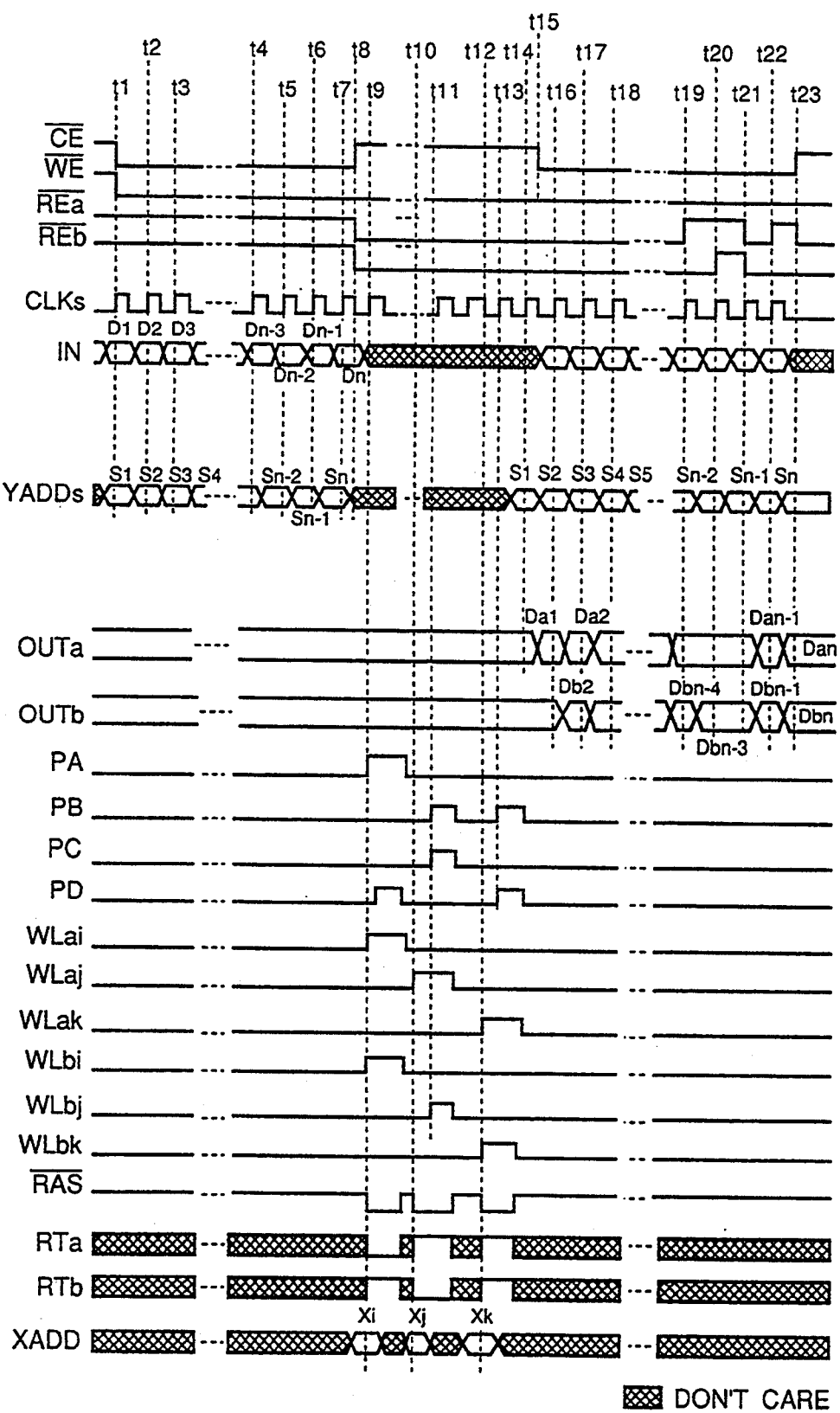
FIG. 47 is a timing diagram illustrating the operation of the twenty-second embodiment.
Figure 48:
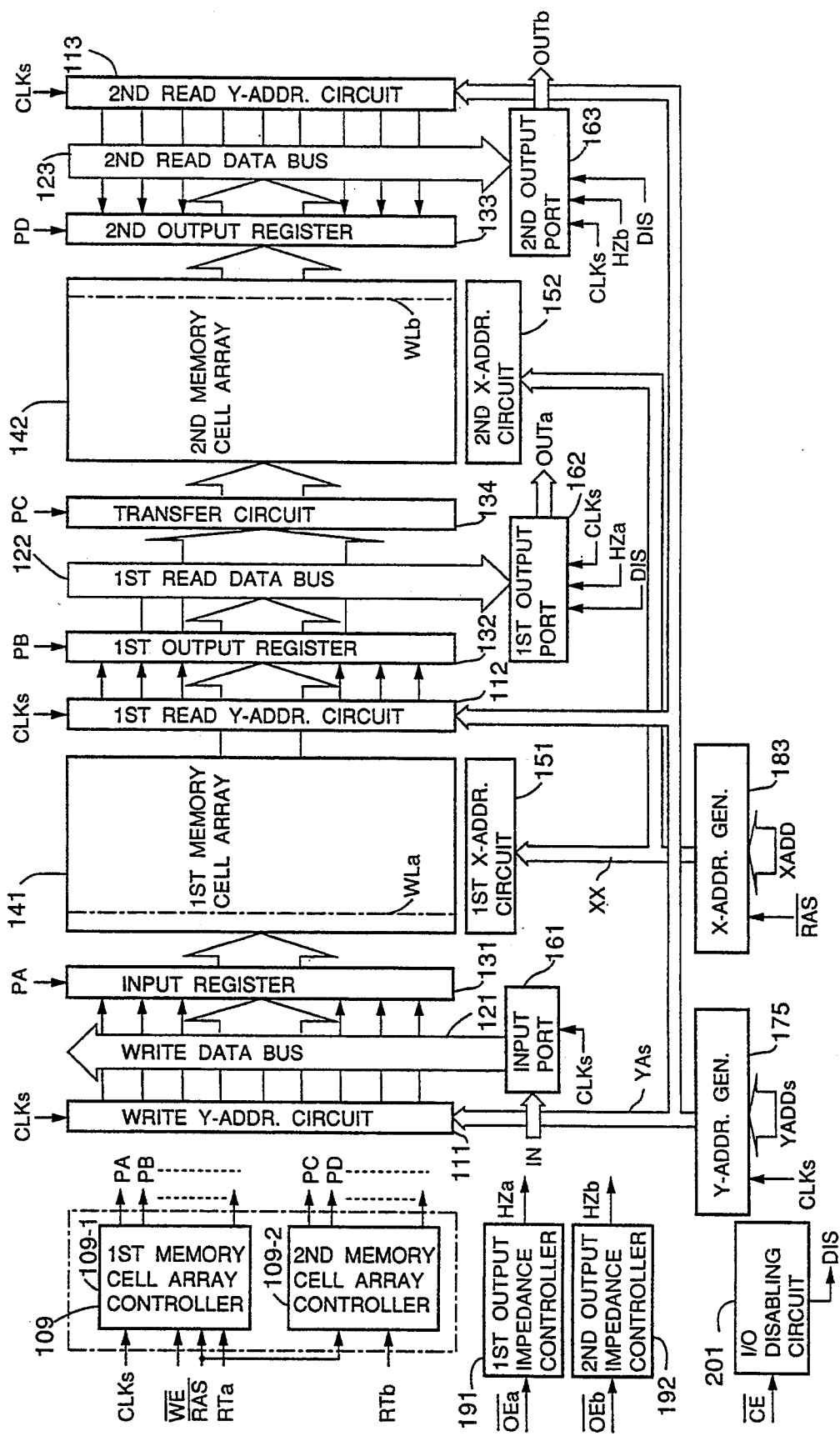
FIG. 48 is a block diagram illustrating an twenty-third embodiment of the invented multiple serial-access memory.
Figure 49:
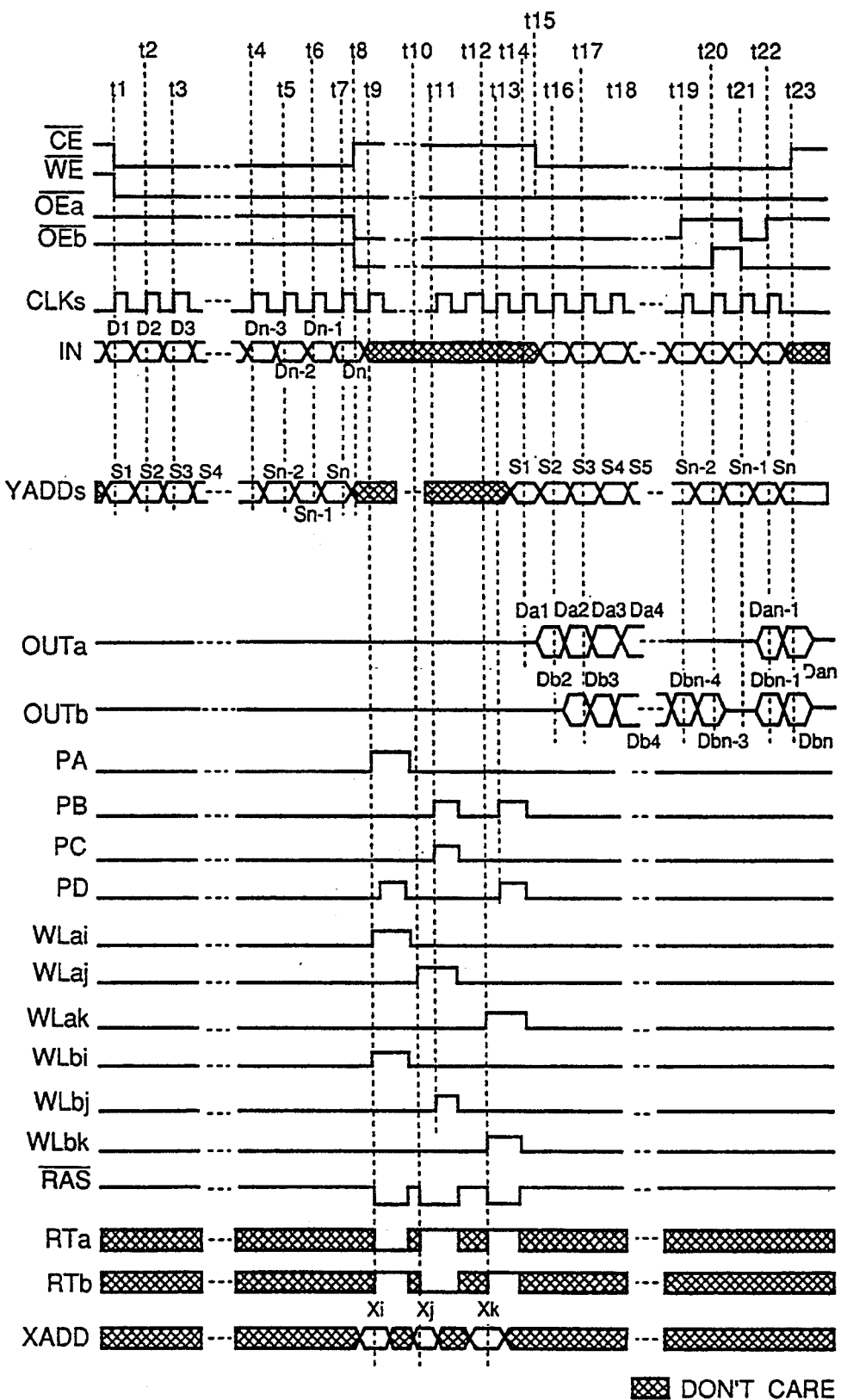
FIG. 49 is a timing diagram illustrating the operation of the twenty-third embodiment.
Figure 50:
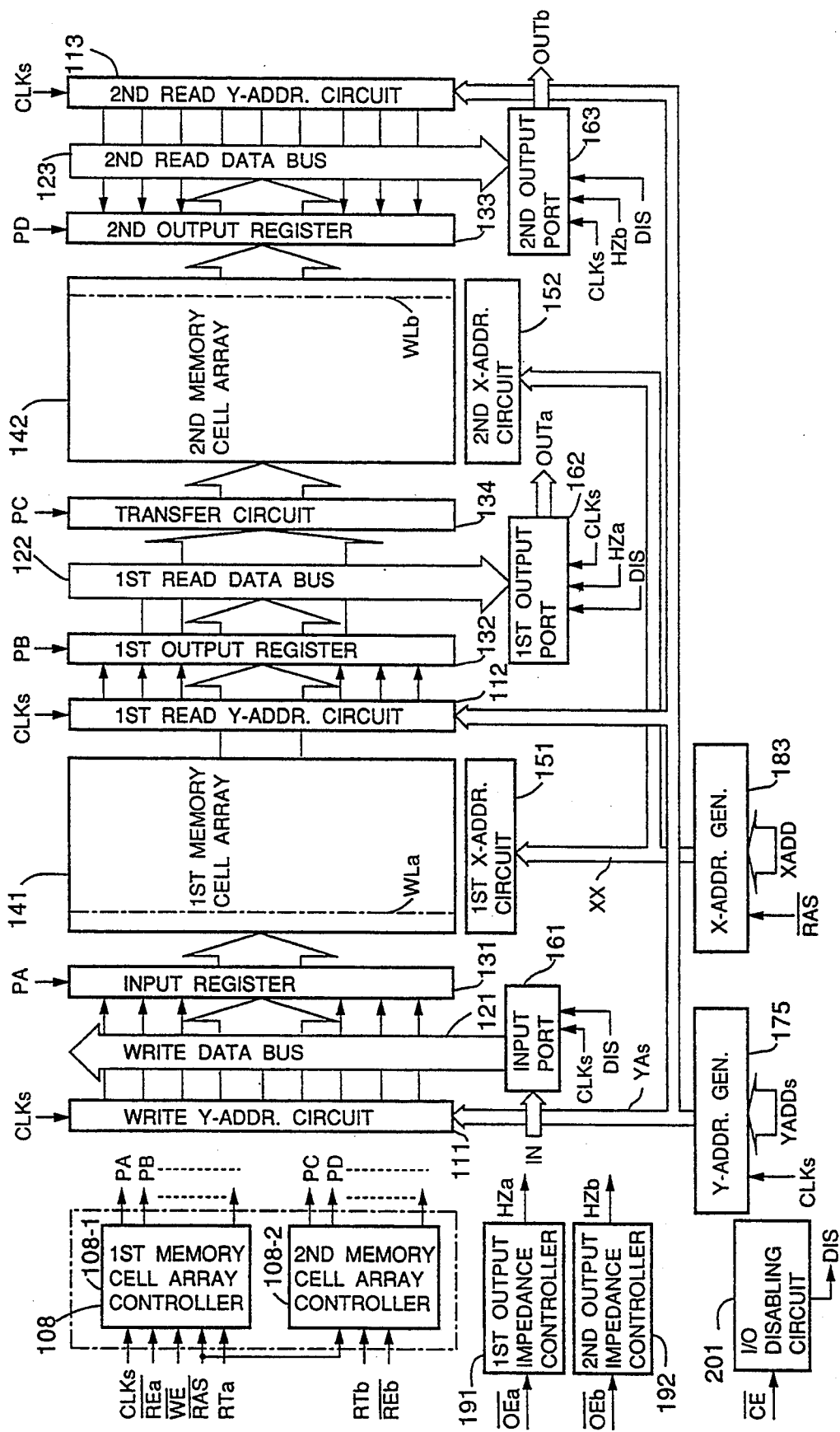
FIG. 50 is a block diagram illustrating an twenty-fourth embodiment of the invented multiple serial-access memory.
Figure 51:
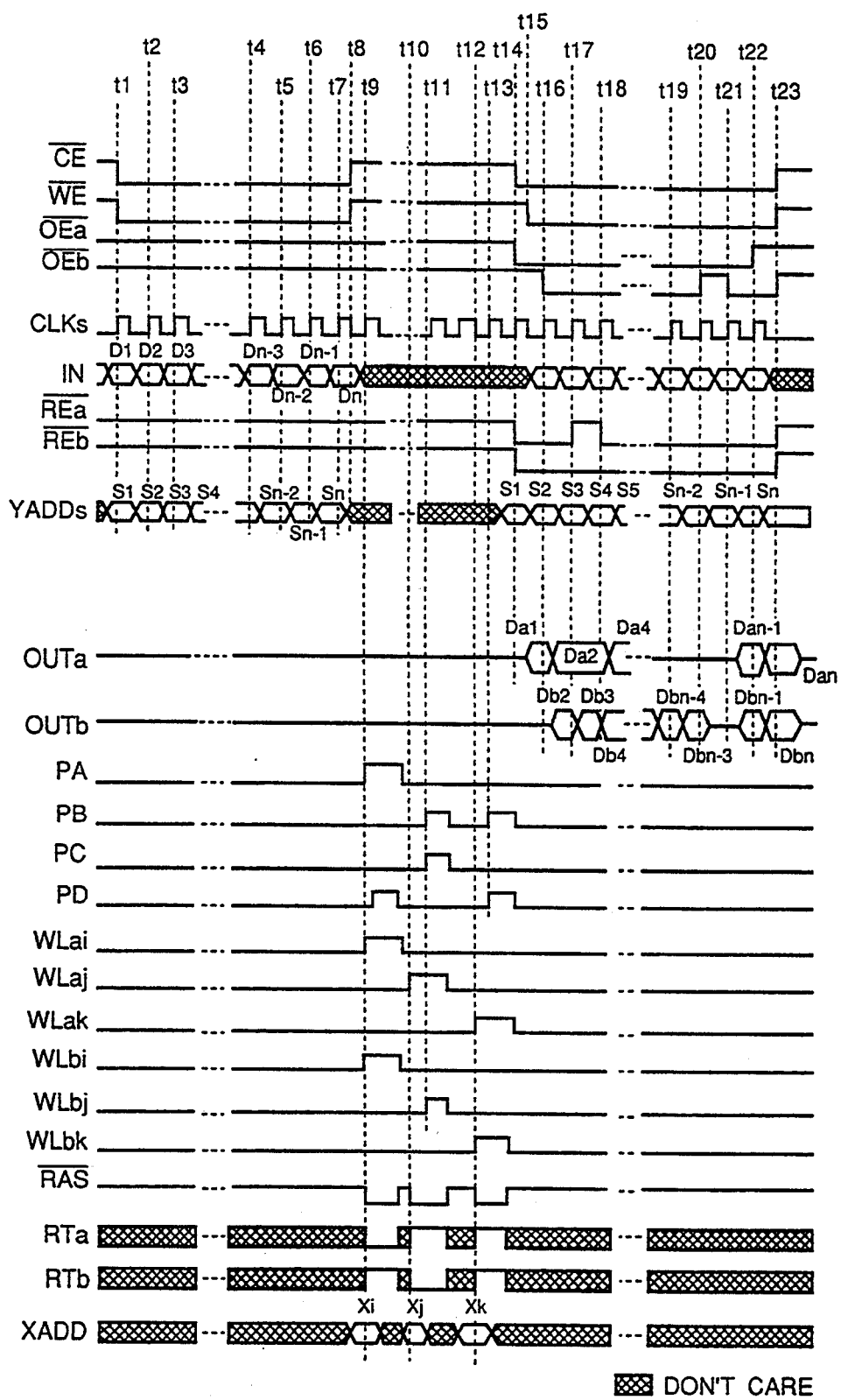
FIG. 51 is a timing diagram illustrating the operation of the twenty-fourth embodiment.

The same modifications that were made to the first and second embodiments to produce the nineteenth and twentieth embodiments can also be made to the third, fourth, and fifth, and sixth embodiments. These modifications produce a twenty-first embodiments, illustrated in FIGS. 44 and 45, a twenty-second embodiment, illustrated in FIGS. 46 and 47, a twenty-third embodiment, illustrated in FIGS. 48 and 49, and a twenty-fourth embodiment, illustrated in FIGS. 50 and 51. These embodiments operate like the third, fourth, fifth, and sixth embodiments, respectively, except that a single clock signal CLKs, a single row address strobe signal $\overline{RAS}$, a single Y-address signal YADDs, and a single X-address signal XADD serve for all input, output, and internal transfer of data.

In the preceding embodiments the X- and Y-addresses have been supplied by an external device. This arrangement has the advantage of permitting data to be input and output in any order, but in some applications this advantage is not needed because data are always input and output in, for example, ascending address order. In such cases memory control can be further simplified by providing the memory with address counters to generate the X- and Y-addresses. Several embodiments of this type will be described next.

Figure 52:
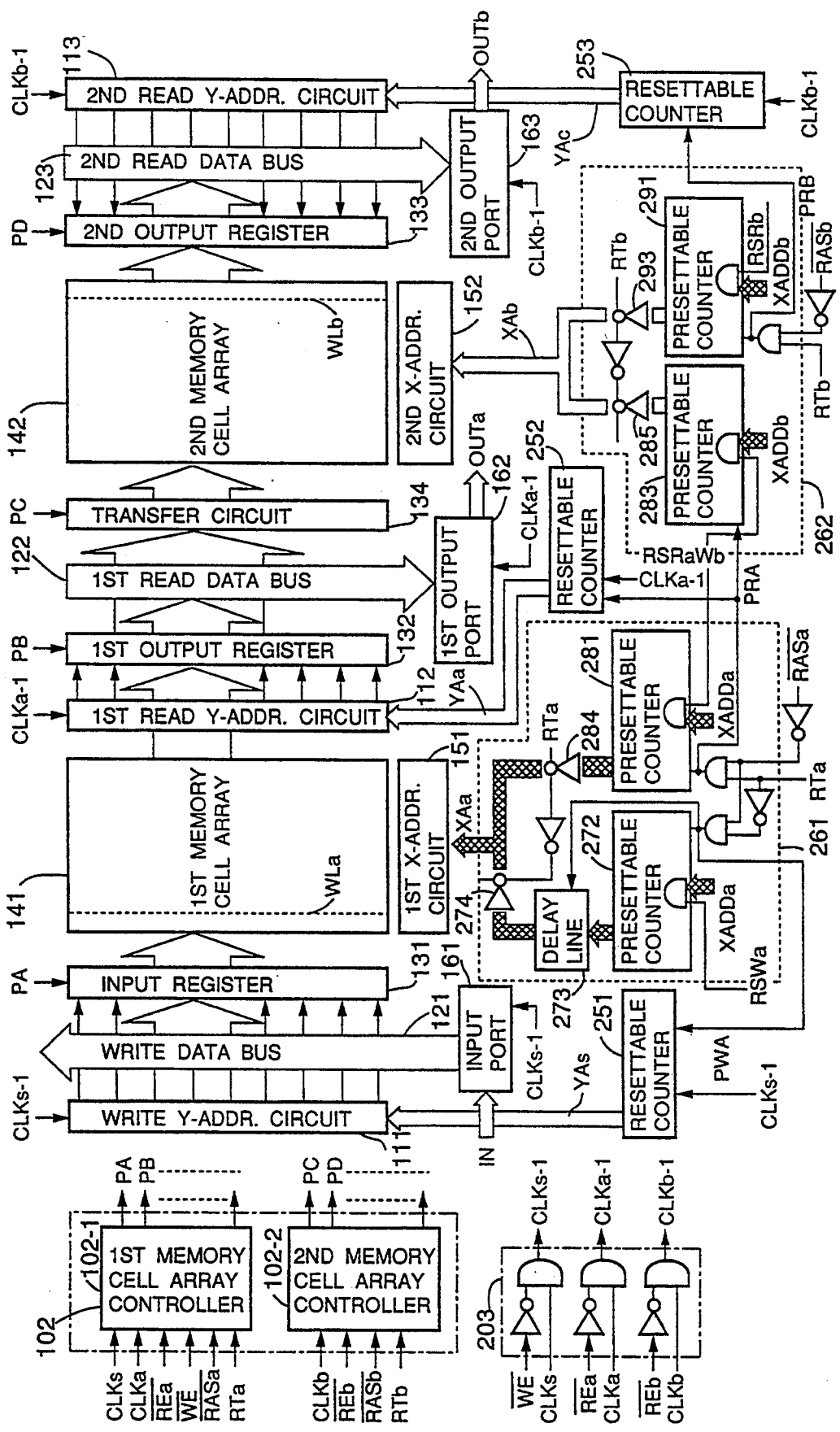
FIG. 52 is a block diagram illustrating an twenty-fifth embodiment of the invented multiple serial-access memory.

FIG. 52 shows a twenty-fifth embodiment of the invention. Elements identical to elements of the first embodiment have the same reference numerals as in FIG. 4. These include the dual control circuit 102, the memory cell arrays 141 and 142, their associated addressing circuits, registers, and data buses, and the novel transfer circuit 134.

In the twenty-fifth embodiment the clock signals CLKs, CLKa, and CLKb are input to a clock gating circuit 203 that gates them with $\overline{WE}$, $\overline{REa}$, and $\overline{REb}$, respectively, to generate internal clock signals CLKs-1, CLKa-1, and CLKb-1. CLKs-1 is identical to CLKs when $\overline{WE}$ is active (low), but is held low when $\overline{WE}$ is inactive (high). CLKa-1 is similarly related to CLKa and $\overline{REa}$, and CLKb-1 to CLKb and $\overline{REb}$. The internal clock signals CLKs-1, CLKa-1, and CLKB-1 are input to the Y-addressing circuits 111, 112, and 113 in place of CLKs, CLKa, and CLKb.

The X- and Y-address generators of the twenty-fifth embodiment differ from those of the first to twenty-fourth embodiments. The Y-address generators are three resettable counters 251, 252, and 253. The X-address generators 261 and 262 are circuits comprising presettable counters and other elements.

The write Y-address counter 251 is reset by an internal signal PWA which is obtained from $\overline{RASa}$ and RTa. When $\overline{RASa}$ and RTa are both low, that is, when data are transferred from the input register 131 into the first memory cell array 141, PWA goes high and resets the Y-address counter 251 to an initial value of zero. At other times, when PWA is low, the write Y-address counter 251 counts cycles of the internal write clock signal CLKs-1, thereby generating an ascending sequence of internal Y-addresses YAs, which are provided to the write Y-addressing circuit 111.

The first read Y-address counter 252 is reset by an internal signal PRA, which is also obtained form $\overline{RASa}$ and RTa. When $\overline{RASa}$ is low and RTa is high, that is, when data are transferred out of the first memory cell array 141 to the first output register 132, PRA goes high and resets the first read Y-address counter 252 to zero. When PRA is low, the first read Y-address counter 252 counts cycles of the first internal read clock signal CLKa-1, thereby generating an ascending sequence of internal Y-addresses YAa, which are provided to the first read Y-addressing circuit 112.

Similarly, the second read Y-address counter 253 is reset by an internal signal PRB, which is obtained from $\overline{\text{RASb}}$ and RTb. When $\overline{\text{RASb}}$ is low and RTb is high, that is, when data are transferred out of the second memory cell array 142 to the second output register 133, PRB goes high and resets the second Y-address counter 253 to zero. When PRB is low, the second read Y-address counter 253 counts cycles of the second internal read clock signal CLKb-1, thereby generating an ascending sequence of internal Y-addresses Yab, which are provided to the second read Y-addressing circuit 113.

The X-address generators 261 and 262 of the twenty-fifth embodiment comprises between them four presettable counters 272, 281, 283, and 291 that are initialized by three external signals RSWa, RSRaWb, and RSRb to the values of two external X-address signals XADDa and XADDb. When their initializing signals are inactive (low), these counters are incremented by low-to-high transitions of the internal signals PWA, PRA, and PRB. Table 2 indicates the assignments of increment signals, initializing signals, and initial values to these counters.

TABLE 2

| | X-Address Counters | | |
|---|---|---|---|
| Counter | Increment signal | Initializing signal | Initial value |
| 1st write counter 272 | PWA | RSWa | XADDa |
| 1st read counter 281 | PRA | RSRaWb | XADDa |
| 2nd write counter 283 | PRA | RSRaWb | XADDb |
| 2nd read counter 291 | PRB | RSRb | XADDb |

The first X-address generator 261 comprises the first read and write counters 272 and 281, a delay line 273, and a pair of switches 274 and 284. The delay line 273 comprises, for example, a pair of D-type flip-flops coupled in series. The delay line 273 receives the PWA signal as a clock signal, delays the X-address output from the first write counter 272 by one PWA cycle, and sends the delayed X-address to the switch 274. The switches 274 and 284 are controlled by the first read transfer signal RTa. When RTa is low, the switch 274 transfers the X-address from the delay line 273 to the first X-addressing circuit 151. When RTa is high, the switch 284 transfers the X-address output from the first read counter 281 to the first X-addressing circuit 151.

The second X-address generator 262 comprises the second read and write counters 283 and 291 and a pair of switches 285 and 293. The switches 285 and 293 are controlled by the second read transfer signal RTb. When RTb is low, the switch 285 transfers the X-address from the second write counter 283 to the second X-addressing circuit 152. When RTb is high, the switch 293 transfers the X-address output from the second read counter 291 to the second X-addressing circuit 152.

The internal X-addresses supplied to the first and second X-addressing circuits 151 and 152 are denoted XAa and XAb, respectively, as they were in FIG. 4.

Figure 53:
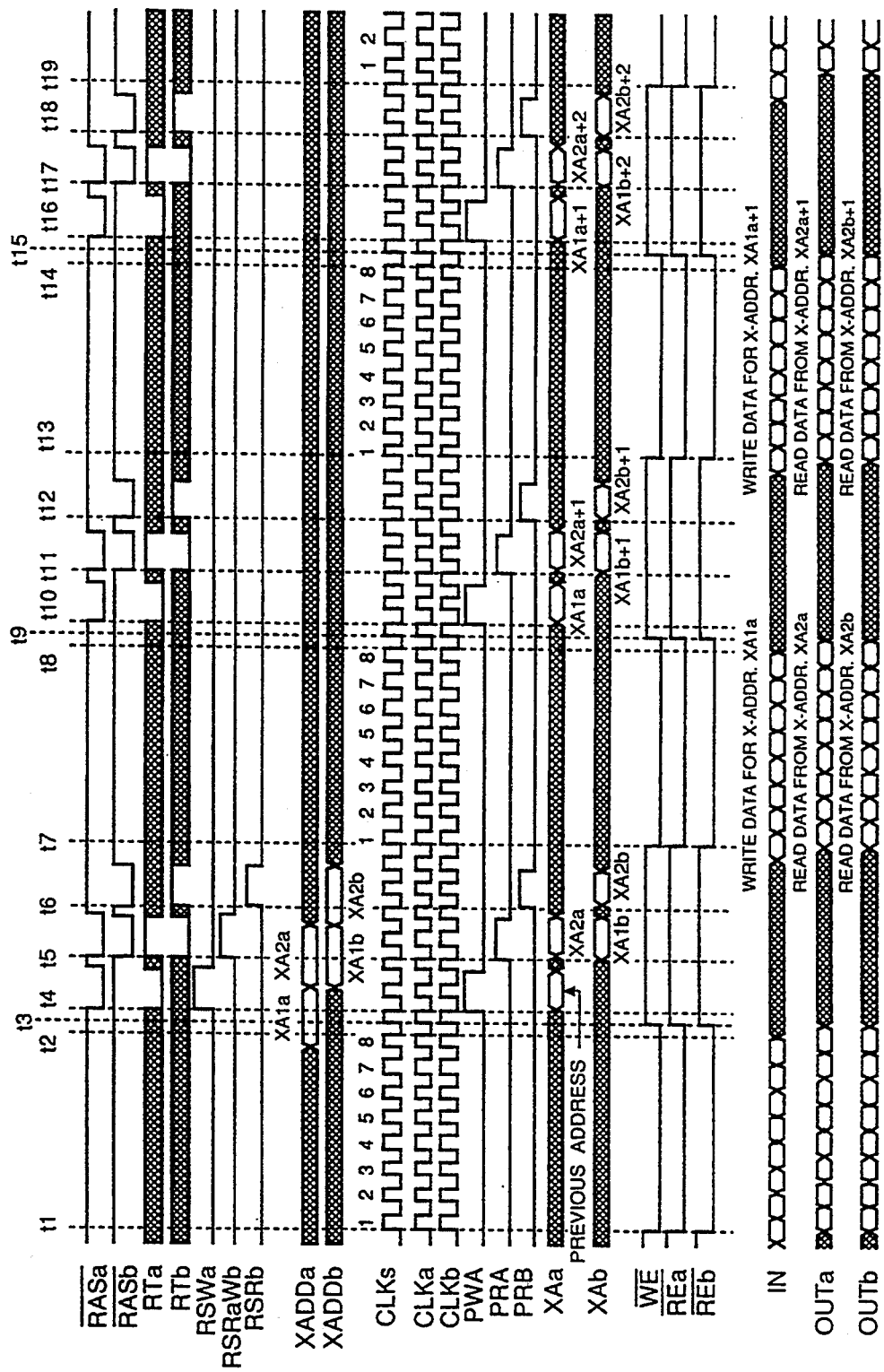
FIG. 53 is a timing diagram illustrating the operation of the twenty-fifth embodiment.

Next the operation of the twenty-fifth embodiment will be explained with reference to FIG. 53. It will be assumed that in a previous cycle the Y-address counters 251, 252, and 253 have been reset to zero, desired output data have been transferred from the memory cell arrays 141 and 142 to the first output register 132 and second output register 133, and the X-address of the next input data has been moved into the delay line 273. The PA, PB, PC, and PD signals that transfer data between the registers and memory arrays are omitted from FIG. 53, but they operate in the same way as in the first embodiment.

At time t1 the write enable signal $\overline{\text{WE}}$ goes low, and serial data are clocked in from the input terminal IN to the input port 161 by the internal clock signal CLKs-1. The write Y-address counter 251 generates an ascending sequence of Y-addresses, so the input data are stored in flip-flops FFa1, FFa2, ... in the input register 131.

At time t1 the first read enable signal $\overline{\text{REa}}$ also goes low and the first read Y-address counter 252 begins to receive CLKa-1 clock pulses. From these it generates an ascending sequence of Y-addresses, so data are transferred from the flip-flops FFb1, FFb2, ... in the first output register 132 to the first output port 162 and output as serial data at the output terminal OUTa.

Similarly, the second read enable signal $\overline{\text{REb}}$ goes low and the second read Y-address counter 253 begins to receive CLKb-1 clock pulses. From these it generates an ascending sequence of Y-addresses, so data are transferred from the flip-flops FFc1, FFc2, ... in the second output register 133 to the second output port 163 and output as serial data at the output terminal OUTb.

The above input and output operations continue through time t2. At time t3 the $\overline{\text{WE}}$, $\overline{\text{REa}}$, and $\overline{\text{REb}}$ signals go high, halting the input and output of serial data.

At time t4 $\overline{\text{RASa}}$ and RTa are driven low, transferring the input data from the input register 131 to the first memory cell array 141 as explained in relation to the first embodiment, and RSWa is driven high, presetting the first write X-address counter 272 to an X-address XA1a. The low $\overline{\text{RASa}}$ and RTa signals also generate a high PWA pulse, which resets the write Y-address counter 251 to zero and moves the X-address XA1a from the first write X-address counter 272 into the delay line 273. This X-address is held in the delay line 273 but is not yet supplied to the first X-addressing circuit 151. The delay line 273 outputs the X-address it received before time t1, and it is to the memory cells having this previous X-address that the input data are transferred from the input register 131.

At time t5 $\overline{\text{RASa}}$ and $\overline{\text{RASb}}$ are both driven low, RTa is driven high, RTb is driven low, and RSRaWb is driven high $\overline{\text{RASa}}$ and RTa now generate a high PRA pulse, resetting the first read Y-address counter 252. The high RSRaWb signal initializes the first read counter 281 and second write counter 283 in the X-address generators 261 and 262 to new X-addresses XA2a and XA1b and, since RTa is high and RTb is low, the corresponding internal addresses are immediately transferred through the switches 284 and 285 to the first and second X-addressing circuits 151 and 152. A transfer of data now takes place from the memory cells selected by X-address XA2a in the first memory cell array 141 via the transfer circuit 134 to the memory cells selected by X-address XA1b in the second memory cell array 142, as explained in relation to the first embodiment, these data also being stored in the first output register 132.

At time t6 $\overline{\text{RASb}}$ is driven low, RTb is driven high, and RSRb is driven high. $\overline{\text{RASb}}$ and RTb generates a high PRB pulse that resets the second read Y-address counter 253. The high RSRb signal presets the read counter 291 in the second X-address generator 262 to a new X-address XA2b which, since RTb is high, is immediately transferred to the second X-addressing circuit 152. A transfer of data now takes place from the memory cells selected by X-address XA2b in the second memory cell array 142 to the second output register 133, as explained in relation to the first embodiment.

At time t7 $\overline{WE}$, $\overline{REa}$, and $\overline{REb}$ are again driven low to begin serial input and output. Since the Y-address counters 251, 252, and 253 were reset at times t4, t5, and 56, the Y-addresses start again from zero. The serial data output from OUTa come from the memory cells in the first memory cell array 141 selected by X-address XA2a at time t5. The serial data output from OUTb come from the memory cells in the second memory cell array 142 selected by X-address XA2b at time t6. The serial input data are stored in the input register 131. Serial input and output continue through time t8.

At time t9 $\overline{WE}$, $\overline{REa}$, and $\overline{REb}$ go high, ending serial input and output.

At time t10 $\overline{RASa}$ and RTa are driven low as at time t4, but RSWa is not driven high. $\overline{RASa}$ and RTa generate a high PWA pulse that resets the write Y-address counter 251. In the first X-address generator 261 this PWA pulse increments the first write counter 272 to XA1a+1, and transfers the X-address XA1a, which was held in the delay line 273, to the first X-addressing circuit 151. $\overline{RASa}$ and RTa also generate a high PA pulse (not shown in the drawing). The data input at times t7 to t8 are thereby transferred from the input register 131 to the word line selected by the X-address XA1a received at time t4 in the first memory cell array 141.

In summary, the X-addresses of the data input and output at times t7 to t8 are the X-addresses that were received at times t4 to t6. The purpose of the delay line 273 is to allow the X-address of input data to be sent before the data are input, just as the X-addresses of output data are sent before the data are output.

At time t11, $\overline{RASa}$ and $\overline{RASb}$ are driven low, RTa is driven high, and RTb is driven low, as at time t5, but RSRaWb is not driven high. $\overline{RASa}$ and RTa generate a high PRA pulse that resets the first read Y-address counter 252 and increments the first read counter 281 and second write counter 283 in the X-address generators 261 and 262. Since Rta is high, the incremented X-addresses XA2a+1 and XA1b+1 are transferred to the first X-addressing circuit 151 and second X-addressing circuit 152. A data transfer now takes place from the memory cells selected by X-address XA2a+1 in the first memory cell array 141 to the first output register 132, and to the memory cells selected by X-address XA1b+1 in the second memory cell array 142.

At time t12 $\overline{RASb}$ is driven low and RTb is driven high, as at time t6, but RSRb is not driven high. $\overline{RASb}$ and RTb generate a high PRB pulse that resets the second read Y-address counter 253 and increments the read counter 291 in the second X-address generator 262. The incremented address XA2b+1 is sent to the second X-addressing circuit 152. Data are transferred from the memory cells selected by the incremented address XA2b+1 in the second memory cell array 142 to the second output register 133.

At times t13 to t19 the operations from times t7 to t12 are repeated. New serial data are input and stored in the memory cells selected by X-address XA1+1 in the first memory cell array 141, while serial data are output from the memory cells selected by X-addresses XA2a+1 and XA2b+1 in the first and second memory cell arrays 141 and 142. Then the Y-address counters 251, 252, and 253 are reset and the X-address counters 272, 281, 283, and 291 incremented in preparation for the next serial input and output.

The twenty-fifth embodiment is suitable for applications in which serial data are always input and output in ascending Y-address order, starting from the lowest address. Compared with the preceding embodiments, the number of necessary address signals and the number of external address signal lines are both reduced. The number of signal lines saved in this way exceeds the number of extra signal lines (three) needed for the RSWa, RSRaWb, and RSRb signals.

By using the RSWa, RSRaWb, and RSRb signals an external device can still designate arbitrary X-addresses for data input, data output, and internal data transfer, but when X-addresses are in ascending order, the external device can specify only the initial X-addresses and let the X-address counters in the memory generate subsequent X-addresses. In this way large amounts of data can be input and output by providing only a few addresses (four addresses in FIG. 53).

Another difference between the first twenty-four embodiments and the twenty-fifth is that in the twenty-fifth embodiment, if serial output is temporarily halted by driving $\overline{REA}$ or $\overline{REb}$ high, the corresponding internal clock signal CLKa or CLKb also halts. When serial output resumes, it will therefore resume from the next Y-address, instead of skipping addresses as in the first to twenty-fourth embodiments.

Next a twenty-sixth embodiment of the invention will be described with reference to FIGS. 54 and 55. Elements that are identical to elements in the twenty-fifth embodiment have the same reference numerals as in FIG. 52.

Figure 54:
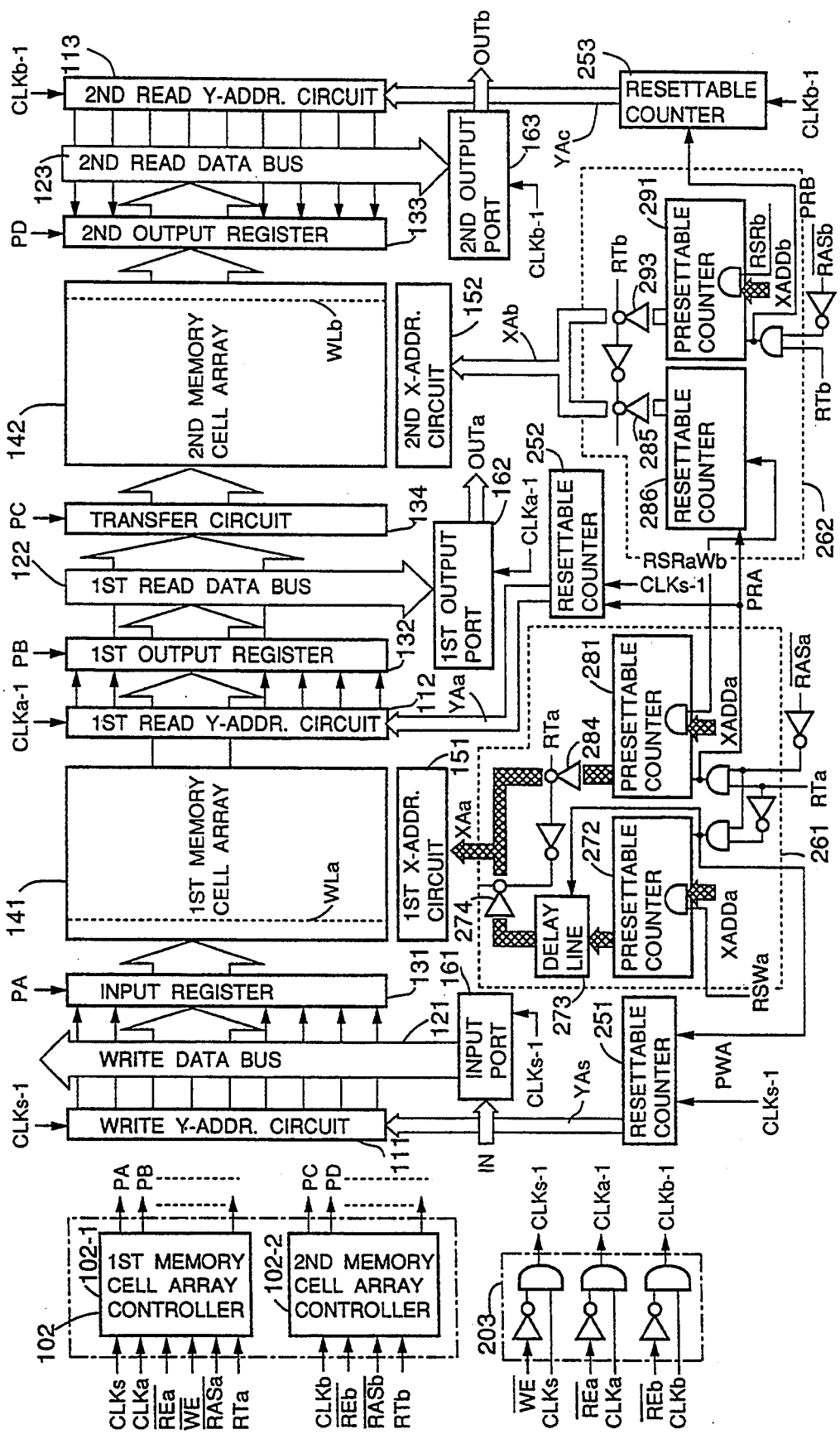
FIG. 54 is a block diagram illustrating an twenty-sixth embodiment of the invented multiple serial-access memory.

Referring to FIG. 54, the only difference between the twenty-fifth and twenty-sixth embodiments is that the second X-address generator 262 of the twenty-sixth embodiment has a resettable second write counter 286 instead of the presettable second write counter 283 of the twenty-fifth embodiment. The second write counter 286 is reset to zero by the RSRaWb signal.

Figure 55:
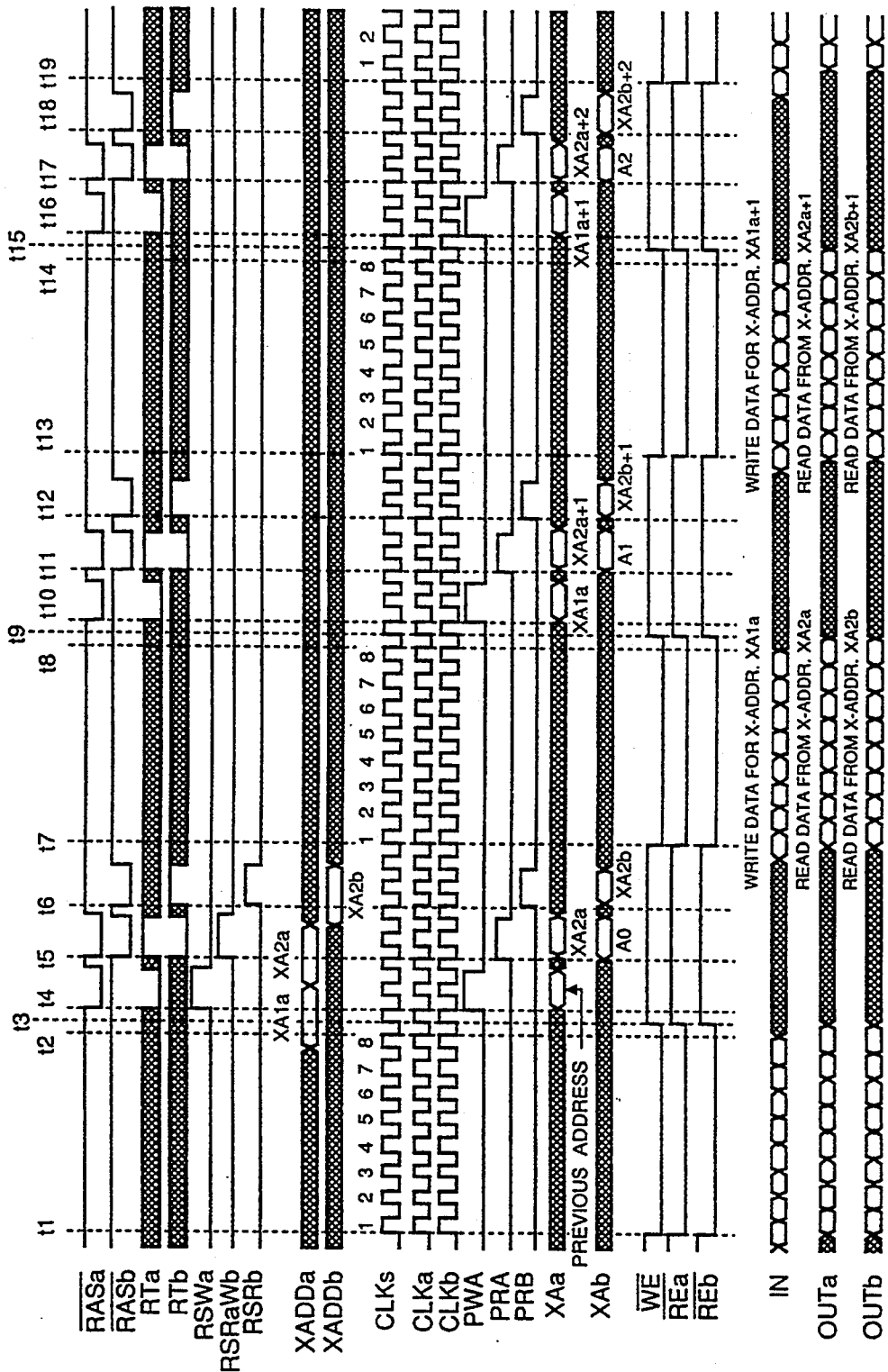
FIG. 55 is a timing diagram illustrating the operation of the twenty-sixth embodiment.

Referring to FIG. 55, the twenty-sixth embodiment operates in the same way as the twenty-fifth embodiment except that at time t5 there is no need to input an address XADDb, because the RSRaWb signal resets the second write counter 286 to zero (indicated by internal X-address A0). When data are transferred from the first memory cell array 141 to the second memory cell array 142 at time t5 they are stored in the memory cells having this X-address (A0). Similarly, when data are transferred from the first memory cell array 141 to the second memory cell array 142 at time t11 they are stored in the memory cells having X-address one (A1), when data are transferred from the first memory cell array 141 to the second memory cell array 142 at time t17 they are stored in the memory cells having X-address two (A2), and so on.

The twenty-sixth embodiment is suitable when data are always stored in the second memory cell array 142 in ascending order of both X- and Y-addresses, starting from address zero. Since transfers can start from an arbitrary X-address in the first memory cell array 141, it is still possible to rearrange data when moving data from the first memory cell array 141 to the second memory cell array 142, e.g. by rotating the data in the X-address direction. Also, serial input and output can still start from arbitrary X-addresses.

Next a twenty-seventh embodiment of the invention will be described with reference to FIGS. 56 and 57. Elements that are identical to elements in the twenty-sixth embodiment have the same reference numerals as in FIG. 54.

Figure 56:
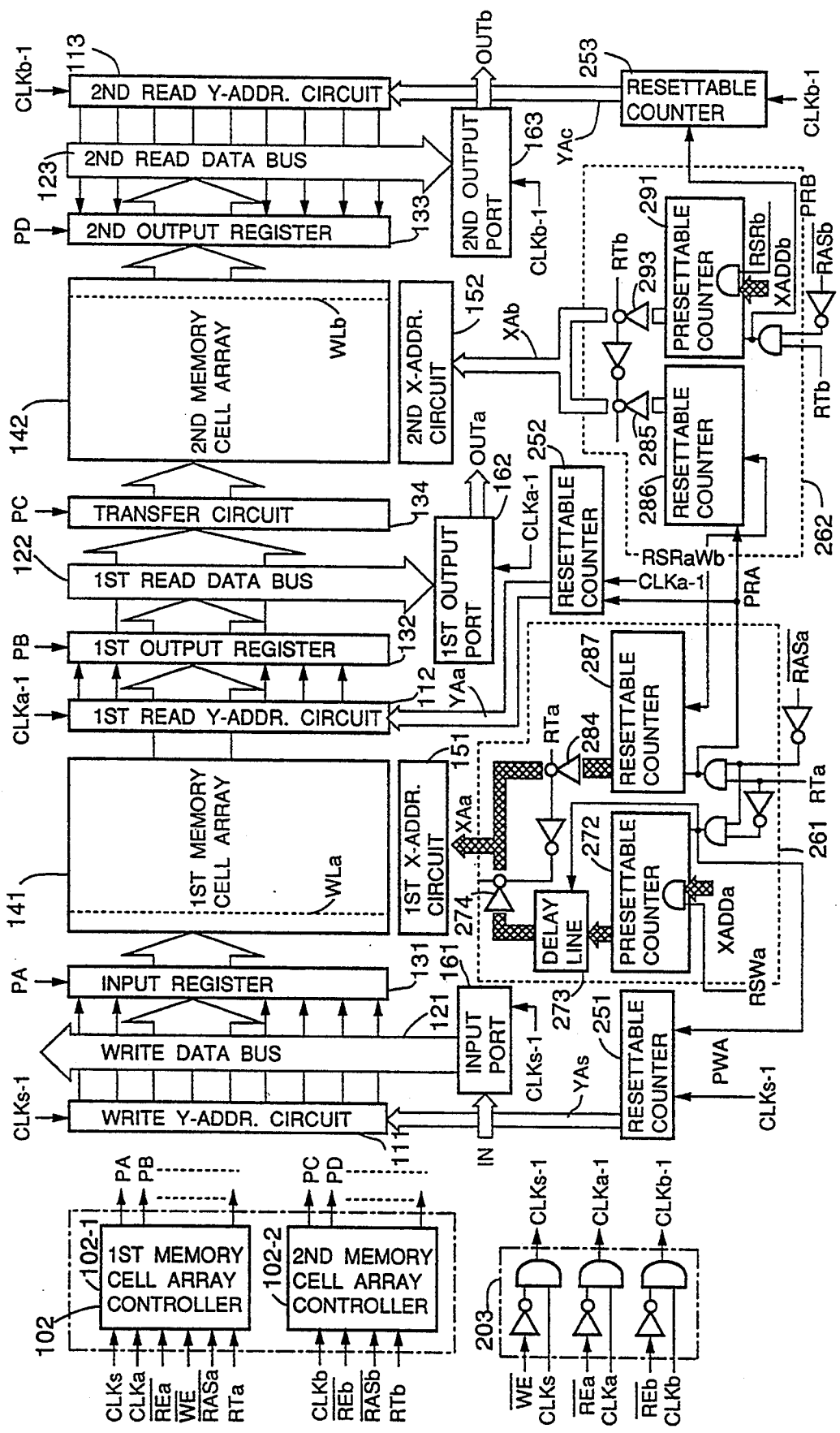
FIG. 56 is a block diagram illustrating an twenty-seventh embodiment of the invented multiple serial-access memory.

Referring to FIG. 56, the only difference between the twenty-sixth and twenty-seventh embodiments is that the first X-addresses generator 261 of the twenty-seventh embodiment has a resettable first read counter 287 instead of the presetteable first read counter 281 of the twenty-sixth embodiment. The first read counter 287 is reset to zero by the RSRaWb signal.

Figure 57:
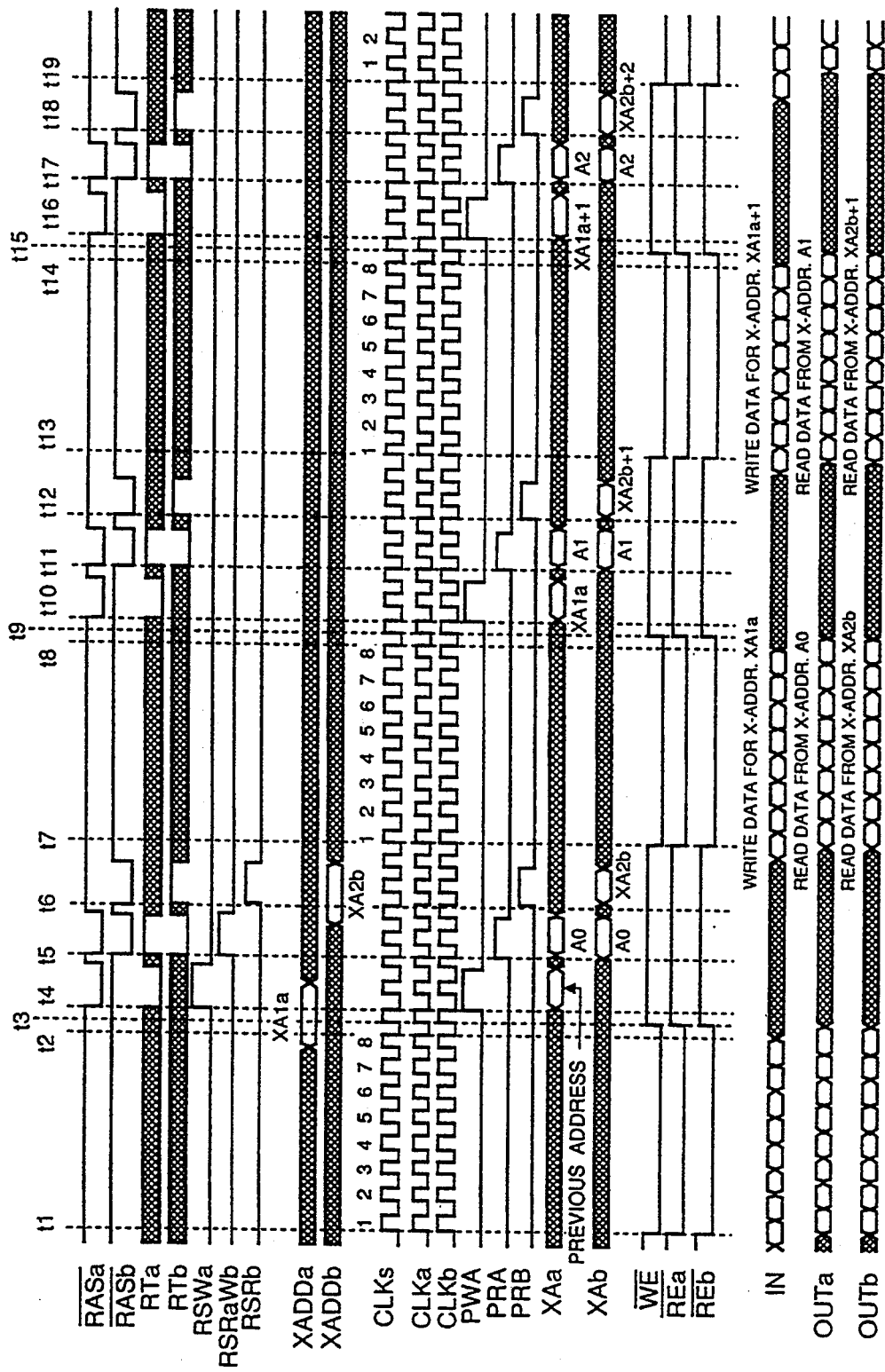
FIG. 57 is a timing diagram illustrating the operation of the twenty-seventh embodiment.

Referring to FIG. 57, the twenty-seventh embodiment operates in the same way as the twenty-sixth embodiment except that at time t5 there is no address input. Data are always transferred between memory cells with identical addresses in the first and second memory cell arrays 141 and 142, in ascending X-address order (A0, A1, A2, ... ). Serial output from OUTa also starts from X-address A0. Serial input at IN can start at an arbitrary X-address (XA1a), and serial output from OUTb at an arbitrary X-address (XA2a).

The twenty-seventh embodiment is suitable for applications in which there is never any need for address rearrangement when data are transferred between the two memory cells arrays.

Next a twenty-eighth embodiment of the invention will be described with reference to FIGS. 58 and 59. Elements that are identical to elements in the twenty-seventh embodiment have the same reference numerals as in FIG. 56.

Figure 58:
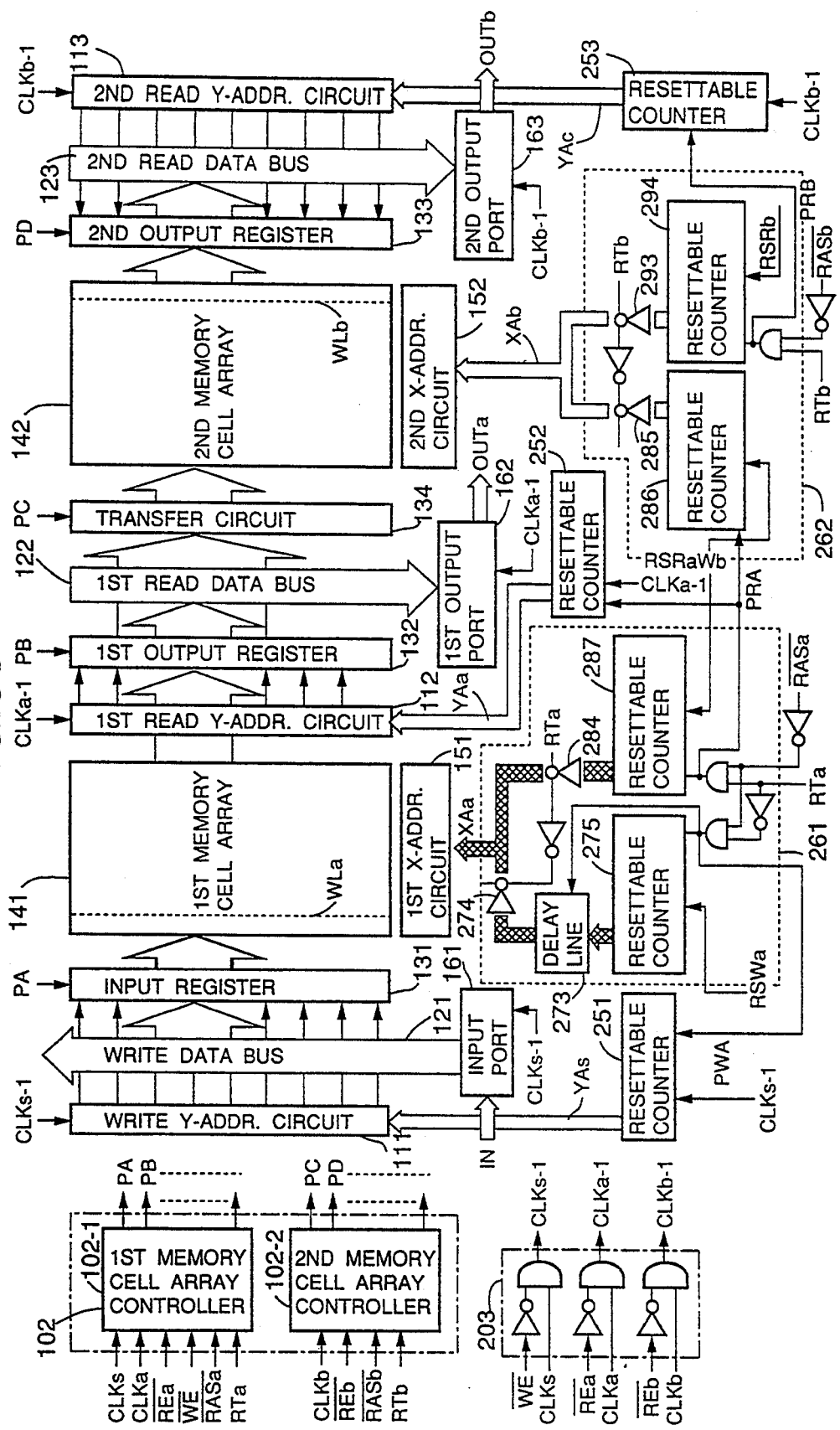
FIG. 58 is a block diagram illustrating an twenty-eighth embodiment of the invented multiple serial-access memory.

Referring to FIG. 58, the differences between the twenty-seventh and twenty-eighth embodiments are that the first X-address generator 261 of the twenty-eighth embodiment has a resettable first write counter 275 instead of the presettable first write counter 272 of the twenty-seventh embodiment, and the second X-address generator 262 of the twenty-eighth embodiment has a resettable second read counter 294 instead of the presettable second read counter 291 of the twenty-seventh embodiment. The first write counter 275 is reset to zero by the RSWa signal; the second read counter 294 is reset to zero by the RSRb signal. The twenty-eighth embodiment has no external address input signals.

Figure 59:
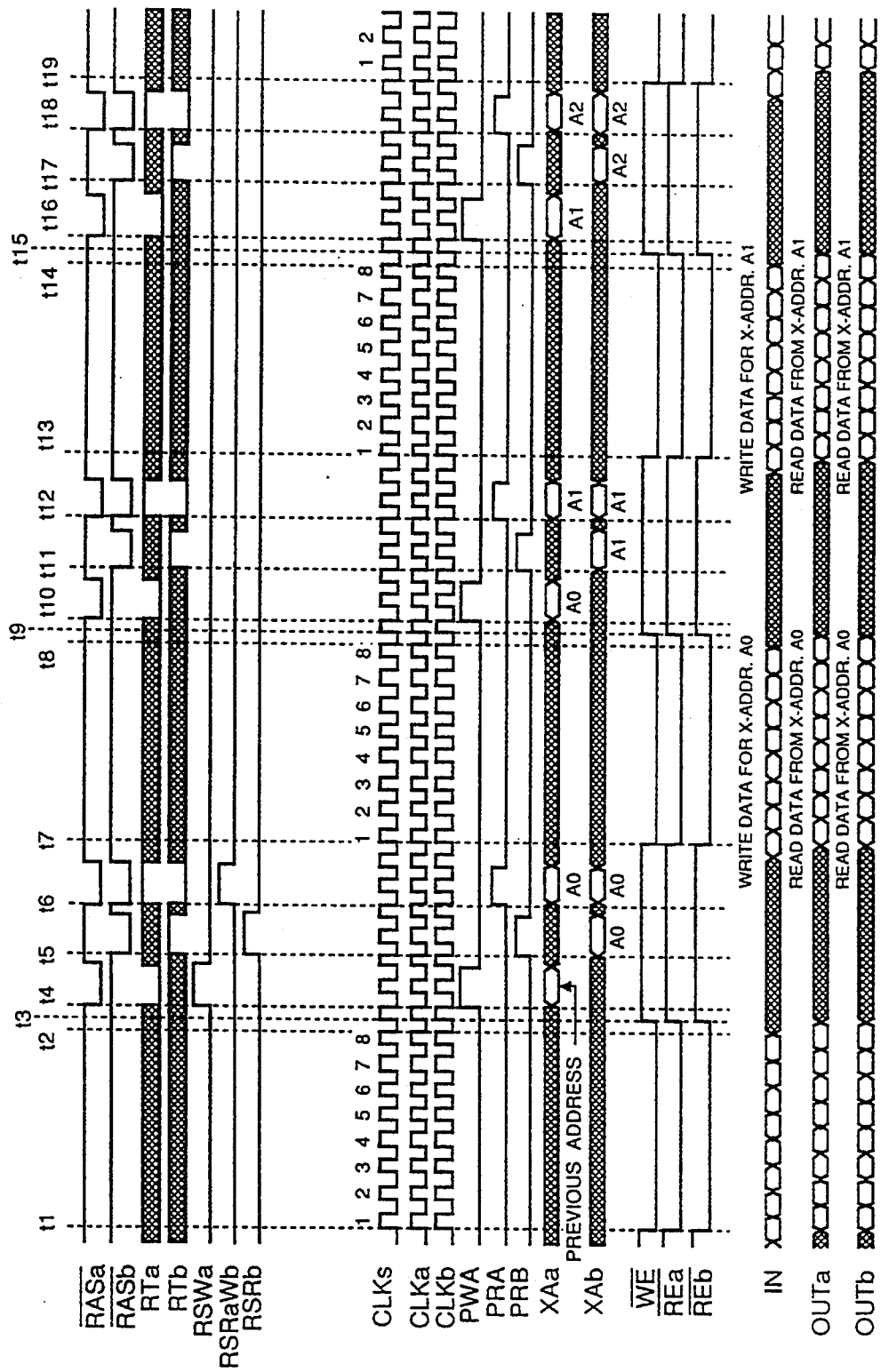
FIG. 59 is a timing diagram illustrating the operation of the twenty-eighth embodiment.

Referring to FIG. 59, at time t4 input data are transferred from the input register 131 to the first memory cell array 141 using an X-address that was generated previously and held in the delay line 273, and the RSWa signal resets the first write counter 275 to zero. At time t5 the RSRb signal resets the second read counter 294 to zero and the RASb and RTb signals transfer data from the memory cells having X-address zero (A0) in the second memory cell array 142 to the second output register 133. Then at time t6 the RSRaWb signal resets the second write counter 286 and first read counter 287 to zero, and the RASa, RASb, RTa, and RTb signals transfer new data from the memory cells having X-address zero (A0) in the first memory cell array 141 to the first output register 132 and to the memory cells having X-address zero (A0) in the second memory cell array 142. At times t7 to t8 these data are output from OUTa, while the old data at X-address zero (A0) in the second memory cell array 142, which are now held in the second output register 133, are output from OUTb. In addition, serial input data are input at the IN terminal, to be stored at X-address zero (A0) in the first memory cell array 141 at time t10.

At times t10 to t12 the Y-address counters are reset and the X-address counters are incremented, then the above operations are repeated. The data input at times t7 to t8 are stored at X-address A0 in the first memory cell array 141, the data stored at X-address A1 in the second memory cell array 142 are transferred to the second output register 133, then the data stored at X-address A1 in the first memory cell array 141 are transferred to X-address A1 in the second memory cell array 142.

A typical application of the twenty-eighth embodiment would be in a buffer that inputs serial data at the IN terminal, outputs the same data with a certain delay at the OUTa terminal, then outputs the same data again with twice that delay at the OUTb terminal. Such buffers are used, for example, in noise filters to improve the quality of television and other images. The twenty-eighth embodiment is attractive in these applications because it generates all its own addresses, requiring only three initializing signals RSWa, RSRaWb, and RSRb to be dedicated to address control.

Next a twenty-ninth embodiment of the invention will be described.

Figure 60:
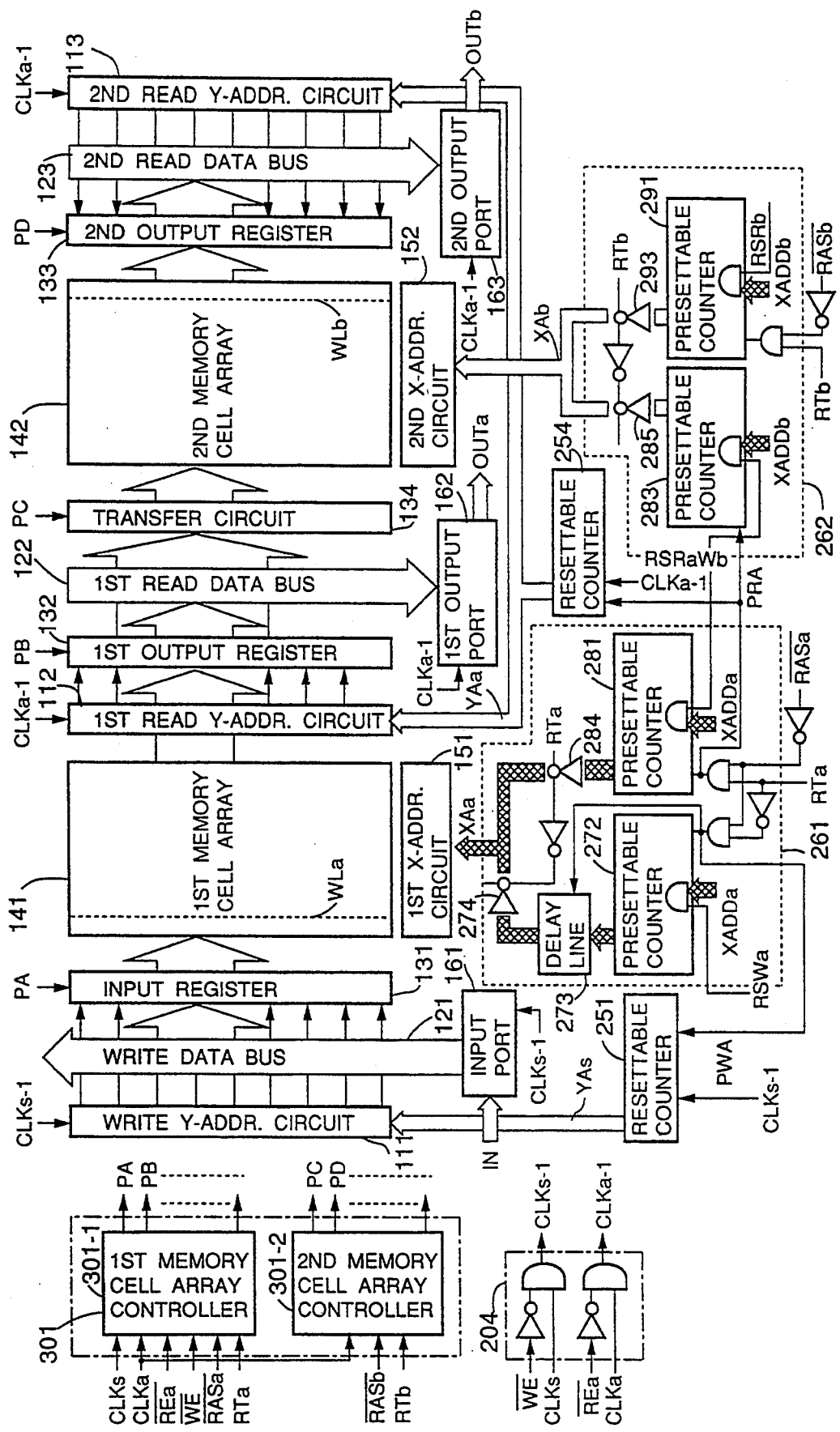
FIG. 60 is a block diagram illustrating an twenty-ninth embodiment of the invented multiple serial-access memory.

Referring to FIG. 60, the dual control circuit 301 of the twenty-ninth embodiment receives only two clock signals CLKs and CLKa, and only one read enable signal REa. The clock gating circuit 204 of the twenty-ninth embodiment generates only two internal clock signals CLKs-1 and CLKa-1, and supplies CLKa-1 to the first read Y-addressing circuit 112, first output port 162, second read Y-addressing circuit 113, and second output port 163.

The twenty-ninth embodiment has only two Y-address counters: the write Y-address counter 251 and a common read Y-address counter 254. The common read Y-address counter 254 operates like the first read Y-address counter in the twenty-fifth embodiment, but supplies Y-addresses YAa to both the first and second read Y-addressing circuits 112 and 113.

Figure 61:
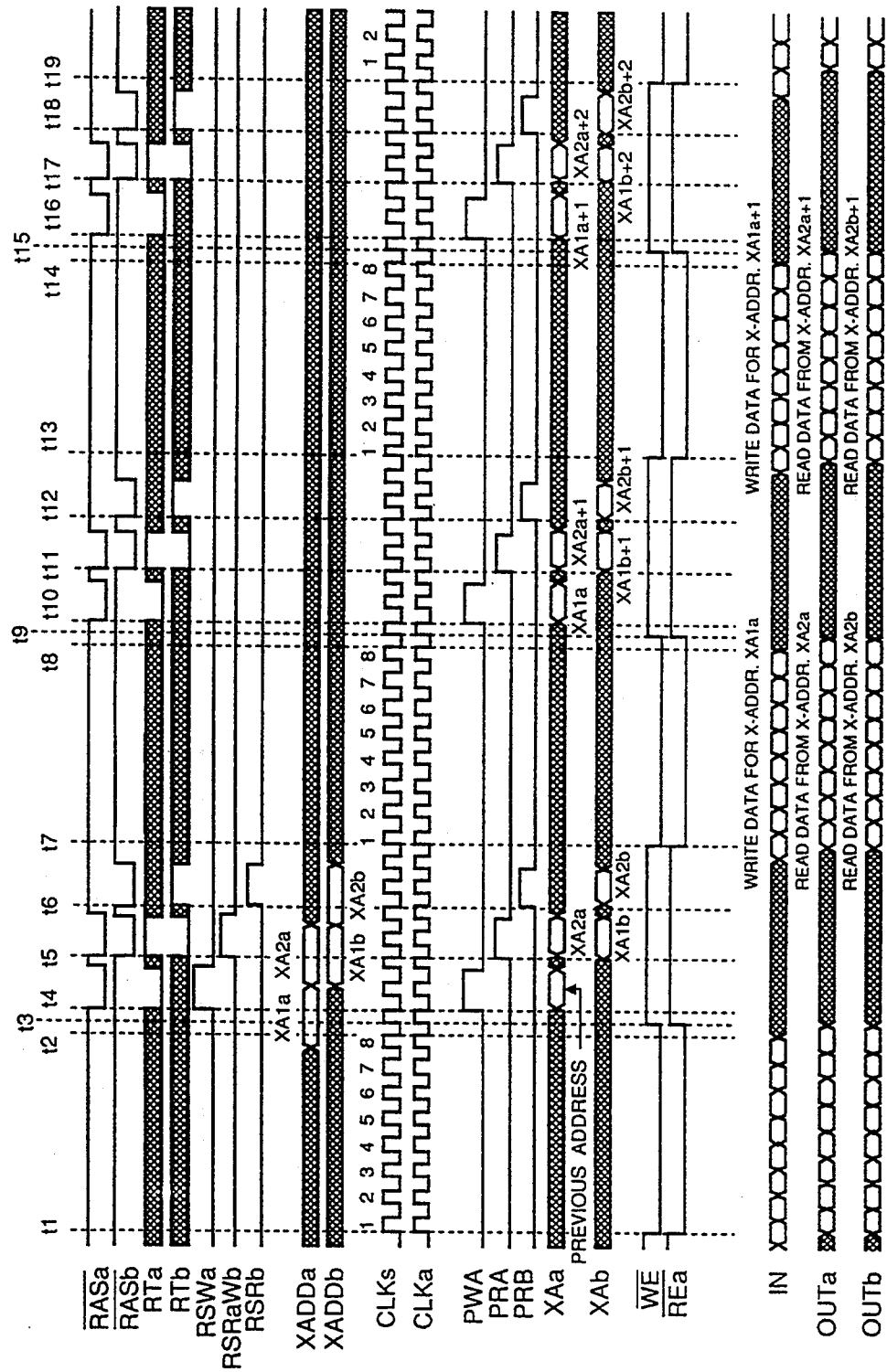
FIG. 61 is a timing diagram illustrating the operation of the twenty-ninth embodiment.

Referring to FIG. 61, the twenty-ninth embodiment operates like the twenty-fifth embodiment except that output from both OUTa and OUTb is enabled by REa and clocked by CLKa.

Figure 62:
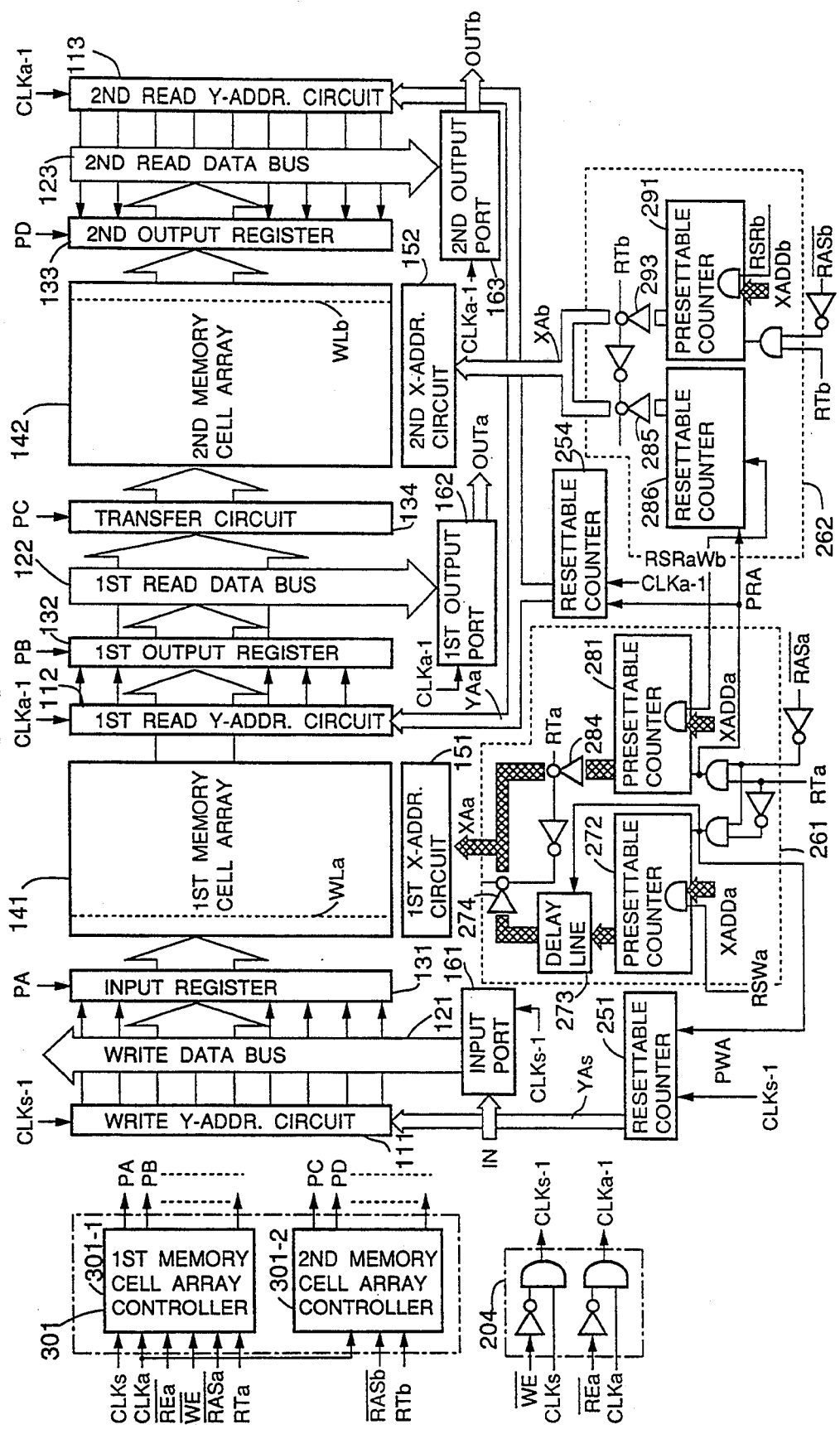
FIG. 62 is a block diagram illustrating an thirtieth embodiment of the invented multiple serial-access memory.
Figure 63:
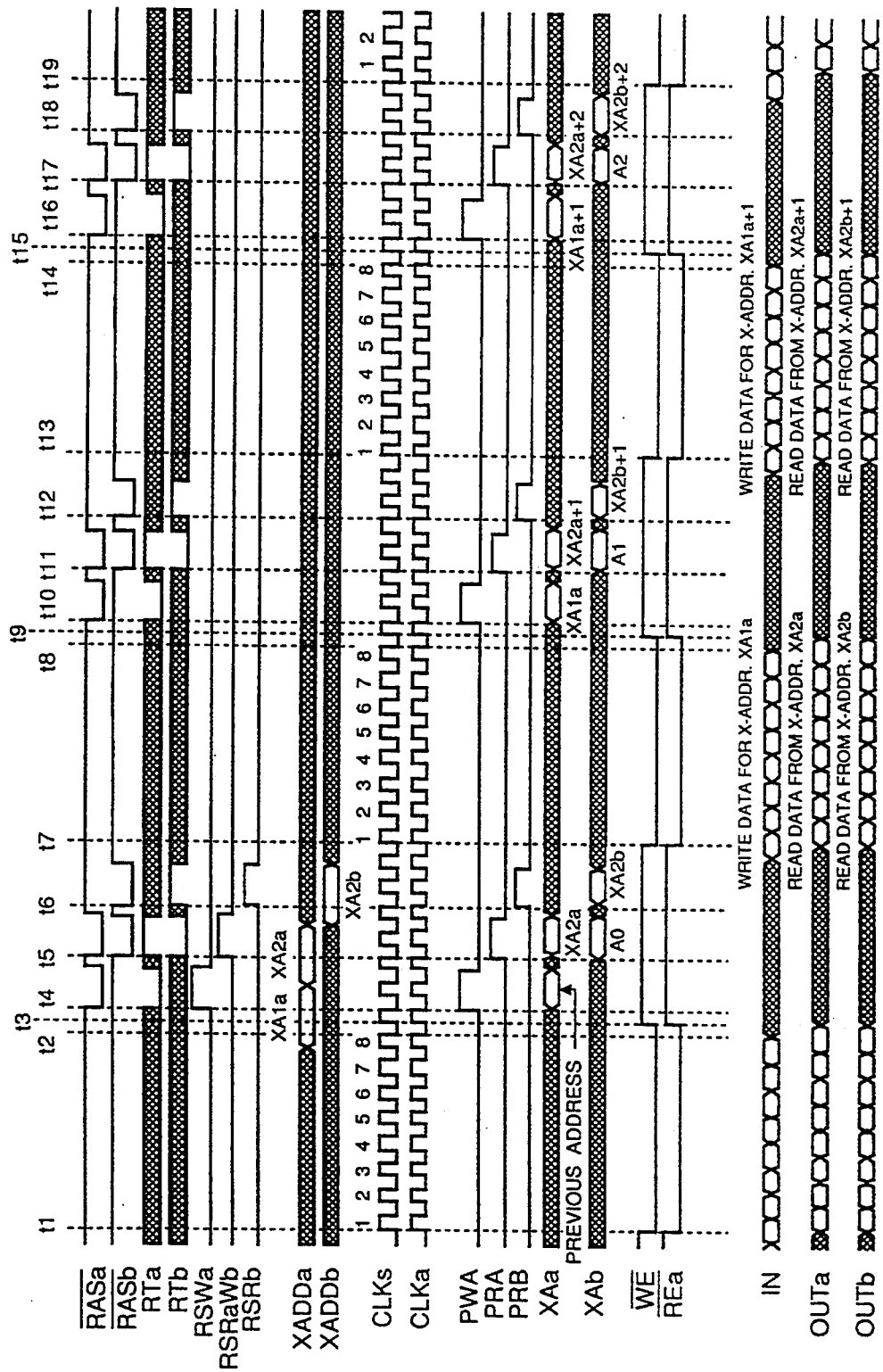
FIG. 63 is a timing diagram illustrating the operation of the thirtieth embodiment.
Figure 64:
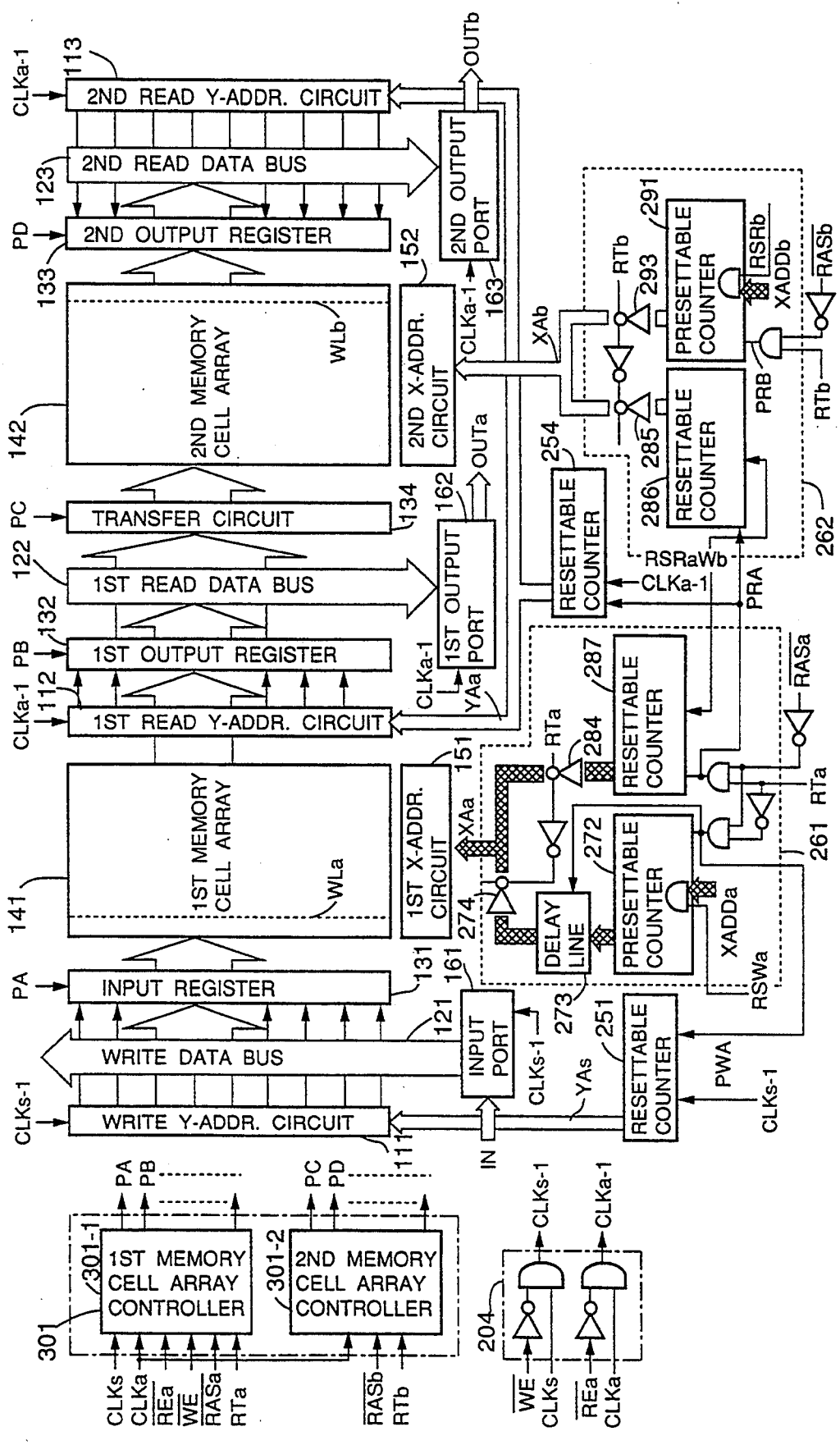
FIG. 64 is a block diagram illustrating an thirty-first embodiment of the invented multiple serial-access memory.
Figure 65:
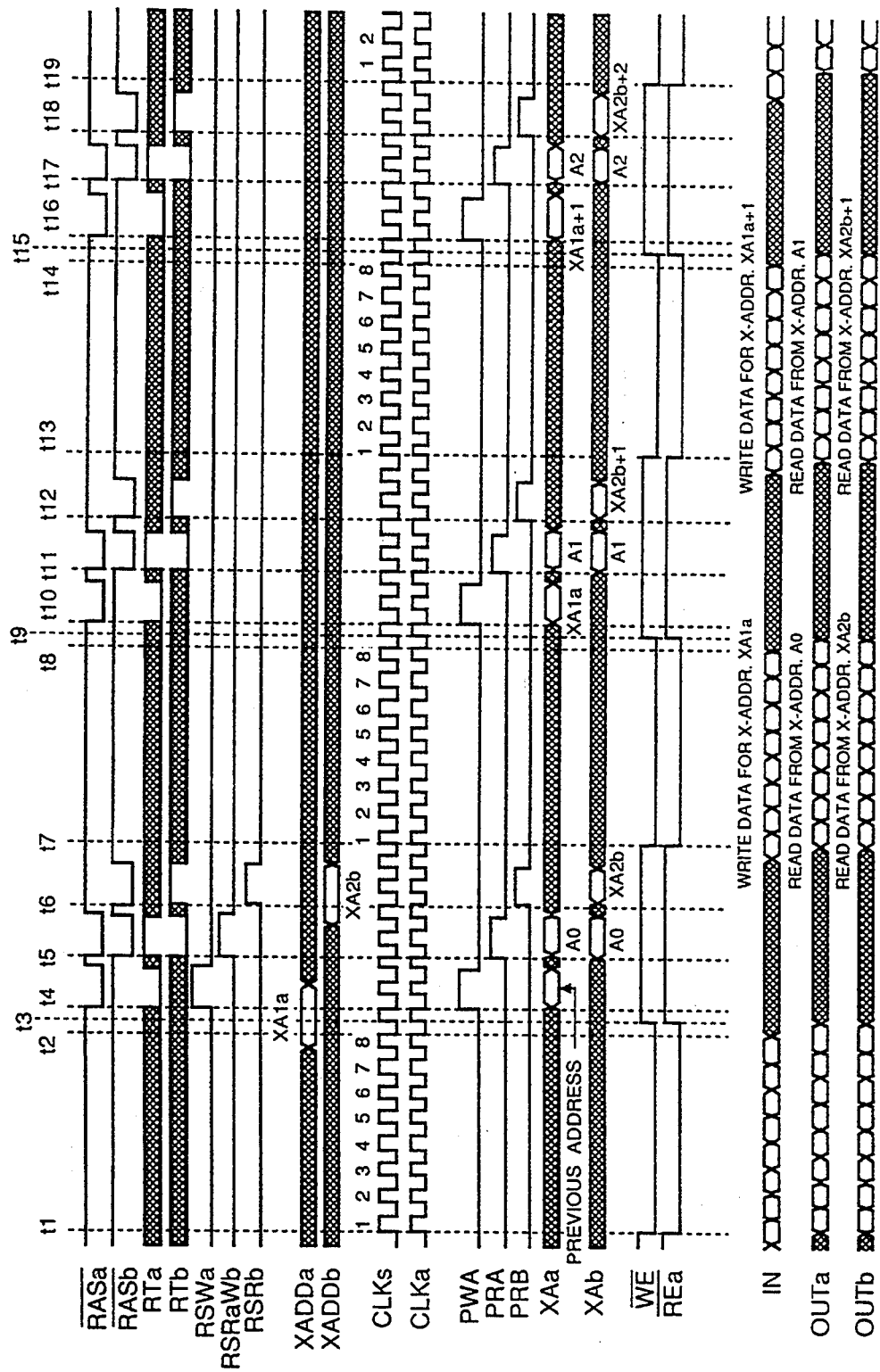
FIG. 65 is a timing diagram illustrating the operation of the thirty-first embodiment.
Figure 66:
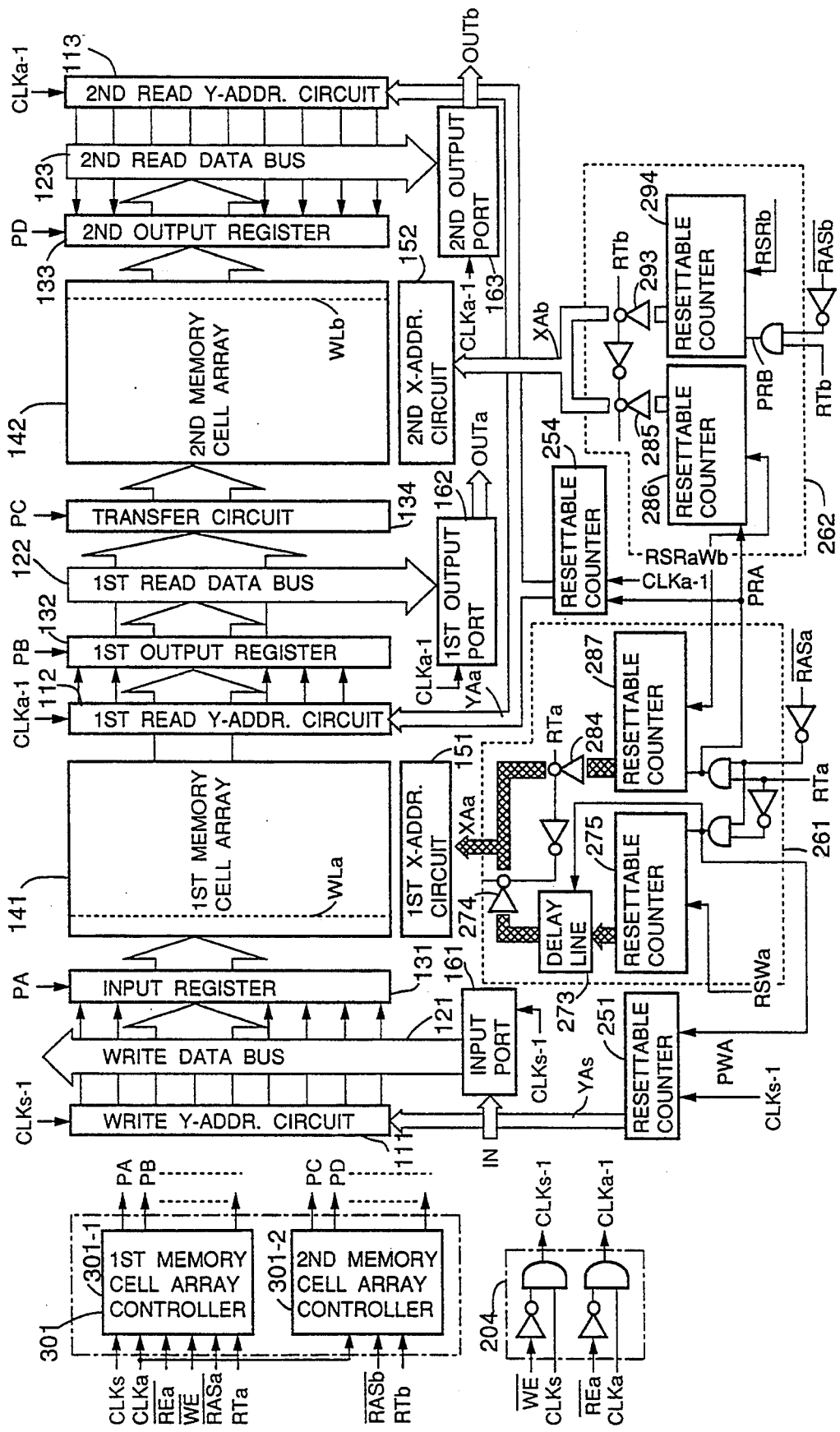
FIG. 66 is a block diagram illustrating an thirty-second embodiment of the invented multiple serial-access memory.
Figure 67:
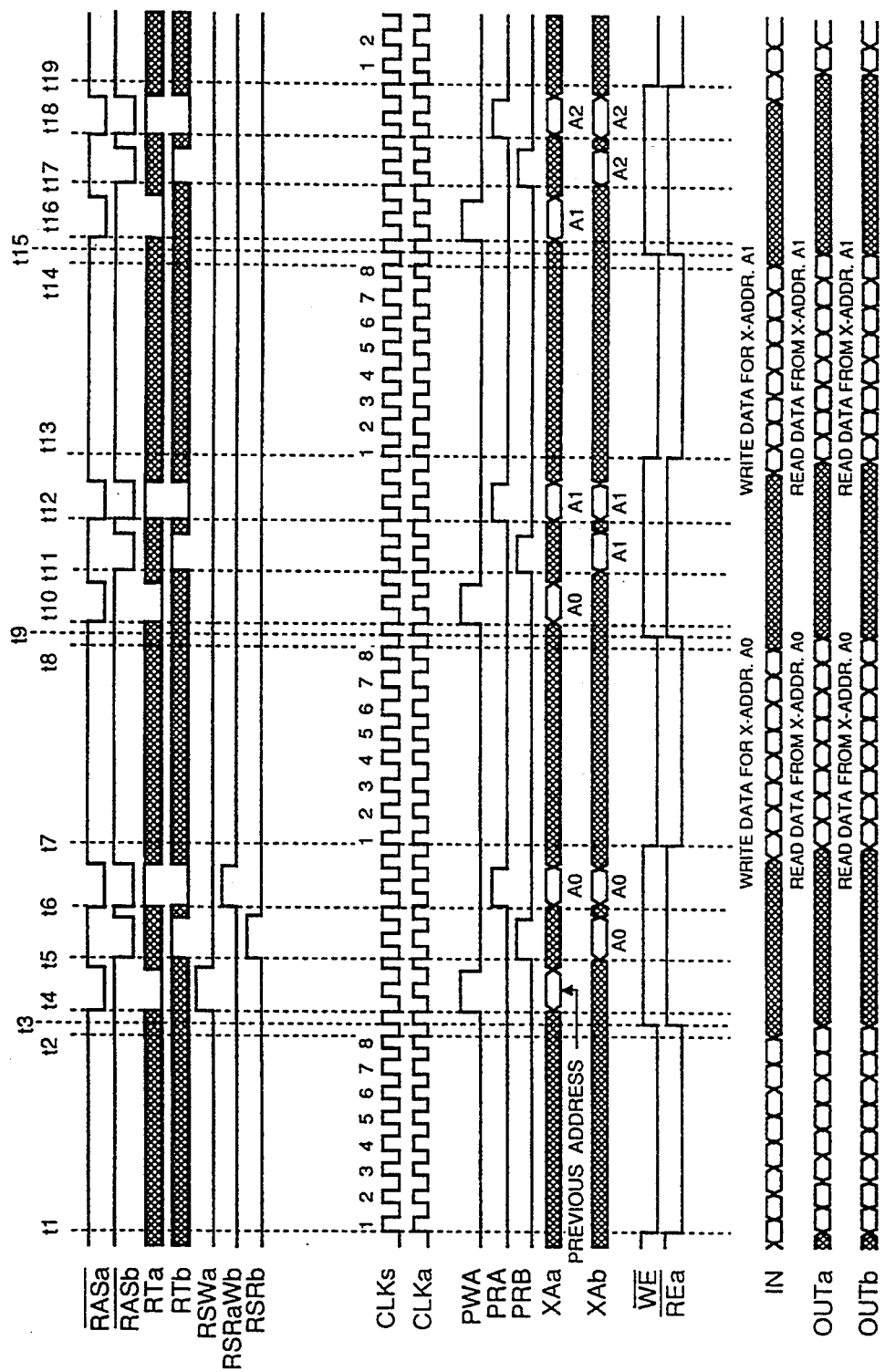
FIG. 67 is a timing diagram illustrating the operation of the thirty-second embodiment.

The same modifications that were made to the twenty-fifth embodiment to produce the twenty-ninth embodiment can also be made to the twenty-sixth, twenty-seventh, and twenty-eighth embodiments. These modifications produce a thirtieth embodiment, illustrated in FIGS. 62 and 63, a thirty-first embodiment, illustrated in FIGS. 64 and 65, and a thirty-second embodiment, illustrated in FIGS. 66 and 67. These embodiments operate like the twenty-sixth, twenty-seventh, and twenty-eighth embodiments, respectively, except that output from both OUTa and OUTb is enabled by REa and clocked by CLka.

Next a thirty-third embodiment of the invention will be described with reference to FIGS. 68 and 69. Elements that are identical to elements in the twenty-ninth embodiment have the same reference numerals as in FIG. 60.

Figure 68:
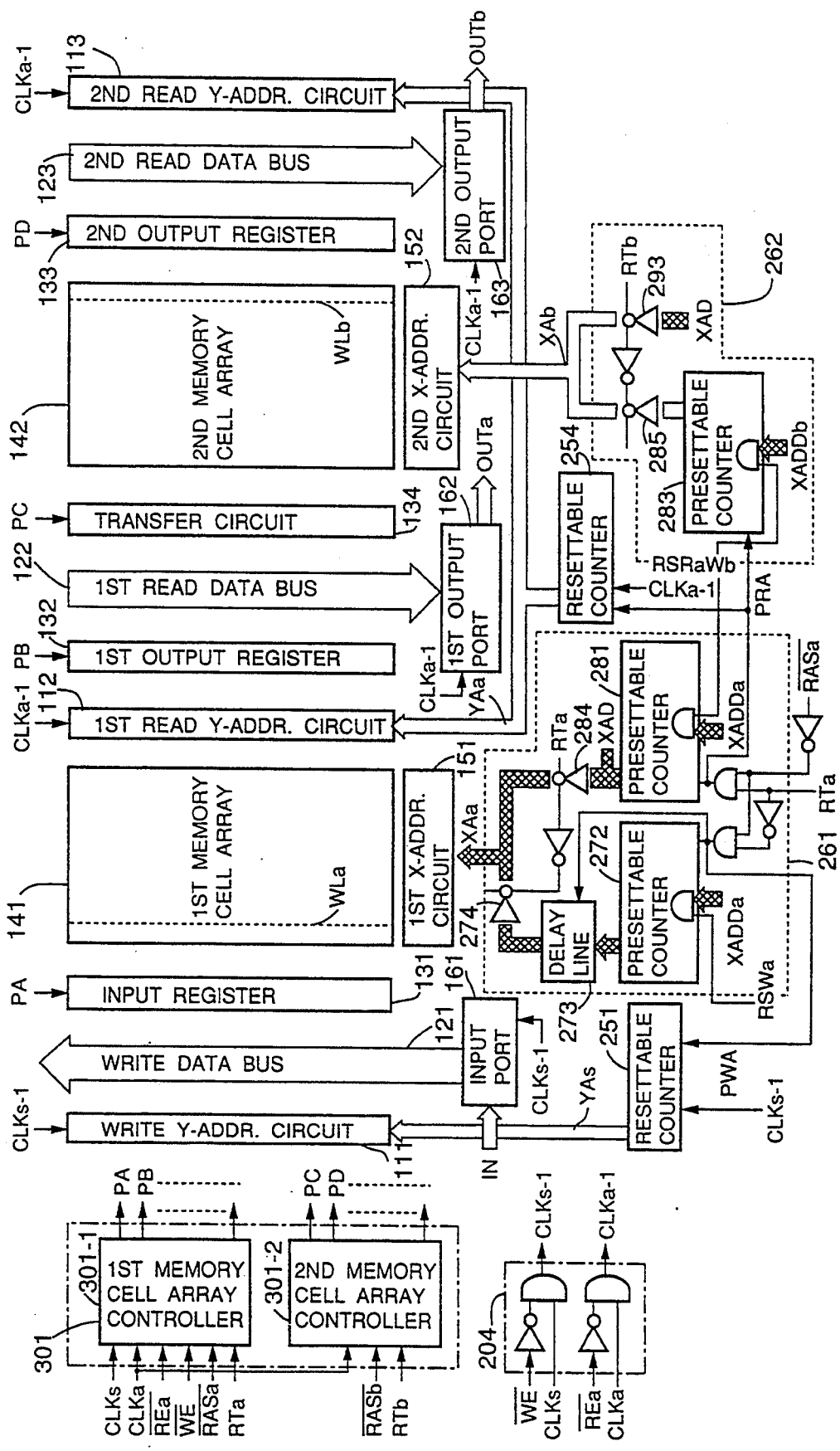
FIG. 68 is a block diagram illustrating an thirty-third embodiment of the invented multiple serial-access memory.

Referring to FIG. 68, in the thirty-third embodiment the X-address output from the first read counter 281 is supplied not only to the switch 284 but also to the switch 293 in the second X-address generator 262, which therefore has no read counter of its own. There is accordingly no RSRb signal; the RSRaWb signal resets the read X-addresses for both memory cell arrays 141 and 142 to zero.

Figure 69:
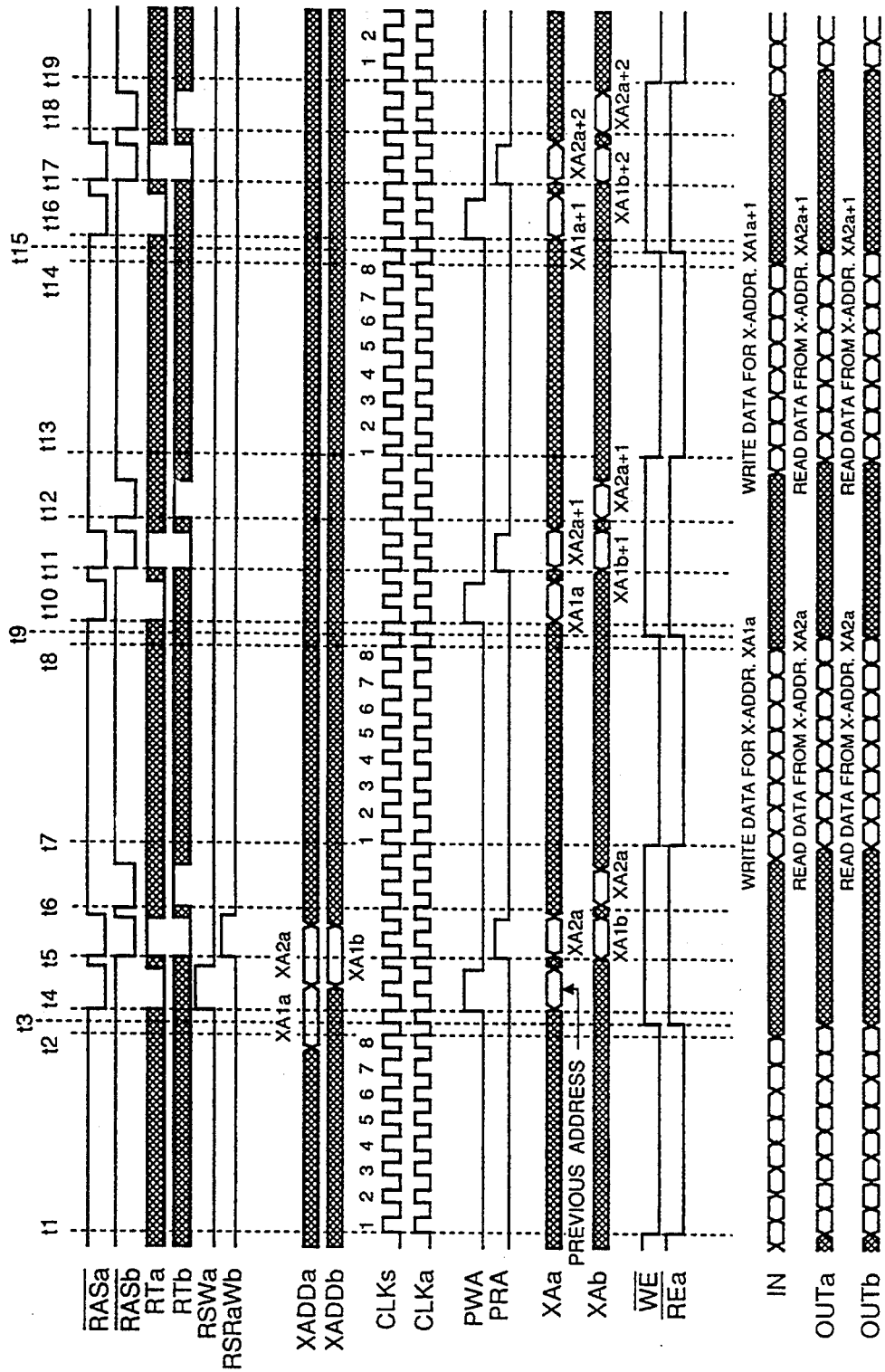
FIG. 69 is a timing diagram illustrating the operation of the thirty-third embodiment.

Referring to FIG. 69, the thirty-third embodiment operates like the twenty-ninth embodiment except that at time t6, data from memory cells with X-address XA2a in the second memory cell 142 are transferred to the second output register 133, so at times t7 to t8 the serial data output at OUTa and OUTb come from the same X-address XA2a in both the first and second memory cell arrays 141 and 142. This does not imply that the data are the same, because at time t5 data were transferred from X-address XA2a in the first memory cell array 141 to a different X-address XA1b in the second memory cell array 142. No address input is required at time t6.

Figure 70:
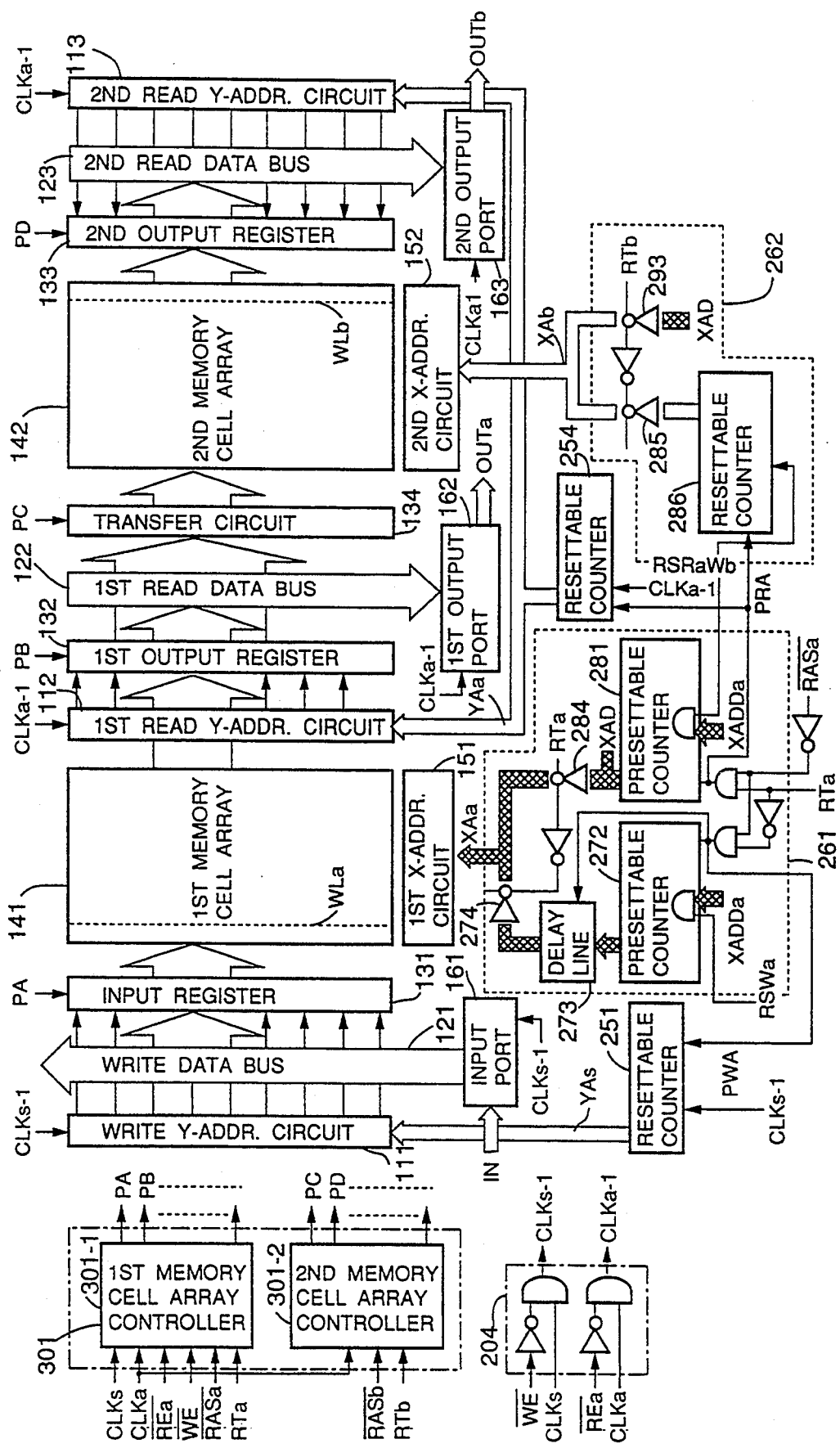
FIG. 70 is a block diagram illustrating an thirty-fourth embodiment of the invented multiple serial-access memory.
Figure 71:
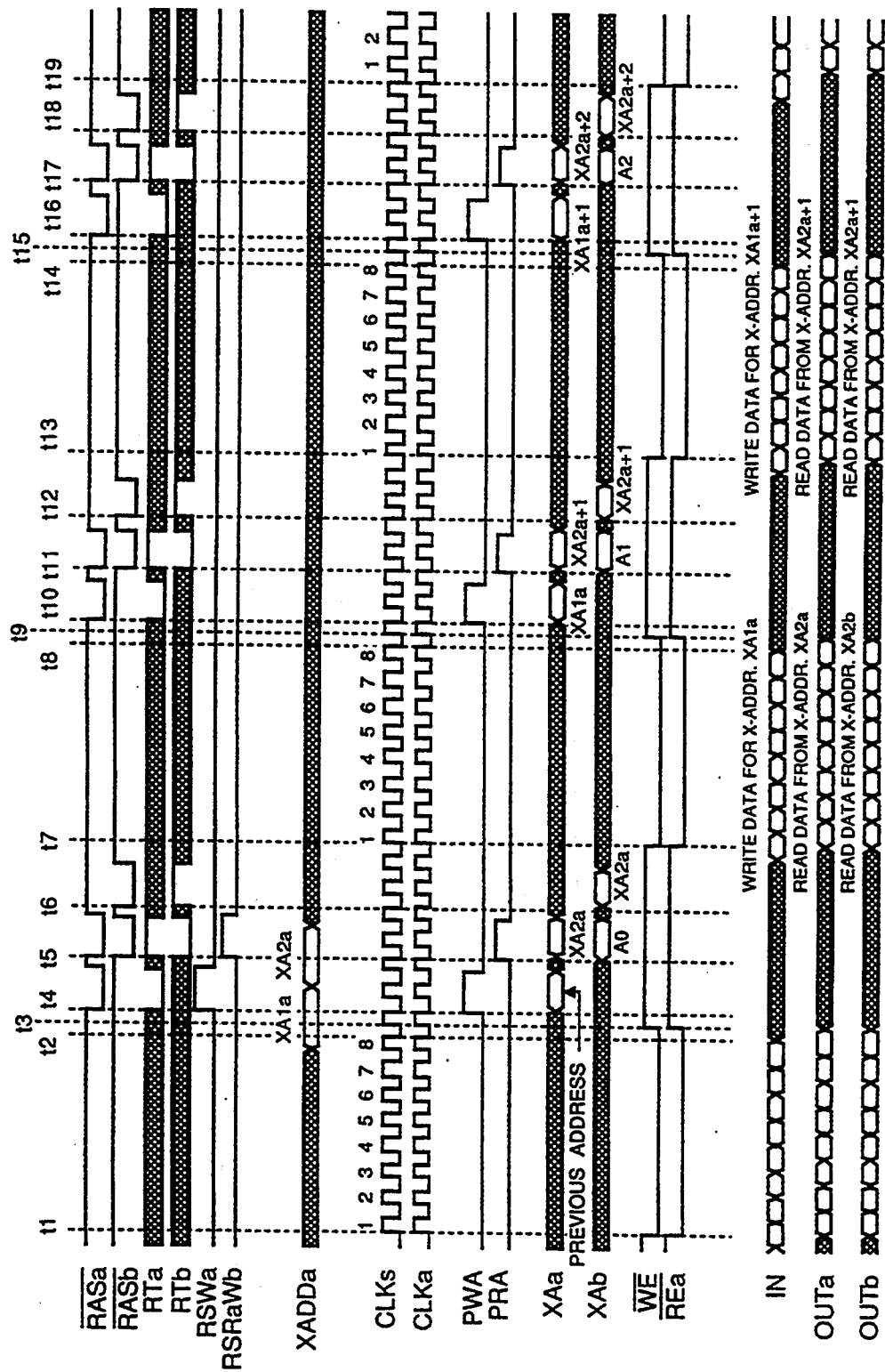
FIG. 71 is a timing diagram illustrating the operation of the thirty-fourth embodiment.
Figure 72:
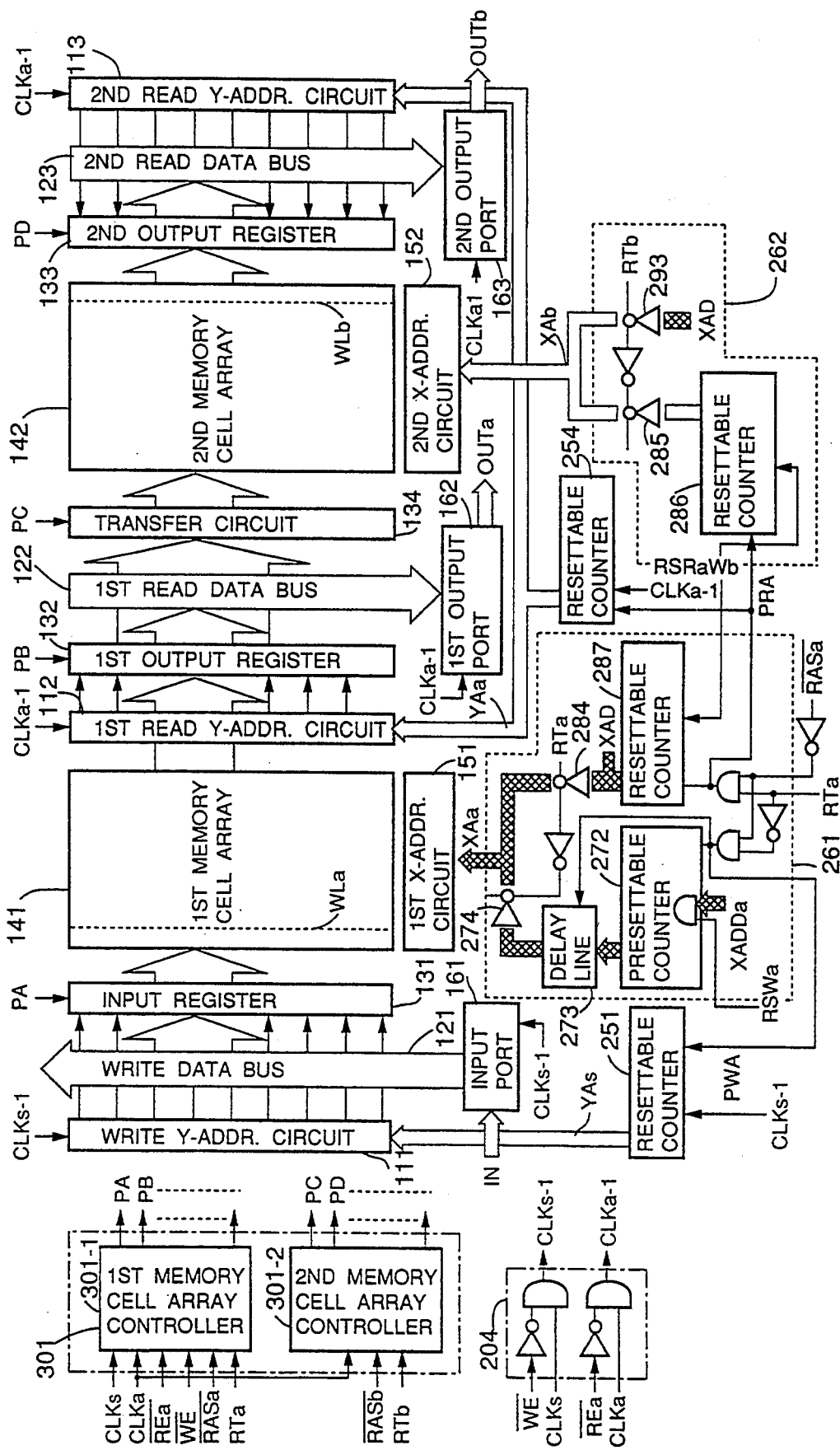
FIG. 72 is a block diagram illustrating an thirty-fifth embodiment of the invented multiple serial-access memory.
Figure 73:
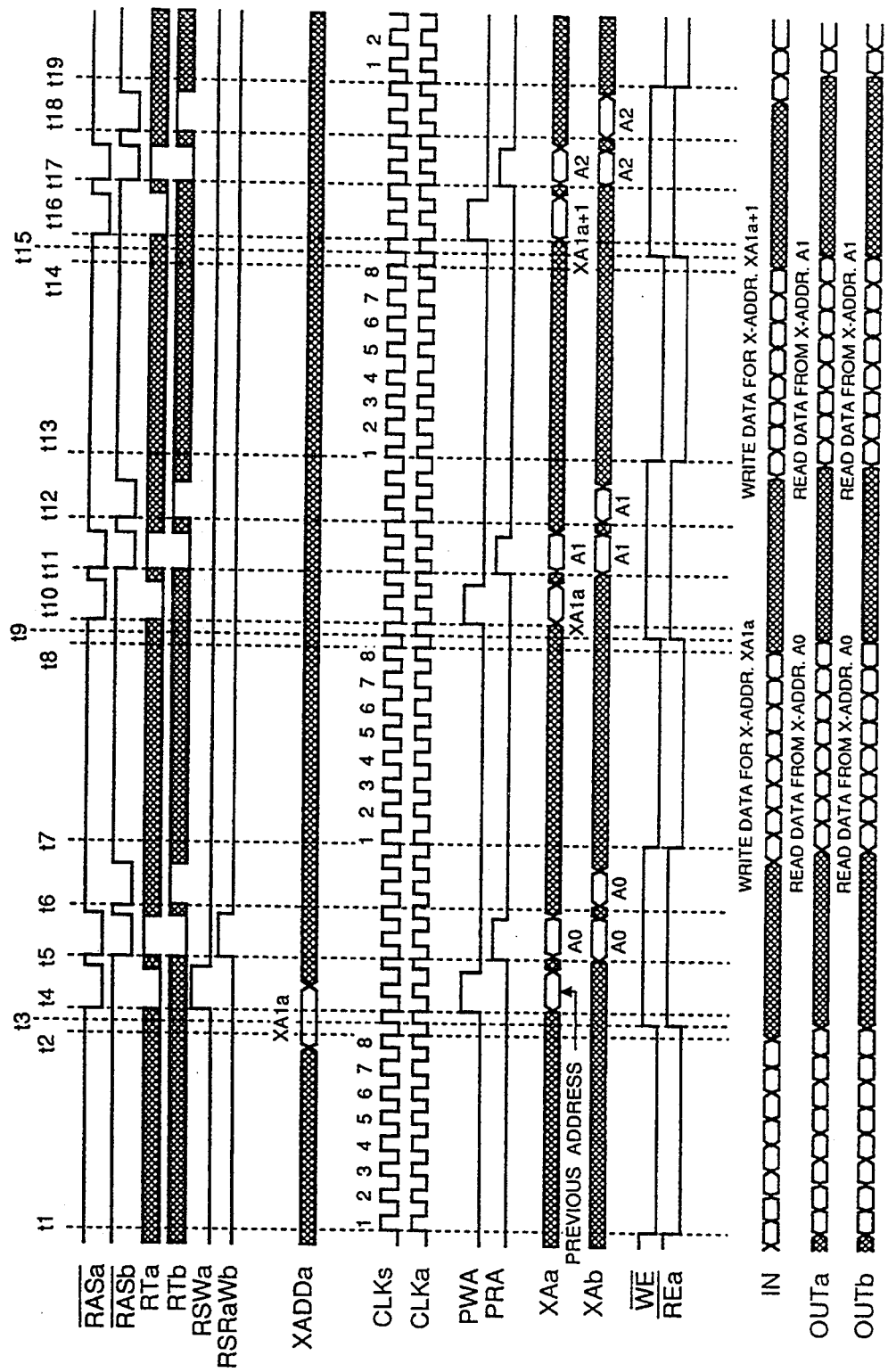
FIG. 73 is a timing diagram illustrating the operation of the thirty-fifth embodiment.
Figure 74:
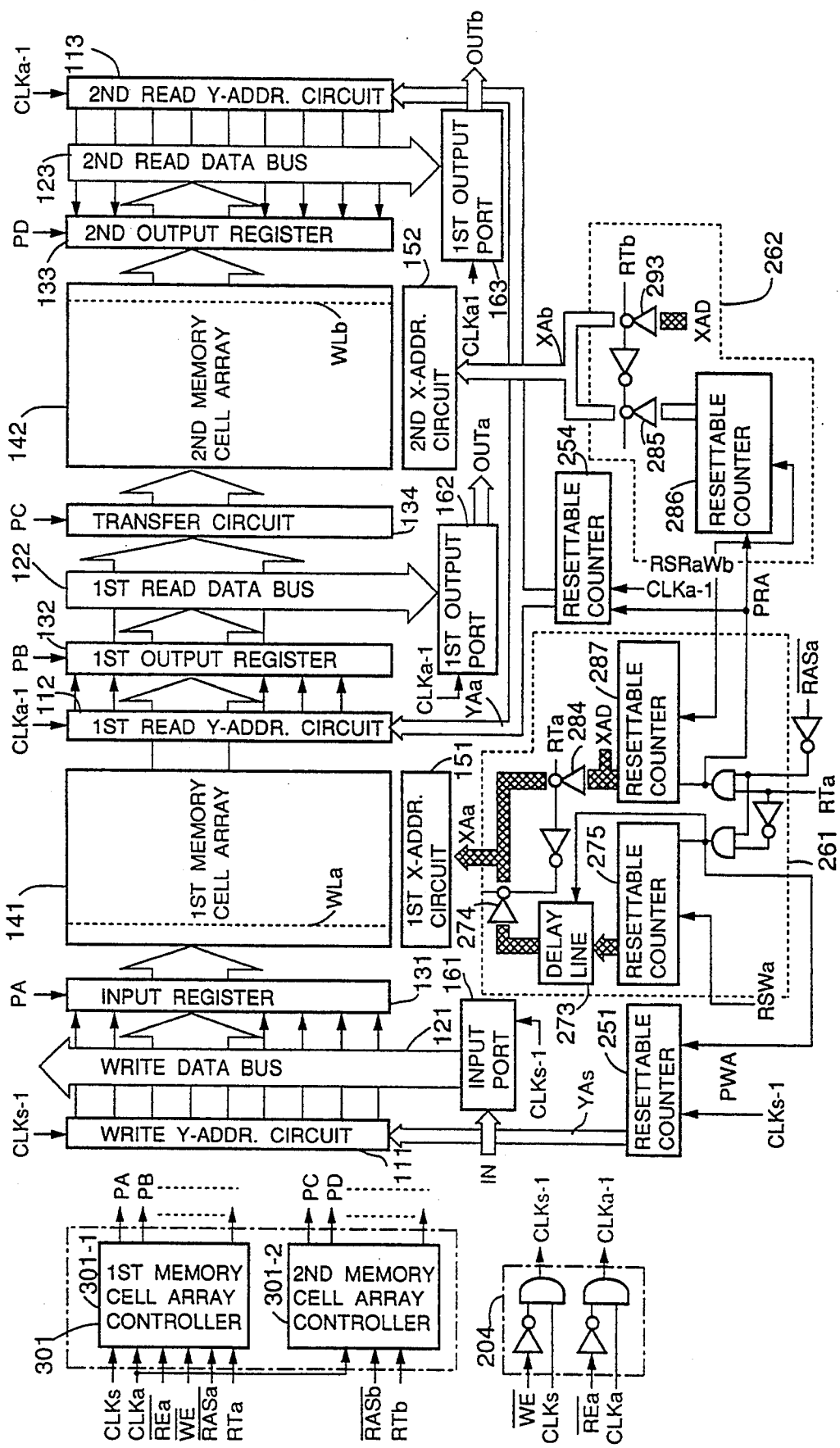
FIG. 74 is a block diagram illustrating an thirty-sixth embodiment of the invented multiple serial-access memory.
Figure 75:
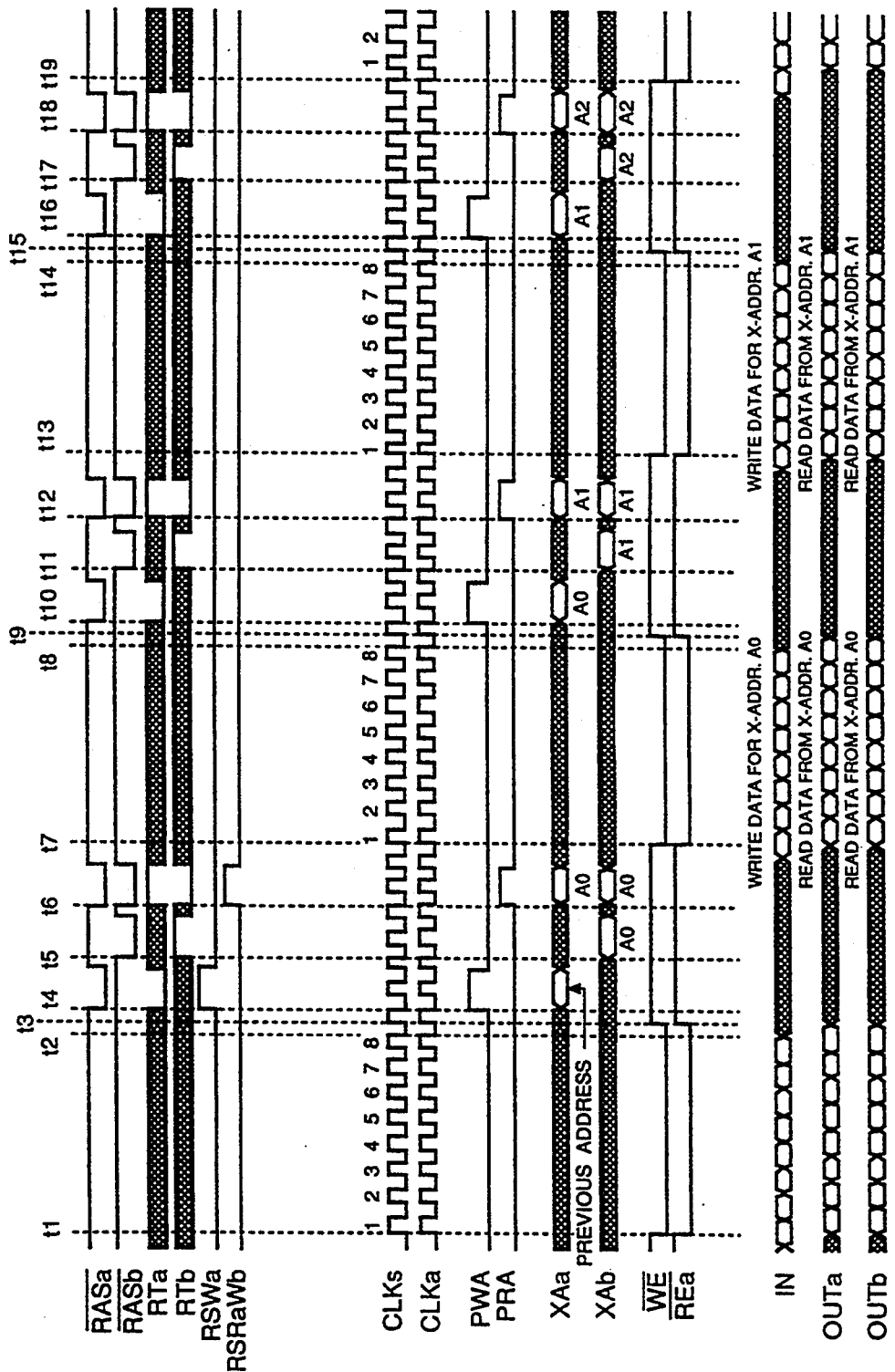
FIG. 75 is a timing diagram illustrating the operation of the thirty-sixth embodiment.

The same modifications that were made to the twenty-ninth embodiment to produce the thirty-third embodiment can also be made to the thirtieth, thirty-first, and thirty-second embodiments. These modifications produce a thirty-fourth embodiment, illustrated in FIGS. 70 and 71, a thirty-fifth embodiment, illustrated in FIGS. 72 and 73, and a thirty-sixth embodiment, illustrated in FIGS. 74 and 75. These embodiments operate like the thirtieth, thirty-first, and thirty-second embodiments, respectively, except that the same X-addresses apply to both OUTa and OUTb.

Next a thirty-seventh embodiment of the invention will be described with reference to FIGS. 76 and 77. Elements that are identical to elements in the thirty-third embodiment have the same reference numerals as in FIG. 68.

Figure 76:
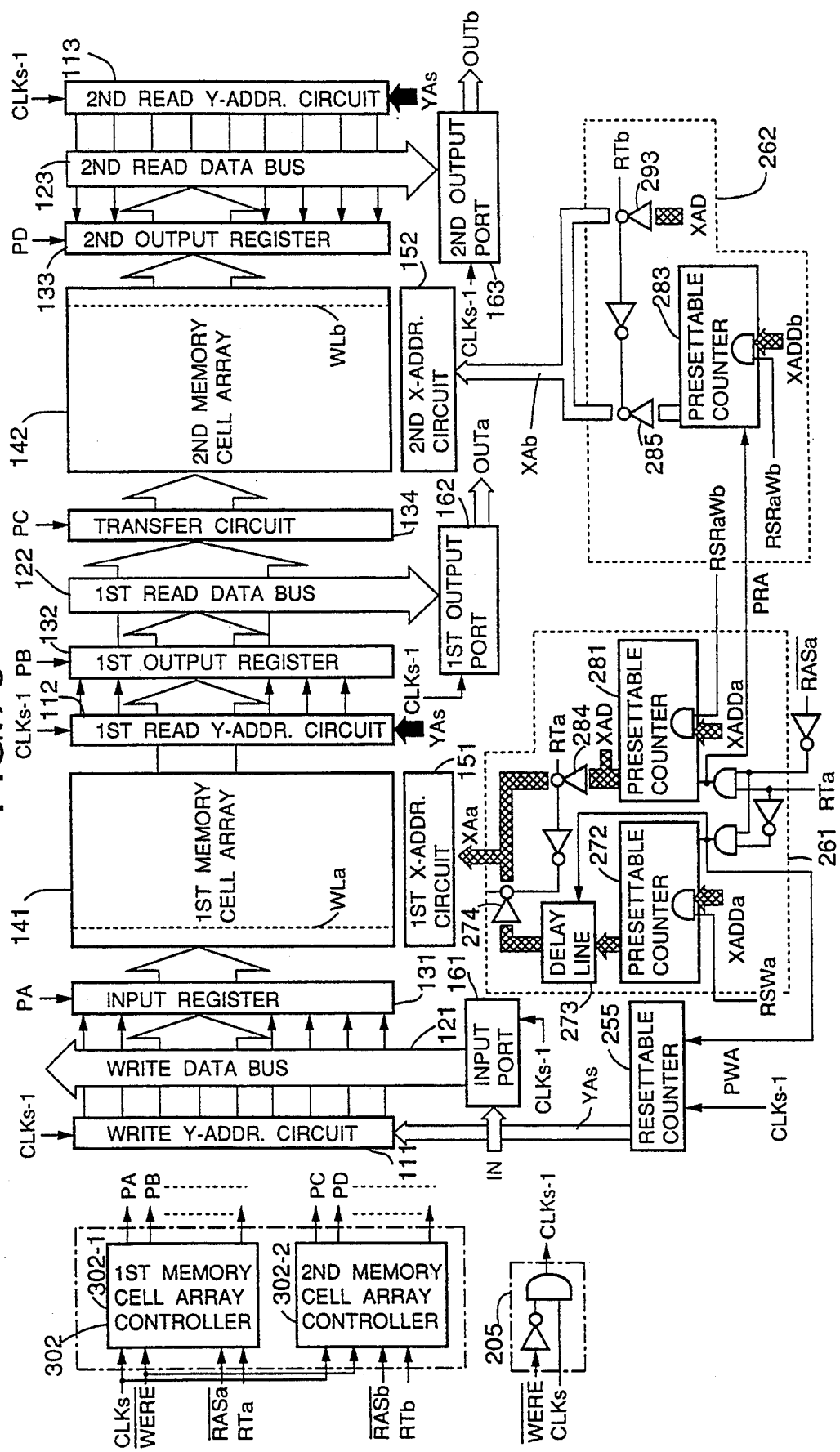
FIG. 76 is a block diagram illustrating an thirty-seventh embodiment of the invented multiple serial-access memory.

Referring to FIG. 76, the dual control circuit 302 in the thirty-seventh embodiment receives a single clock signal CLKs and a single read-write enable signal $\overline{\text{WERE}}$. The clock gating circuit 205 gates CLKs with $\overline{\text{WERE}}$ to produce a single internal clock signal CLKs-1 that is supplied to the write Y-addressing circuit 111, first read Y-addressing circuit 112, second read Y-addressing circuit 113, input port 161, first output port 162, second output port 163, and a resettable common Y-address counter 255. The Y-addresses YAs output from the common Y-address counter 255 are supplied to all three Y-addressing circuits 111, 112, and 113.

Figure 77:
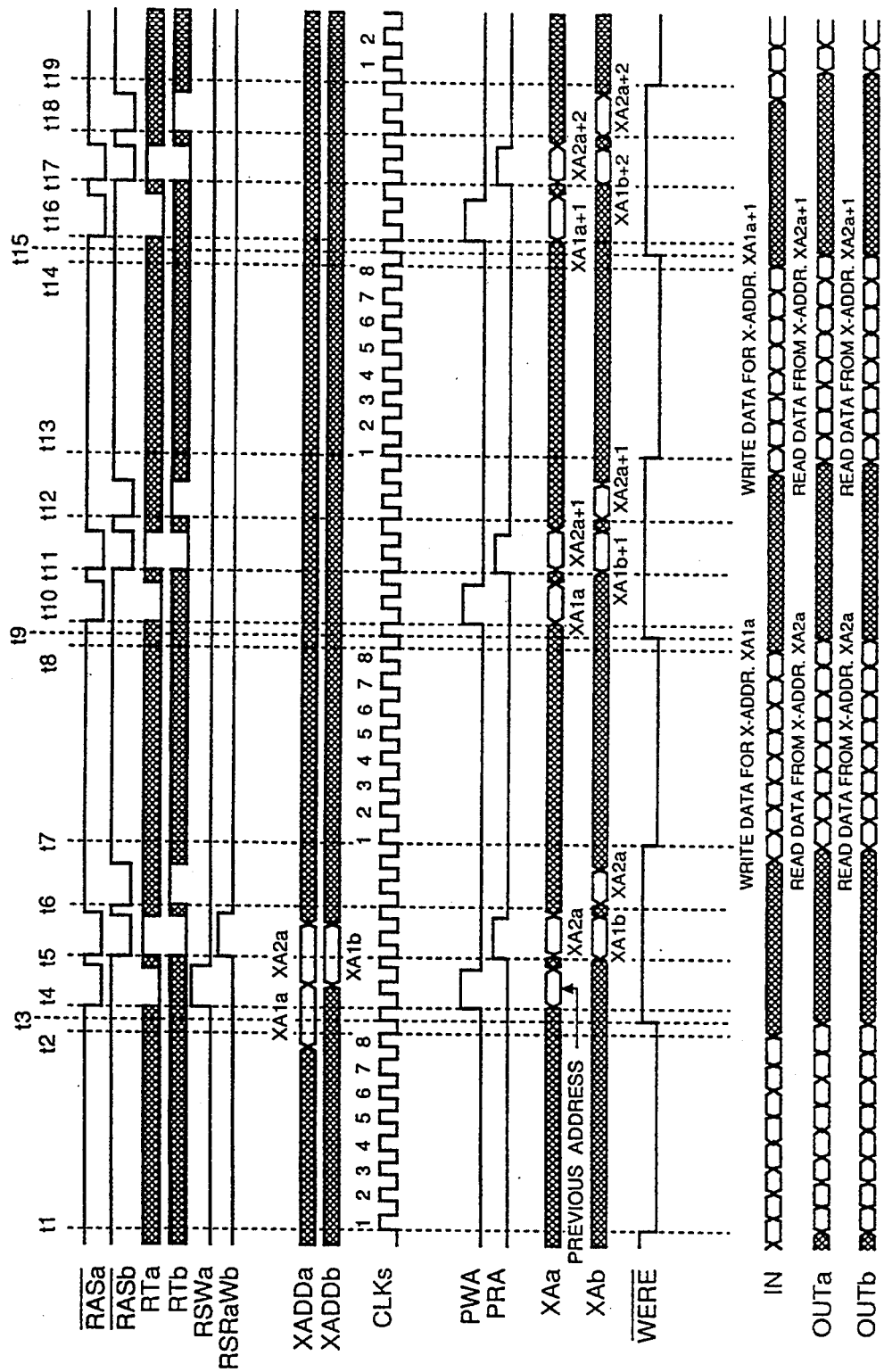
FIG. 77 is a timing diagram illustrating the operation of the thirty-seventh embodiment.

Referring to FIG. 77, the read-write enable signal $\overline{\text{WERE}}$ fulfills the functions of both the write enable signal $\overline{\text{WE}}$ and read enable signals $\overline{\text{REa}}$ and $\overline{\text{REb}}$ in the preceding embodiments, and input and output are both clocked by the same signal CLKs. Other than these differences, the thirty-seventh embodiment operates like the thirty-third embodiment.

Figure 78:
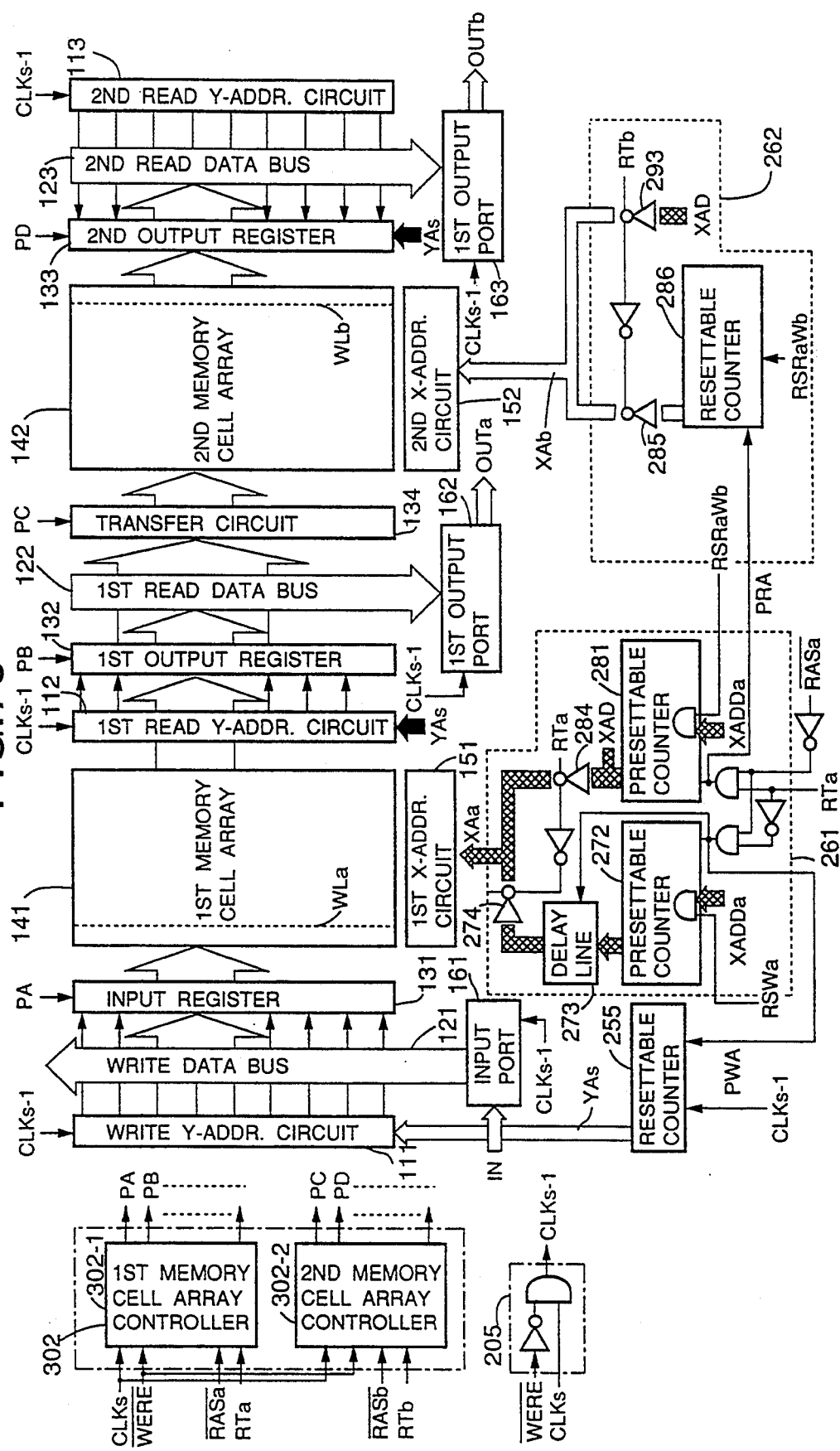
FIG. 78 is a block diagram illustrating an thirty-eighth embodiment of the invented multiple serial-access memory.
Figure 79:
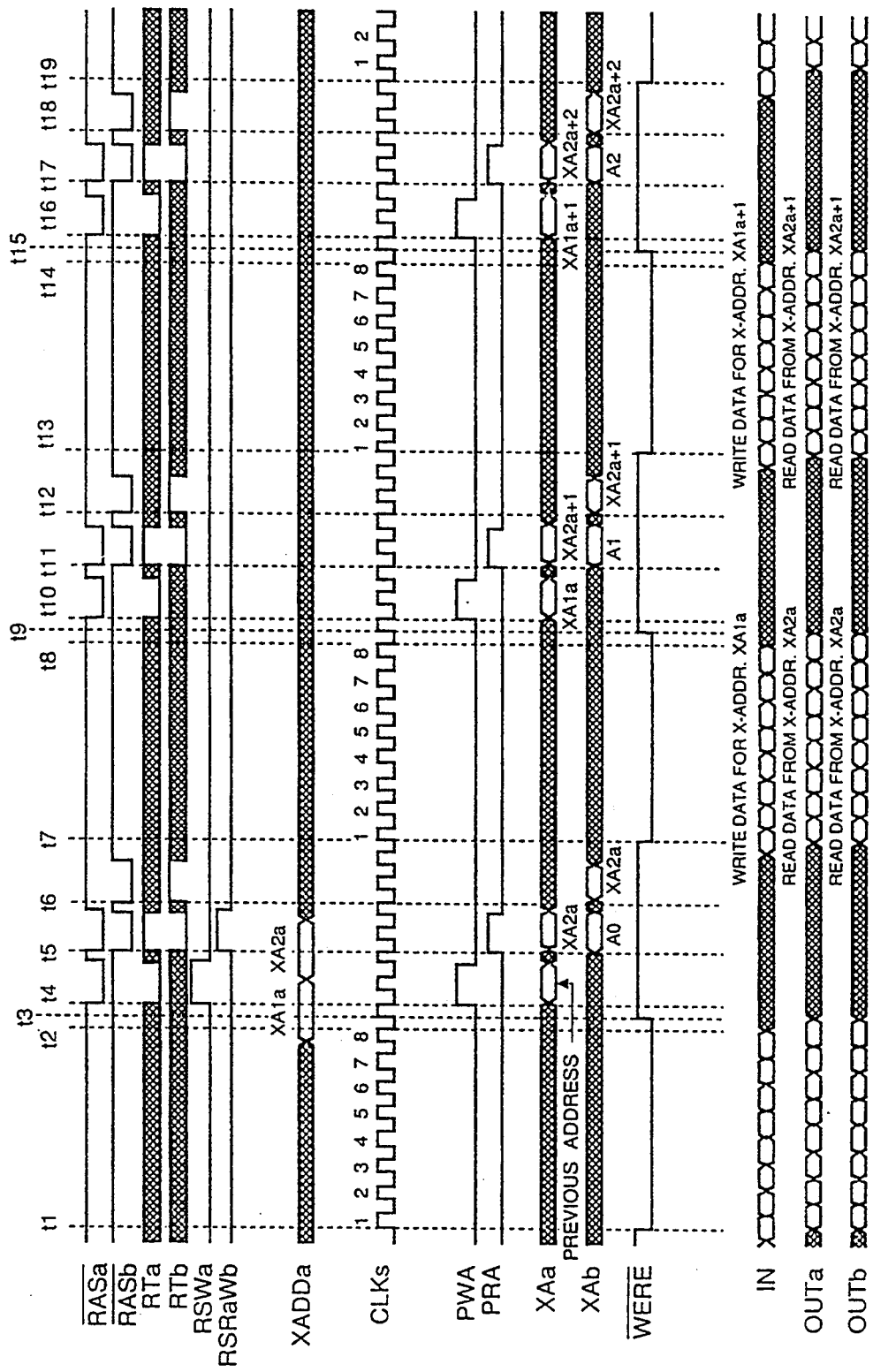
FIG. 79 is a timing diagram illustrating the operation of the thirty-eighth embodiment.
Figure 80:
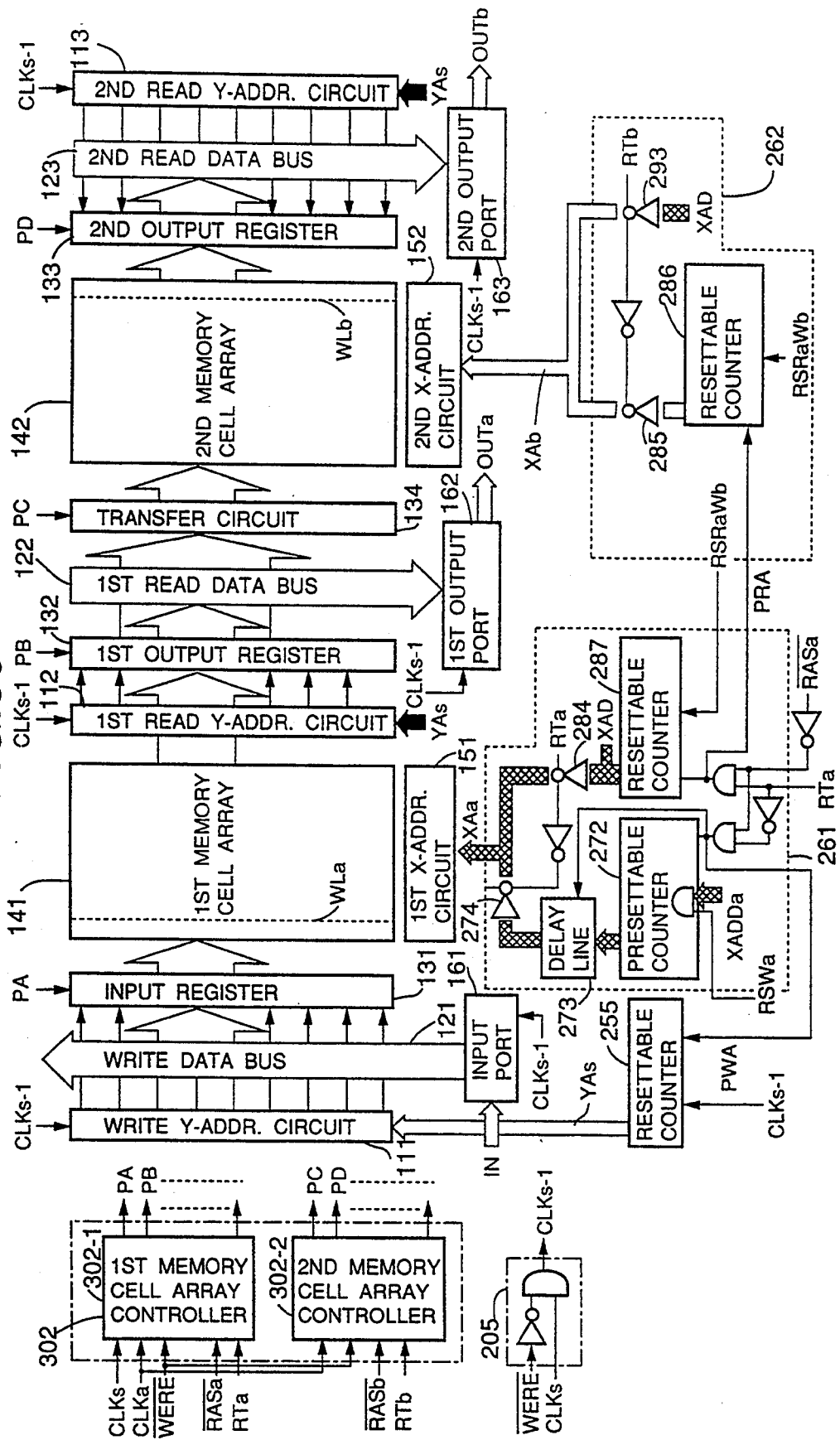
FIG. 80 is a block diagram illustrating an thirty-ninth embodiment of the invented multiple serial-access memory.
Figure 81:
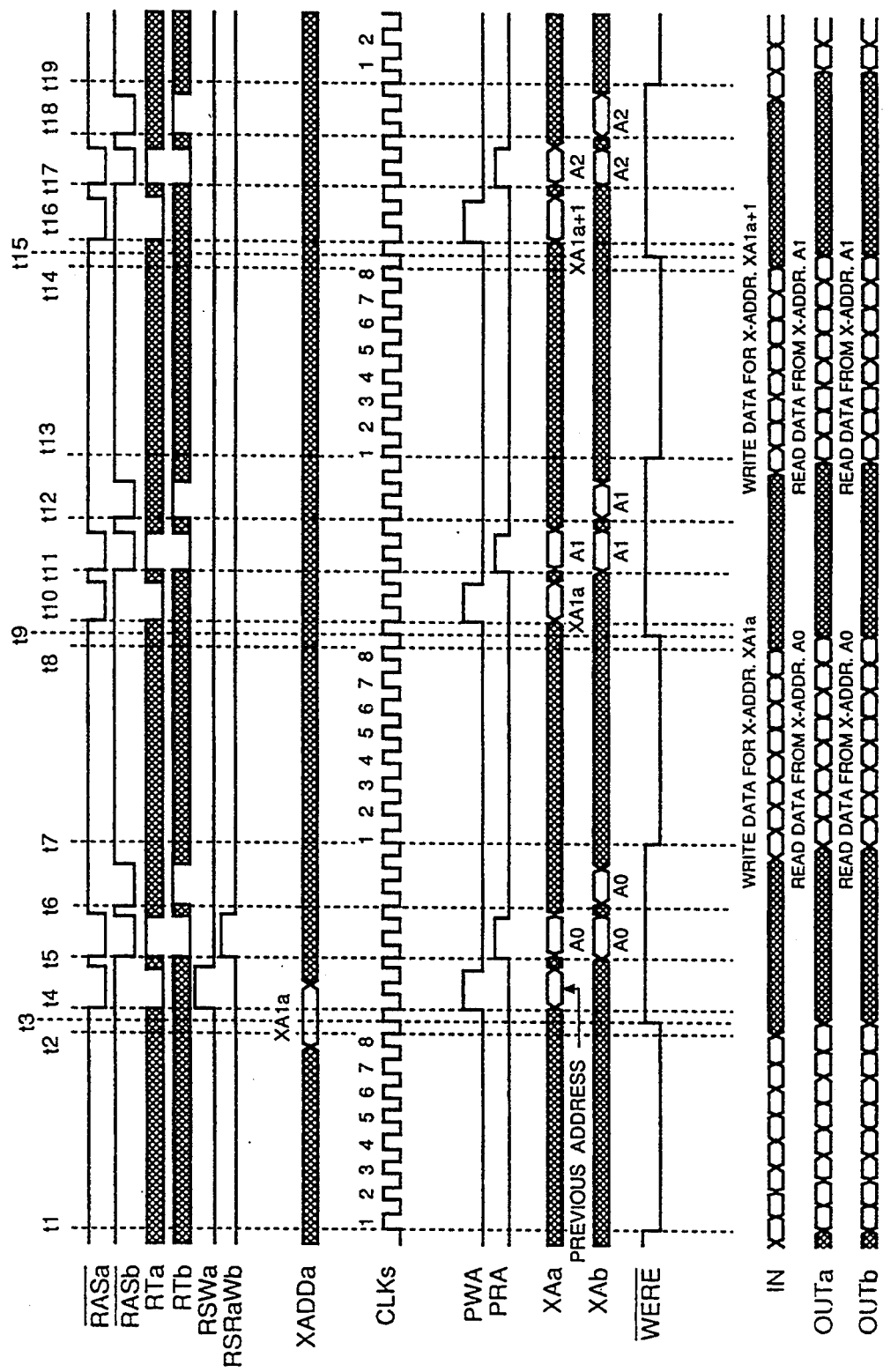
FIG. 81 is a timing diagram illustrating the operation of the thirty-ninth embodiment.
Figure 82:
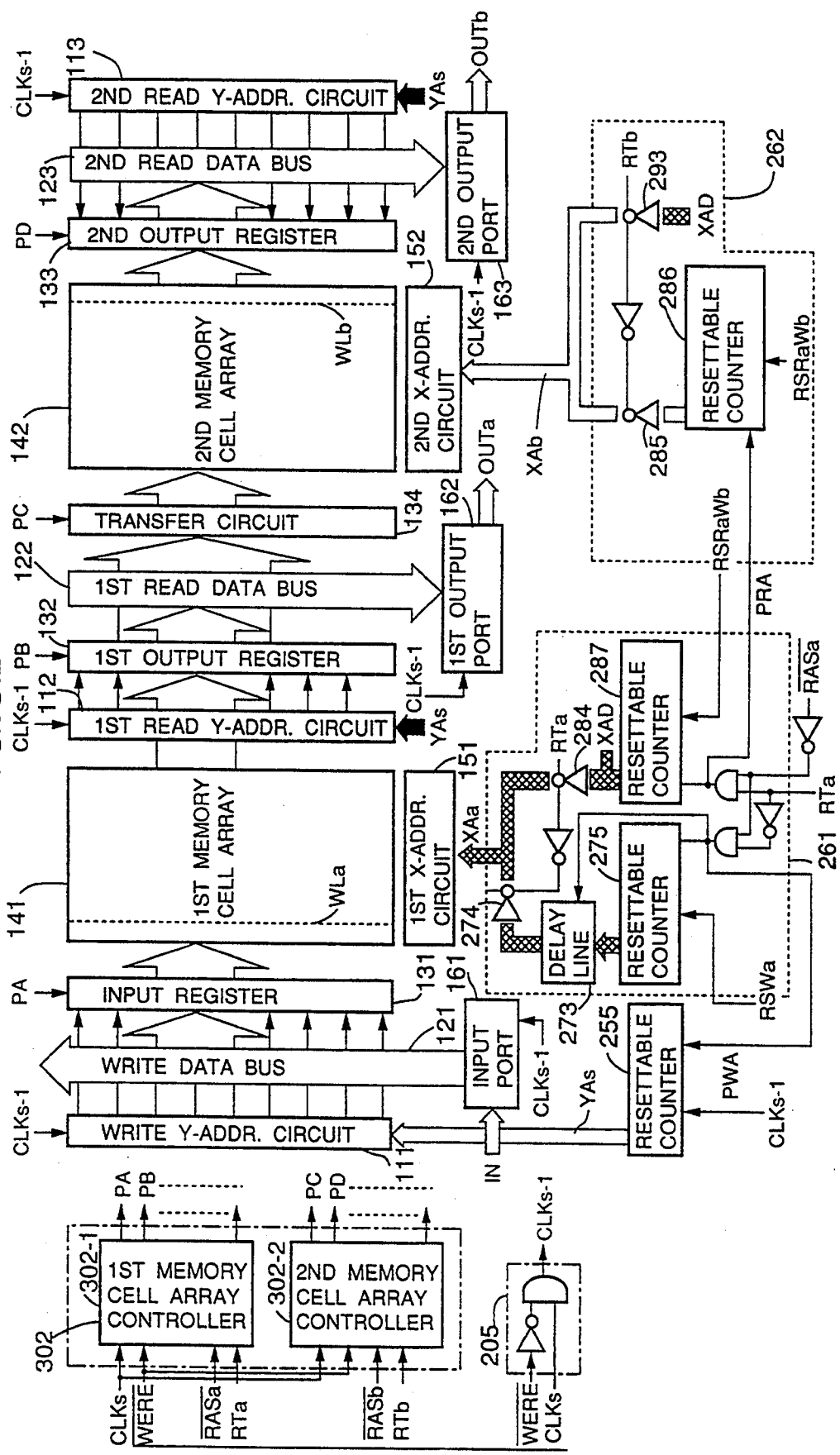
FIG. 82 is a block diagram illustrating an fortieth embodiment of the invented multiple serial-access memory.
Figure 83:
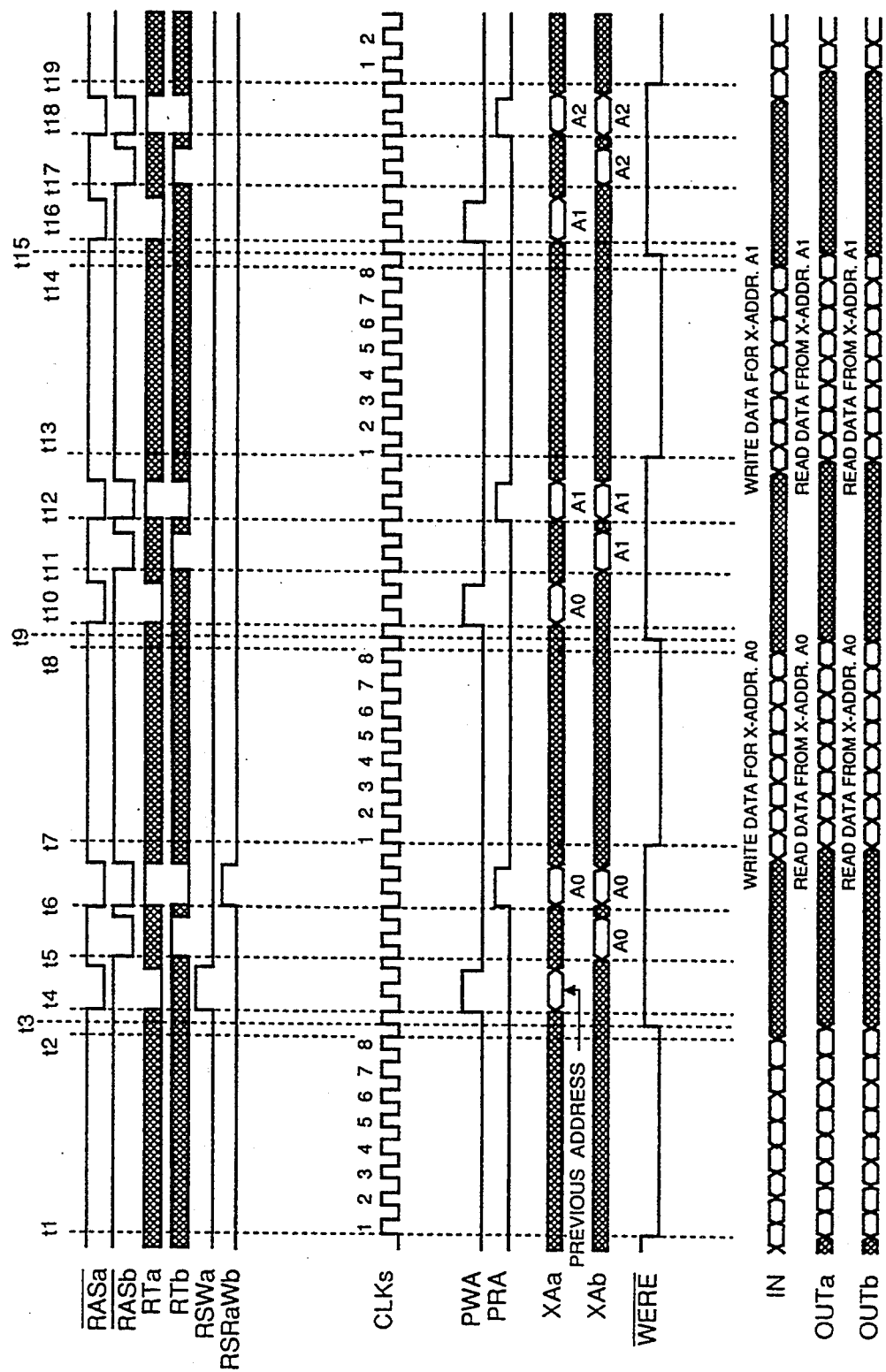
FIG. 83 is a timing diagram illustrating the operation of the fortieth embodiment.

The same modifications that were made to the thirty-third embodiment to produce the thirty-seventh embodiment can also be made to the thirty-fourth, thirty-fifth, and thirty-sixth embodiments. These modifications produce a thirty-eighth embodiment, illustrated in FIGS. 78 and 79, a thirty-ninth embodiment, illustrated in FIGS. 80 and 81, and a fortieth embodiment, illustrated in FIGS. 82 and 83. These embodiments operate like the thirty-fourth, thirty-fifth, and thirty-sixth embodiments, respectively, except that input and output are both enabled by $\overline{\text{WERE}}$ and both clocked by CLKs.

The foregoing embodiments by no means exhaust the scope of the invention. Various features of the second to twenty-fourth embodiments can be combined with the twenty-fifth to fortieth embodiments, for example. Input, output, and data transfer can be controlled by signals or combinations of signals other than those illustrated in the drawings. Static memory cells or other types of memory cells can be used instead of dynamic memory cells. The number of memory cell arrays integrated on a single substrate can be increased from two or three or a higher number, which can be coupled in a series, or in various other topologies.

Input and output were described as synchronized with the rising edge of the clock signals, but of course they can be synchronized with the falling edges instead. The Y-addressing circuits 111, 112, and 113 can be structured as shift registers that function as data pointers; such shift-register addressing circuits are well-known from the multiport DRAM art. In this case the Y-address generators need only provide a signal to initialize the Y-addressing circuits.

Instead of disabling the input port 161, first output port 162, and second output port 163, the DIS signal produced by the input/output disabling circuit 201 in the fourth, fifth, and various other embodiments can disable the Y-addressing circuits, dual control circuits, or other circuits to prevent input and output of serial data. The first read Y-address counter and second write X-addresses counter in the twenty-seventh, twenty-eighth, and similar embodiments were shown as two separate counters, but they can be combined into a single counter. These and many further modifications, which will be apparent to those skilled in the art, can be made without departing from the spirit and scope of the invention as set forth in the following claims.

What is claimed is:

1. A serial access memory fabricated as a single integrated circuit, comprising:
   a plurality of memory cell arrays for storing data;
   a like plurality of serial output ports coupled for serial output of data from respective memory cell arrays;
   at least one serial input port coupled for input of serial data to one of said memory cell arrays; and
   at least one transfer circuit coupled to transfer data from one of said memory cell arrays to another of said memory cell arrays.

2. The memory of claim 1, wherein said transfer circuit transfers data in parallel form.

3. The memory of claim 1, wherein for each serial output port among said plurality of serial output ports, said memory receives a corresponding read enable signal to which said serial output port responds by:
   outputting successive serial data while said read enable signal is active; and
   continuing to output a last data of the successive serial data that is output before said enable signal is changed from active to inactive, while said read enable signal is inactive.

4. The memory of claim 1, wherein for each serial output port among said plurality of serial output ports, said memory receives a corresponding output enable signal to which said serial output port responds by:
   outputting successive serial data while said output enable signal is active; and
   going to a high-impedance state while said output enable signal is inactive.

5. The memory of claim 1, wherein for each serial output port among said plurality of serial output ports, said memory receives a corresponding read enable signal and a corresponding output enable signal, to which said serial output port responds by:
   outputting successive serial data while said read enable signal and said output enable signal are both active;

continuing to output a last data of the successive serial data that is output before said enable signal is changed from active to inactive, while said read enable signal is inactive and said output enable signal is active; and going to a high-impedance state while said output enable signal is inactive.

6. The memory of claim 1, wherein said memory receives a chip enable signal and responds by disabling serial input at said serial input port and serial output at all of said serial output ports while said chip enable signal is inactive.

7. The memory of claim 1, wherein said memory receives a clock signal and receives data at said input port in synchronization with said clock signal.

8. The memory of claim 7, wherein said memory outputs data at all of said output ports in synchronization with said clock signal.

9. The memory of claim 1, wherein said memory receives a read clock signal and outputs data from all of said output ports in synchronization with read clock signal.

10. The memory of claim 1, wherein said memory receives a plurality of read clock signals comprising, for each of said output ports, a corresponding read clock signal, and outputs data from each of said output ports in synchronization with the corresponding read clock signal.

11. A serial access memory fabricated as a single integrated circuit, comprising:

a plurality of memory cell arrays for storing data, said memory cell arrays being arranged in a series from a first memory cell array to a last memory cell array, each memory cell array except said last memory cell array being followed by a respective next memory cell array in said series;

a like plurality of serial output ports coupled for serial output of data transferred out of corresponding memory cell arrays;

a serial input port coupled to input serial data for transfer into said first memory cell array; and for each memory cell array except the last memory cell array in said series, a corresponding transfer circuit coupled to transfer data from that memory cell array to the next memory cell array in said series.

12. The memory of claim 11, wherein said memory receives, corresponding to said plurality of memory cell arrays, a like plurality of row address strobe signals and a like plurality of read transfer signals and a like plurality of read transfer signals so that each row address signal has a corresponding read transfer signal and a corresponding memory cell array, and when a row address strobe signal is active said memory responds by:

transferring data into the corresponding memory cell array if the corresponding read transfer signal is inactive; and transferring data out of the corresponding memory cell array if the corresponding read transfer signal is active.

13. The memory of claim 11, wherein said memory receives a row address strobe signal and, corresponding to said plurality of memory cell arrays, a like plurality of read transfer signals, so that each memory cell array has a corresponding read transfer signal, and when said row address strobe signal is active said memory responds by:

transferring data into each memory cell array for which the corresponding read transfer signal is inactive; and transferring data out of each memory cell array for which the corresponding read transfer signal is active.

14. The memory of claim 11, wherein each of said memory cell arrays comprises a matrix of memory cells and each memory cell is identified by an X-address and a Y-address.

15. The memory of claim 14, further comprising, corresponding to said plurality of memory cell arrays, a like plurality of X-addressing circuits, each X-addressing circuit being coupled to a corresponding memory cell array and selecting memory cells therein according to their X-addresses.

16. The memory of claim 15, wherein each transfer circuit simultaneously transfers data obtained from all memory cells selected by the X-addressing circuit of the corresponding memory cell array to memory cells selected by the X-addressing circuit of the next memory cell array.

17. The memory of claim 15, further comprising, for said first memory cell array:

an input register having storage elements corresponding to Y-addresses of said first memory cell array, coupled to receive data in serial form from said serial input port, temporarily store the data received, and provide the same data in parallel form to memory cells selected by the X-addressing circuit of said first memory cell array; and a write Y-addressing circuit for receiving Y-address signals and selecting corresponding storage elements in said input register for storing said data.

18. The memory of claim 17, further comprising, corresponding to said plurality of memory cell arrays, a like plurality of output registers, each output register being coupled to a corresponding memory cell array, for receiving data in parallel form from memory cells selected by said X-addressing circuits, temporarily storing the data received, and providing the same data in serial form to corresponding serial output ports.

19. The memory of claim 18, wherein each memory cell array has pair of complementary bit lines, each pair of complementary bit lines being identified by a Y-address and coupled to memory cells having the same Y-address, and each said output register separately comprises a plurality of flip-flops coupled to said pairs of complementary bit lines in the corresponding memory cell array.

20. The memory of claim 19, wherein for each memory cell array except that the last memory cell array in said series, the corresponding transfer circuit comprises pairs of transistors coupling said flip-flops in the corresponding output register to corresponding pairs of bit lines in the next memory cell array, thereby enabling data to be transferred from said memory cell array to said corresponding output register and to the next memory cell array simultaneously.

21. The memory of claim 18, further comprising, corresponding to said plurality of memory cell arrays, a like plurality of read Y-addressing circuits, each read Y-addressing circuit being coupled to a corresponding output register for selection of data stored therein to be provided to corresponding serial output ports.

22. The memory of claim 21, further comprising a write Y-address generator for generating Y-addresses and providing same to said write Y-addressing circuit.

23. The memory of claim 22, wherein said write Y-address generator also supplies Y-addresses to the read Y-addressing circuits of all of said memory cell arrays.

24. The memory of claim 22, wherein said write Y-address generator latches external Y-address signals.

25. The memory of claim 22, wherein said write Y-address generator comprises a resettable counter.

26. The memory of claim 25, wherein the resettable counter of said write Y-address generator is reset to zero when data are transferred into said first memory cell array.

27. The memory of claim 22, further comprising a read Y-address generator for generating a Y-addresses and providing same to the read Y-addressing circuits of all of said memory cell arrays.

28. The memory of claim 27, wherein said read Y-address generator latches external Y-address signals.

29. The memory of claim 27 wherein said read Y-address generator comprises a resettable counter.

30. The memory of claim 29, wherein the resettable counter of said read Y-address generator is reset to zero when data are transferred out of said first memory cell array.

31. The memory of claim 21, further comprising, corresponding to said plurality of memory cell arrays, a like plurality of read Y-address generators for generating Y-addresses and providing same to the read Y-addressing circuits of respective memory cell arrays.

32. The memory of claim 31, wherein each of said read Y-address generators separately latches external Y-address signals.

33. The memory of claim 31, wherein each of said read Y-address generators separately comprises a resettable counter.

34. The memory of claim 33, wherein the resettable counter of each of said read Y-address generators is reset to zero when data are transferred out of the corresponding memory cell array.

35. The memory of claim 15, further comprising an X-address generator for latching external X-address signals and providing same to the X-addressing circuits of all of said memory cell arrays.

36. The memory of claim 15, further comprising, corresponding to the plurality of memory cell arrays, a like plurality of X-address generators arranged in a series from a first X-address generator to a last X-address generator, wherein each X-address generator has a corresponding memory cell array and provides X-addresses to the X-addressing circuit of the corresponding memory cell array.

37. The memory of claim 36, wherein each of said X-address generators separately latches external X-address signals.

38. The memory of claim 36, wherein each of said X-address generators separately comprises a write counter that generates X-addresses for use when data are transferred into the corresponding memory cell array.

39. The memory of claim 38, wherein said memory receives a plurality of initializing signals for initializing said X-address generators.

40. The memory of claim 39, wherein said first X-address generator also comprises a delay line for temporarily storing the X-addresses generated by the write counter of said first X-address generator, thereby permitting initialization of the write counter in said first X-address generator to precede input of corresponding data at said input port.

41. The memory of claim 39, wherein the write counter in said fist X-address generator is incremented when time data are transferred into said first memory cell array.

42. The memory of claim 39 wherein, when data are transferred out of each memory cell array except the last memory cell array, the write counter in the X-address generator of the next memory cell array is incremented.

43. The memory of claim 39, wherein the write counter in each of said X-address generators is initialized to zero.

44. The memory of claim 39, wherein the write counter in each of said X-address generators is initialized according to an external X-address signal.

45. The memory of claim 39, wherein said first X-address generator also comprises a read counter that generates X-addresses for use when data are transferred out of all of said memory cell arrays.

46. The memory of claim 45, wherein the read counter of said first X-address generator is incremented each time data are transferred out of said first memory cell array.

47. The memory of claim 45, wherein said plurality of initializing signals comprises a separate initializing signal for initializing the write counter in each of said X-address generators the read counter in said first X-address generator being initialized when the write counter in the next X-address generator is initialized.

48. The memory of claim 47, wherein the read counter in said first X-address generator is initialized to zero.

49. The memory of claim 47, wherein the read counter in said first X-address generator is initialized according to an external X-address signal.

50. The memory of claim 39, wherein each of said X-address generators separately comprises a read-address counter that generates X-addresses for use when data are transferred out of the corresponding memory cell array.

51. The memory of claim 50, wherein the read X-address counter in each of said X-address generators is incremented each time data are transferred out of the corresponding memory cell array.

52. The memory of claim 50, wherein the read counter in each of said address generators is initialized to zero.

53. The memory of claim 50, wherein the read counter in each of said X-address generators is initialized according to an external X-address signal.

54. The memory of claim 50, wherein the write counter in each of said X-address generators except the first X-address generator is initialized to zero, and the read counter in each of said X-address generators except the last X-address generator is initialized to zero.

55. The memory of claim 50, wherein said plurality of initializing signals comprises:
   a first initializing signal for initializing the write counter of said first X-address generator;
   a last initializing signal for initializing the read counter of said last X-address generator; and
   for each X-address generator except the last X-address generator, a corresponding initializing signal for initializing both the read counter in said X-address generator and the write counter in the next X-address generator.

56. A method of storing data in an integrated circuit having a series of at least two memory cell arrays and a corresponding series of at least two output registers, and reading the stored data, comprising the steps of:

(a) writing serial data into an input register in said integrated circuit;

(b) transferring data in parallel from said input register to a first memory cell array in said series of memory cell arrays;

(c) transferring data in parallel between each pair of adjacent memory cell arrays in said series of memory cell arrays, starting from said first memory cell array;

(d) transferring data in parallel from each memory cell array in said series to a corresponding output register in said series of output registers; and (e) reading data serially from said output registers.

57. The method of claim 56, wherein said steps (c) and (d) are performed simultaneously, with transfer of identical data in both steps (c) and (d).

58. The method of claim 56, wherein said steps (a) and (e) are performed simultaneously.

59. The method of claim 56, comprising the further step of:

(f) generating, by means of counters in said integrated circuit, addresses in said memory cell arrays for use in transferring data in said steps (c) and (d).

* * * * *